(12) United States Patent
Ikriannikov

(10) Patent No.: US 8,638,187 B2
(45) Date of Patent: Jan. 28, 2014

(54) LOW PROFILE INDUCTORS FOR HIGH DENSITY CIRCUIT BOARDS

(75) Inventor: Alexandr Ikriannikov, Castro Valley, CA (US)

(73) Assignee: Volterra Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/297,216

(22) Filed: Nov. 15, 2011

(65) Prior Publication Data

US 2012/0056703 A1    Mar. 8, 2012

Related U.S. Application Data

(63) Continuation-in-part of application No. 12/940,933, filed on Nov. 5, 2010, now Pat. No. 8,299,882, which is a continuation-in-part of application No. 12/507,751, filed on Jul. 22, 2009, now Pat. No. 8,040,212.

(51) Int. Cl.
    *H01F 27/29* (2006.01)

(52) U.S. Cl.
    USPC .......................................................... 336/192

(58) Field of Classification Search
    USPC ............................. 336/65, 83, 192, 200, 232
    See application file for complete search history.

(56) References Cited

U.S. PATENT DOCUMENTS

| | | |
|---|---|---|
| 3,988,665 A | 10/1976 | Neumaier et al. |
| 4,455,545 A | 6/1984 | Shelly |
| 4,543,554 A | 9/1985 | Muellenheim et al. |
| 4,777,406 A | 10/1988 | Ross et al. |
| 4,800,479 A | 1/1989 | Bupp |
| 4,935,710 A | 6/1990 | Yamazaki et al. |
| 5,023,578 A | 6/1991 | Keneko et al. |
| 5,161,098 A | 11/1992 | Balakrishnan |

(Continued)

FOREIGN PATENT DOCUMENTS

| | | |
|---|---|---|
| EP | 1 632 964 | 3/2006 |
| EP | 1 833 165 | 9/2007 |

(Continued)

OTHER PUBLICATIONS

Wong, Pit-Leong, et al., "Investigating Coupling Inductors in the Interleaving QSW VRM" Applied Power Electronics Conference and Exposition, 2000. APEC 2000. Fifteenth Annual IEEE; Mar. 2000; pp. 973-978.

(Continued)

*Primary Examiner* — Tuyen Nguyen
(74) *Attorney, Agent, or Firm* — Lathrop & Gage LLP

(57) ABSTRACT

An inductor includes a core formed of a magnetic material and a foil winding wound at least partially around or through at least a portion of the core. A first end of the winding extends away from the core to form an extended output tongue configured and arranged to supplement or serve as a substitute for a printed circuit board foil trace. A second end of the winding forms a solder tab. At least a portion of the extended output tongue and the solder tab are formed at a same height relative to a bottom surface of the core. Another inductor includes a core formed of a magnetic material, a winding wound at least partially around or through at least a portion of the core, and a ground return conductor attached to the core. The core does not form a magnetic path loop around the ground return conductor.

31 Claims, 56 Drawing Sheets

(56) References Cited

U.S. PATENT DOCUMENTS

| | | | |
|---|---|---|---|
| 5,225,971 A | 7/1993 | Spreen | |
| 5,353,001 A | 10/1994 | Meinel et al. | |
| 5,436,818 A | 7/1995 | Barthold | |
| 5,469,334 A | 11/1995 | Balakrishnan | |
| 5,565,837 A | 10/1996 | Godek et al. | |
| 5,568,111 A | 10/1996 | Metsler | |
| 5,574,420 A | 11/1996 | Roy et al. | |
| 5,631,822 A | 5/1997 | Silberkleit et al. | |
| 5,737,203 A | 4/1998 | Barrett | |
| 5,939,966 A | 8/1999 | Shin' Ei | |
| 6,060,977 A | 5/2000 | Yamamoto et al. | |
| 6,114,932 A | 9/2000 | Wester et al. | |
| 6,147,584 A | 11/2000 | Shin'el | |
| 6,198,375 B1 | 3/2001 | Shafer | |
| 6,204,744 B1 | 3/2001 | Shafer et al. | |
| 6,342,778 B1 | 1/2002 | Catalano et al. | |
| 6,348,848 B1 | 2/2002 | Herbert | |
| 6,356,179 B1 | 3/2002 | Yamada | |
| 6,362,986 B1 | 3/2002 | Schultz et al. | |
| 6,377,155 B1 | 4/2002 | Allen et al. | |
| 6,420,953 B1 | 7/2002 | Dadafshar | |
| 6,449,829 B1 | 9/2002 | Shafer | |
| 6,460,244 B1 | 10/2002 | Shafer et al. | |
| 6,477,414 B1 | 11/2002 | Silvian | |
| 6,549,111 B1 | 4/2003 | De Graaf et al. | |
| 6,578,253 B1 | 6/2003 | Herbert | |
| 6,765,468 B2 | 7/2004 | Chen et al. | |
| 6,867,678 B2 | 3/2005 | Yang | |
| 6,903,648 B2 | 6/2005 | Baumann et al. | |
| 7,023,314 B2 | 4/2006 | Tolle et al. | |
| 7,034,645 B2 | 4/2006 | Shafer et al. | |
| 7,187,263 B2 | 3/2007 | Vinciarelli | |
| 7,199,695 B1 | 4/2007 | Zhou et al. | |
| 7,248,139 B1 | 7/2007 | Podlisk et al. | |
| 7,280,025 B2 | 10/2007 | Sano | |
| 7,310,039 B1 | 12/2007 | Zhang | |
| 7,352,269 B2 | 4/2008 | Li et al. | |
| 7,492,246 B2 | 2/2009 | Chang | |
| 7,498,920 B2 | 3/2009 | Sullivan et al. | |
| 7,525,406 B1 | 4/2009 | Cheng | |
| 7,649,434 B2 * | 1/2010 | Xu et al. | 336/229 |
| 7,994,888 B2 | 8/2011 | Ikriannikov | |
| 2001/0043135 A1 | 11/2001 | Yamada et al. | |
| 2002/0067234 A1 | 6/2002 | Kung | |
| 2002/0093413 A1 | 7/2002 | Shin 'ei | |
| 2004/0017276 A1 | 1/2004 | Chen et al. | |
| 2005/0128040 A1 | 6/2005 | Gray et al. | |
| 2006/0049907 A1 | 3/2006 | Liu | |
| 2006/0089022 A1 | 4/2006 | Sano | |
| 2006/0145800 A1 | 7/2006 | Dadafshar et al. | |
| 2006/0158297 A1 | 7/2006 | Sutardja | |
| 2007/0175701 A1 | 8/2007 | Xu et al. | |
| 2007/0176726 A1 | 8/2007 | Xu et al. | |
| 2007/0268104 A1 | 11/2007 | Chan et al. | |
| 2008/0012674 A1 | 1/2008 | Sano et al. | |
| 2008/0136576 A1 | 6/2008 | Emmons et al. | |
| 2008/0150666 A1 | 6/2008 | Chandrasekaran et al. | |
| 2008/0205098 A1 | 8/2008 | Xu et al. | |
| 2008/0211613 A1 | 9/2008 | Lin et al. | |
| 2008/0303624 A1 | 12/2008 | Yamada et al. | |
| 2009/0179723 A1 | 7/2009 | Ikriannikov et al. | |
| 2009/0231081 A1 | 9/2009 | Ikriannikov et al. | |
| 2009/0237197 A1 | 9/2009 | Ikriannikov et al. | |
| 2010/0007453 A1 | 1/2010 | Yan et al. | |
| 2010/0013587 A1 | 1/2010 | Yan et al. | |
| 2010/0271161 A1 | 10/2010 | Yan et al. | |
| 2012/0056704 A1 | 3/2012 | Nagano et al. | |

FOREIGN PATENT DOCUMENTS

| | | |
|---|---|---|
| JP | 08-250332 | 9/1996 |
| JP | 2000-164431 | 6/2000 |
| JP | 2002057049 | 2/2002 |
| WO | WO 2006/026674 | 3/2006 |

OTHER PUBLICATIONS

Wong, Pit-Leong, et al.; A Novel Modeling Concept for Multi-coupling Core Structures; Center for Power Electronics Systems; IEEE; pp. 107; 2001.

Wong, Pit-Leong, et al.; Performance Improvements of Interleaving VRMs With Coupling Inductors, IEEE Transactions on Power Electronics; vol. 16, No. 4; pp. 499-507; Jul. 2001.

Xu, J., et al; Analysis by Finite Element Method of a Coupled Inductor Circuit Used as Current Injection Interface; IEEE Workshop on Computers in Power Electronics; pp. 147-151; 1996.

Cooper Bussmann, "Product Data Sheet for Low Profile Inductor (Surface Mount)" retrieved from http://www.angliac.com, May 2003.

Pulse, SMT Power Inductors Power Beads—PA0766NL Series; pp. 53-55; Mar. 2006.

Vitec, Dual High Frequency High Power Inductor, AF4390A data sheet; date unknown.

Dong et al., Twisted Core Coupled Inductors for Microprocessor Voltage Regulators, Power Electronics Specialists Conference, pp. 2386-2392, Jun. 17-21, 2007.

Dong et al., The Short Winding Path Coupled Inductor Voltage Regulators, Applied Power Electronics Conference and Exposition, pp. 1446-1452, Feb. 24-28, 2008.

Dong et al., Evaluation of Coupled Inductor Voltage Regulators, Applied Power Electronics Conference and Exposition, pp. 831-837, Feb. 24-28, 2008.

Pulse, SMT Power Inductors datasheet, 2 pages, Nov. 2007.

U.S. Appl. No. 12/643,957, Issue Fee payment submitted Jun. 28, 2011, 2 pages.

U.S. Appl. No. 12/507,751, Notice of Allowance dated Jul. 6, 2011, 13 pages.

U.S. Appl. No. 12/507,751, Issue Fee payment submitted Sep. 12, 2011, 2 pages.

PCT/US10/42938 International Search Report & Written Opinion mailed Dec. 2, 2010, 18 pages.

U.S. Appl. No. 12/643,957, Notice of Allowance mailed Jun. 13, 2011, 8 pages.

U.S. Appl. No. 12/643,957, Response to Office Action filed May 23, 2011, 19 pages.

U.S. Appl. No. 12/643,957, Office Action mailed Feb. 23, 2011, 7 pages.

U.S. Appl. No. 12/507,751, Response to Office Action filed May 23, 2011, 23 pages.

U.S. Appl. No. 12/507,751, Office Action mailed Feb. 23, 2011, 11 pages.

PCT/US10/60869, International Search Report and Written Opinion mailed May 13, 2011, 14 pages.

Notice of Allowance issued in U.S. Appl. No. 13/175,726, dated Sep. 21, 2012, 12 pages.

Office Action issued in U.S. Appl. No. 13/175,726, dated May 30, 2012, 14 pages.

Response to Office Action filed in U.S. Appl. No. 13/175,726, dated Aug. 30, 2012, 15 pages.

Notice of Allowance issued in related U.S. Appl. No. 12/940,933, dated Jun. 27, 2012, 18 pages.

PCT/US11/59193, International Search Report and Written Opinion of Mar. 27, 2012, 9 pages.

U.S. Appl. No. 12/940,933, Issue Fee payment, filed Sep. 27, 2012, 2 pages.

U.S. Appl. No. 13/344,934, Non-Final Rejection issued May 9, 2013, 8 pages.

U.S. Appl. No. 13/344,934, Response to Non-Final Rejection filed Sep. 5, 2013, 8 pages.

* cited by examiner

LOW PROFILE INDUCTORS FOR HIGH DENSITY CIRCUIT BOARDS

CROSS-REFERENCE TO RELATED APPLICATIONS

This application is a continuation-in-part of U.S. patent application Ser. No. 12/940,933 filed Nov. 5, 2010 now U.S. Pat. No. 8,299,882, which is a continuation-in-part of U.S. patent application Ser. No. 12/507,751 filed Jul. 22, 2009, now U.S. Pat. No. 8,040,212. Both of the above-mentioned applications are incorporated herein by reference.

FIELD

The present document relates to the field of low profile inductor design for high-density printed circuit boards. In particular, the document relates to a low profile inductor suitable for use beneath processor heat sinks and in other areas where conventional inductors may interfere with other components.

BACKGROUND

Many high density printed circuit board assemblies (PCBs) are installed in tight housings, or have bulky components attached to them, such that component height in portions of the PCB must be limited. For example, in the area near a processor of a personal computer motherboard, component height must be limited to avoid mechanical interference with processor heat sinks. Similarly, high profile components on PCMCIA or Cardbus devices are undesirable because they may require the device to occupy two slots in a laptop computer's connector instead of a single slot; occupancy of multiple slots may limit further system expandability and may prevent use with machines having only a single slot available.

Voltage regulated down-converters for providing power to microprocessor integrated circuits of laptop and desktop personal computers are known. Such converters typically include one or more inductors.

Inductors for switching power converters, such as voltage regulators, have been proposed. For example, commonly owned U.S. Pat. No. 7,352,269 to Li et al. ("Li"), which is incorporated herein by reference, discloses, in part, various coupled inductors. FIG. 71 shows one prior art coupled inductor 7100, which is similar to that of Li's FIG. 4, and includes windings 7102, 7104 wound through a passageway 7106 in a magnetic core 7108. Leakage inductance associated with windings 7102, 7104 is roughly proportional to a separation distance 7110 between windings 7102, 7104.

SUMMARY

In an embodiment, an inductor for assembly on a printed circuit board includes a core formed of a magnetic material and a first foil winding wound at least partially around or through at least a portion of the core. A first end of the first winding extends away from the core to form a first extended output tongue, and a second end of the first winding forms a solder tab. The solder tab and at least a portion of the first extended output tongue are formed at a same height relative to a bottom surface of the core for surface mount attachment to the printed circuit board. The first extended output tongue is configured and arranged to supplement or serve as a substitute for a first foil trace disposed on a surface of the printed circuit board.

In an embodiment, an inductor for assembly on a printed circuit board includes a core formed of a magnetic material, a first winding wound at least partially around or through at least a portion of the core, and a first ground return conductor attached to the core. The first winding and the first ground return conductor are configured and arranged such that inductance of the first ground return conductor is not significantly increased by presence of the core, while inductance of the first winding is significantly increased by presence of the core, relative to an otherwise identical inductor without the core.

In an embodiment, an inductor for assembly on a printed circuit board includes an elongated ground return conductor forming at least one solder tab at each end of the conductor. The inductor further includes at least two spacer elements disposed on the ground return conductor and an elongated foil winding forming at least one solder tab at each end of the winding. The winding is disposed on the spacer elements such that the spacer elements separate the ground return conductor from the winding to create a channel between the ground return conductor and the winding.

In an embodiment, a printed circuit board assembly has a drop-in inductor attached to a printed circuit board. The drop-in inductor includes a first foil winding wound through an opening in a magnetic core and a first ground return conductor attached to the core. The first foil winding and the first ground return conductor are configured and arranged such that inductance of the first ground return conductor is not significantly increased by presence of the core, while inductance of the first foil winding is significantly increased by presence of the core, relative to an otherwise identical inductor without the core. The first foil winding and the first ground return conductor have ends formed as solder tabs for attachment to the printed circuit board, and the tabs of the first foil winding and the first ground return conductor are formed at a same height relative to a bottom surface of the core. The tabs of the first foil winding and the tabs of the first ground return conductor are attached to foil of the same layer of the printed circuit board. The printed circuit board forms an aperture, and the core of the inductor extends into the aperture.

In an embodiment, a printed circuit board assembly includes a printed circuit board, at least one switching device attached to the printed circuit board, and an inductor attached to the printed circuit board. The inductor includes a core formed of a magnetic material and a foil winding wound at least partially around or through at least a portion of the core. A first end of the winding extends away from the core to form an extended input tongue. At least a portion of the extended input tongue is soldered to and supplements a first foil trace disposed on an outer surface of the printed circuit board, where the first foil trace electrically couples the at least one switching device to the first end of the winding.

In an embodiment, a printed circuit board assembly includes a printed circuit board, at least one switching device attached to the printed circuit board, and an inductor attached to the printed circuit board. The inductor includes a core formed of a magnetic material and a foil winding wound at least partially around or through at least a portion of the core. A first end of the winding is electrically coupled to the at least one switching device, and a second end of the winding extends away from the core to form an extended output tongue. At least a portion of the extended output tongue is soldered to and supplements a first foil trace disposed on an outer surface of the printed circuit board.

In an embodiment, an inductor for assembly on a printed circuit board includes a core formed of a magnetic material and a winding. The core has a first side and a second side opposite to the first side. A linear separation distance between the first and second sides of the core defines a length of the core. The winding includes (a) a core winding portion wound through the core, (b) a foil input tongue at the first side of the core and extending away from the core in the lengthwise direction, and (c) a foil output tongue at the second side of the core and extending away from the core in the lengthwise direction. At least a portion of the foil input tongue and the foil output tongue are formed at a same height relative to a bottom surface of the core for surface mount attachment to the printed circuit board, where the height is generally perpendicular to the lengthwise direction.

In an embodiment, a coupled inductor includes a core, first and second windings, a leakage plate, and a first ground return conductor. The core is formed of magnetic material and has opposing top and bottom surfaces. The first winding is wound through the core and includes portions alternately disposed on the bottom and top surfaces of the core, and the second winding is wound through the core and includes portions alternately disposed on the bottom and top surfaces of the core in a manner opposite to that of the first winding. The leakage plate is formed of magnetic material and has opposing top and bottom surfaces. The leakage plate is disposed on the core such that the bottom surface of the leakage plate faces the top surface of the core. The first ground return conductor is disposed on either the bottom surface of the core or the top surface of the leakage plate.

In an embodiment, a coupled inductor includes a magnetic core, first and second windings, and a ground return conductor. The magnetic core includes first and second magnetic elements, each having opposing top and bottom surfaces. The second magnetic element is disposed on the first magnetic element such that the bottom surface of the second magnetic element faces the top surface of the first magnetic element. The first and second windings are each disposed on the top surface of the first magnetic element. The ground return conductor is disposed on either the bottom surface of the first magnetic element or the top surface of the second magnetic element.

In an embodiment, a coupled inductor includes a core, a leakage plate, N windings, and a first ground return conductor. N is an integer greater than one. Each of the core and the leakage plate is formed of magnetic material and includes respective opposing top and bottom surfaces. The leakage plate is disposed on the core such that the bottom surface of the leakage plate faces the top surface of the core. Each of the N windings is wound through the core and has opposing first and second ends respectively forming first and second solder tabs. Each first and second solder tab is disposed in a common plane between the bottom surface of the core and the top surface of the leakage plate. The first ground return conductor is disposed on either the bottom surface of the core or the top surface of the leakage plate, and the first ground return conductor forms at least two ground return solder tabs disposed in the common plane.

In an embodiment, a printed circuit assembly includes a printed circuit board and a coupled inductor disposed in an aperture in the printed circuit board. The coupled inductor includes a core, a leakage plate, N windings, and a first ground return conductor. N is an integer greater than one. Each of the core and the leakage plate is formed of magnetic material and includes respective opposing top and bottom surfaces. The leakage plate is disposed on the core such that the bottom surface of the leakage plate faces the top surface of the core. Each of the N windings is wound through the core and has opposing first and second ends respectively forming first and second solder tabs. Each of the first and second solder tabs is disposed in a common plane between the bottom surface of the magnetic core and the top surface of the leakage plate, and each of the first and second solder tabs is soldered to a respective pad of the printed circuit board. The first ground return conductor is disposed on either the bottom surface of the core or the top surface of the leakage plate. The first ground return conductor forms at least two ground return solder tabs disposed in the common plane and soldered to respective pads of the printed circuit board.

In an embodiment, a printed circuit assembly includes a printed circuit board and a coupled inductor disposed in an aperture in the printed circuit board. The coupled inductor includes first and second magnetic elements, first and second windings, and a first ground return conductor. Each of the first and second magnetic elements has respective opposing top and bottom surfaces. The second magnetic element is disposed on the first magnetic element such that the bottom surface of the second magnetic element faces the top surface of the first magnetic element. The first and second winding are disposed on the top surface of the first magnetic element. Opposing first and second ends of the first winding form respective first and second solder tabs soldered to the printed circuit board and disposed in a common plane between the bottom surface of the first magnetic element and the top surface of the second magnetic element. Opposing first and second ends of the second winding form respective first and second solder tabs disposed in the common plane and soldered to the printed circuit board. The first ground return conductor is disposed on either the bottom surface of the first magnetic element or the top surface of the second magnetic element. The first ground return conductor forms at least two ground return solder tabs disposed in the common plane and soldered to the printed circuit board.

DETAILED DESCRIPTION OF THE EMBODIMENTS

Figure 1:
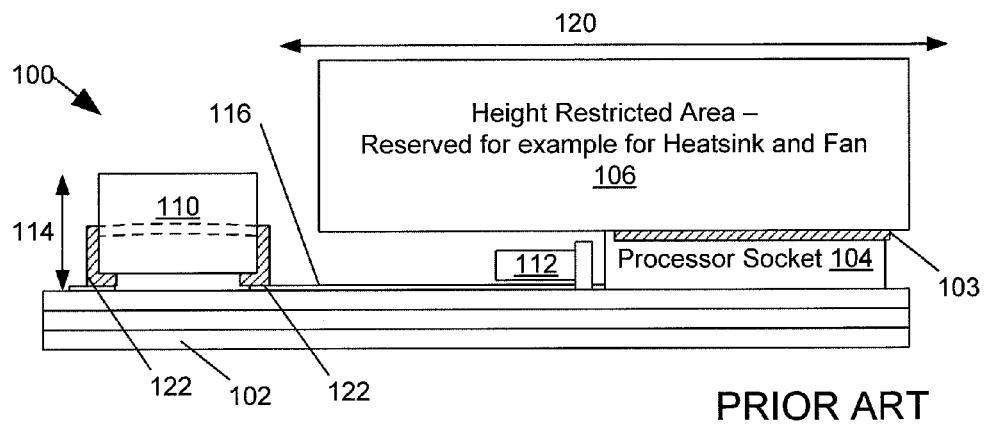
FIG. 1 illustrates a PRIOR ART cross section of a motherboard.

It is noted that, for purposes of illustrative clarity, certain elements in the drawings may not be drawn to scale. Specific instances of an item may be referred to by use of a numeral in parentheses (e.g., winding 1802(1)) while numerals without parentheses refer to any such item (e.g., windings 1802).

In a high density printed circuit board assembly, such as a processor motherboard 100 assembly (FIG. 1) as used in a personal computer, there may be portions of the assembly where circuit height is restricted, yet devices in or near these areas may require considerable power. For example, motherboard 100 assembly may have a multilayer printed circuit board 102 with an attached processor 103 in a processor socket 104. Since processor 103 may dissipate considerable power—in some cases exceeding a hundred watts at peak computer performance—a heat sink and fan assembly 106 is attached to processor 103 to cool processor 103. Heat sink and fan assembly 106 is often a large, bulky, device requiring a considerable keep-out zone 120 beneath it where only low-profile components are allowed on motherboard 100 to prevent components on motherboard 100 from mechanically interfering with heat sink and fan assembly 106.

In some systems, heat sink and fan assembly 106 may actually occupy only some of the space shown; however a system manufacturer may have reserved a larger volume to allow air to flow into the heat sink, and to allow for future use of a different heat sink or fan with future, faster, and even more power-hungry, processors. In other systems and sub-systems, such as PCMCIA or CARDBUS cards, height restrictions may derive from other factors such as overall card or system dimensions. Further, component height is strictly limited in laptop systems because of desires to limit machine thickness.

Processor 103 draws considerable current since much of the power it consumes is at a low "core" voltage, typically between one and two volts, although voltage at the processor's "periphery" may be higher. The "core" voltage is typically provided by an on-board DC-to-DC down-converter. The DC-to-DC converter has one or more inductors, such as inductor 110, as well as several capacitors 112. Inductor 110 often has height 114 that would interfere with heat sink and fan assembly 106 if inductor 110 were located under heat sink and fan assembly 106. Inductor 106 is therefore located some distance away from processor socket 104. Similar situations may also arise with high performance graphics chips as these also consume considerable power and often require heat sinks.

Figure 2:
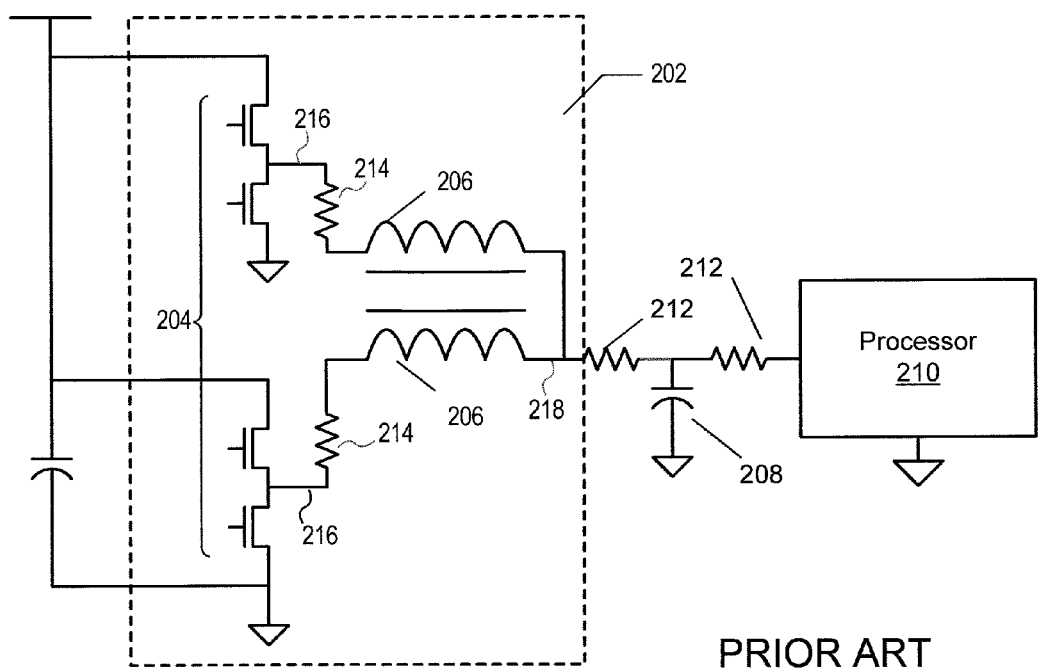
FIG. 2 is a schematic of a PRIOR ART motherboard.

A schematic diagram (FIG. 2) illustrates the resulting problem of parasitic impedance. Down-converter 202 is, in this example, a multiphase buck converter having switching devices 204 that rapidly alternate a connection to each of several phase inductors 206 between a powered, a grounded, and an unpowered state. Switching devices 204 connect to respective phase inductors 206 via respective switching nodes (Vx) 216. Current builds in each phase inductor 206 when it is powered, and decays when it is grounded. Output voltage and current are a function of the percentage of time that each phase inductor 206 is powered. Phase inductors 206 may be magnetically coupled, as shown in FIG. 2.

Output terminals of the phase inductors 206 are coupled together and to capacitors 208 and processor 210 via an output node (Vo) 218. If the connection from phase inductors 206 to capacitor 208 and processor 210 is made only via a typical thin foil PCB trace (e.g., trace 116 FIG. 1), significant unintended, parasitic, impedances 212 may exist between processor 210, capacitor 208, and converter inductors 206. Impedances 212 may have an inductive and a resistive component.

The low processor voltage, typically between one and two volts, and high processor current, often reaching peak currents of fifty to one hundred amperes, make the system quite sensitive to what may seem quite low parasitic impedances 212. For example, a current of one hundred amperes in a two-milliohm parasitic impedance is sufficient to provide a two hundred-millivolt drop; at a one volt core voltage, this may represent twenty percent of operating voltage. Such voltage drop due to the hundred amperes also relates to twenty watts of conduction loss and is environmentally undesirable, as this conduction loss represents power not used in the circuit, but is power used to produce heat wasted in the board layout.

It is desirable to minimize impedances 212, since these may not only waste power, but may allow processor 210 voltage to deviate outside desirable operating limits. The same arguments apply to parasitic impedances 214 between inductors 206 and power semiconductors 204, it is desirable to minimize these impedances also.

To minimize parasitic resistances in inductors 206, these inductors are often wound with one or just a few turns of thick foil (i.e., a conductive material such as copper having at least a substantially rectangular cross-section) or wire around or inside a powdered iron, ferrite, or similar ferromagnetic core suitable for use at the high frequencies—in the range 20 kHz to above 1 MHz—at which switching devices 204 typically operate. Multiple inductors 206 are often used, their outputs being connected in parallel and operated as a multiphase converter, to handle the requisite current. The foil with which inductors 206 are wound is typically significantly thicker than foil used for traces 116 on the PCB. In the embodiment of FIG. 1, the foil of the inductor extends, typically downwards and often wrapping under the core, to form a solder tab 122 that connects to foil of PCB traces 116.

Figure 3:
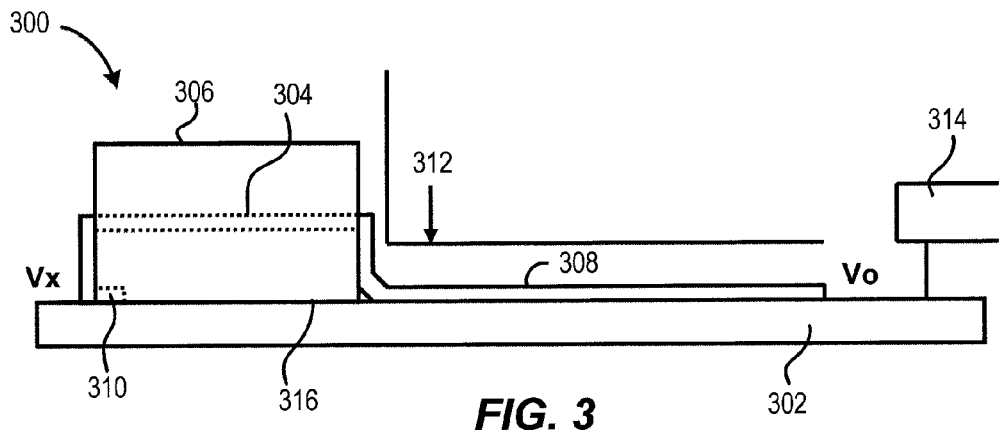
FIG. 3 shows a side plan view of one inductor installed on a PCB, according to an embodiment.
Figure 4:
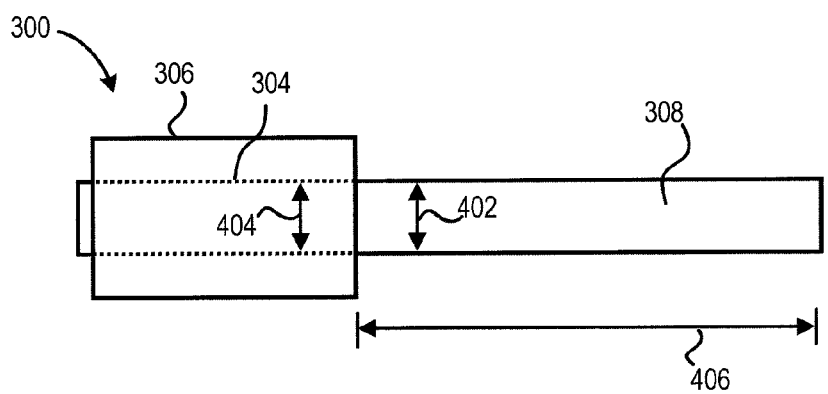
FIG. 4 shows a top plan view of the inductor of FIG. 3.

FIG. 3 shows a side plan view of one inductor 300 installed on a PCB 302, and FIG. 4 shows a top plan view of inductor 300. Inductor 300, for example, is used to at least partially solve one or more of the problems discussed above, and inductor 300 may be used in DC-to-DC converter applications (e.g., as a buck converter output inductor). Inductor 300 includes at least one electrically conductive winding 304 wound at least partially around or through at least a portion of a magnetic core 306. For example, winding 304 may be wound through an opening in core 306, such as shown in FIGS. 3 and 4, where dashed lines indicate the outline of winding 304 where obscured core 306. Core 306 is, for example, formed of a ferrite and/or powdered iron material, and may consist of one or multiple magnetic elements. In an embodiment, winding 304, for example, is a single turn "staple" foil winding, thereby helping to minimize winding length and resistance.

Inductor 300 further includes an extended output tongue 308 extending away from core 306. Extended output tongue 308 has a thickness similar to that of winding 304, and extended output tongue 308 is electrically coupled to one end of winding 304. Extended output tongue 308 is, for example, an extension of winding 304—such configuration may help simplify construction of inductor 300 and/or reduce combined resistance of winding 304 and extended output tongue 308. At least a portion of extended output tongue 308 is configured for attaching (e.g., soldering) to a foil PCB trace or solder pad. Although extended output tongue 308 is shown as having a width 402 which is the same as a width 404 of the portion of winding 304 that passes through or at least partially around core 306, widths 402 and 404 may differ. For example, width 402 may be greater than width 404 to help minimize impedance of extended output tongue 308. In motherboard applications, extended output tongue 308 is typically electrically coupled to an output node (e.g., a buck converter output node). However, inductor 300 is not limited to such uses. For example, extended output tongue 308 could couple to a power supply intermediate node.

Inductor 300 further includes a solder tab 310 electrically coupled to the other end of winding 304, for soldering to a foil PCB solder pad. In motherboard applications, solder tab 310 is typically coupled to an input node (e.g., a switching node in a buck converter). In alternative embodiments, solder tab 310 could alternately be replaced by a different type of connector, such as a through-hole pin.

At least a portion of extended output tongue 308 and solder tab 310 are, for example, formed at the same height relative to a bottom surface 316 of core 306 to facilitate surface mount connection of inductor 300 to a PCB. Some of such embodiments are capable of being placed on a PCB using pick-and-place equipment and soldered to traces or solder pads of the PCB using reflow soldering techniques (e.g., infrared reflow, hot gas convection, vapor phase reflow) or wave soldering techniques.

Figure 5:
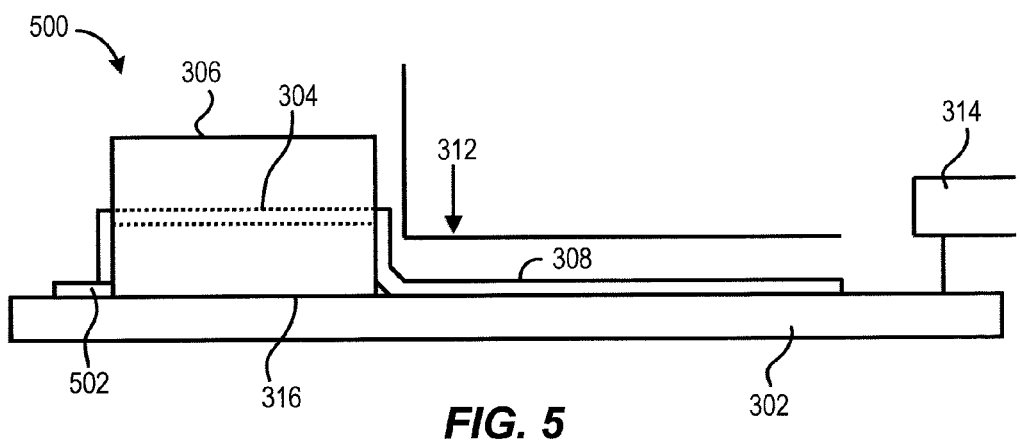
FIG. 5 shows a side plan view of another embodiment of the inductor of FIG. 3 installed on a PCB.

In some embodiments, solder tab 310 is replaced with an extended input tongue. For example, FIG. 5 shows a side plan view of one inductor 500 installed on PCB 302. Inductor 500 is an embodiment of inductor 300 where solder tab 310 has been replaced with an extended input tongue 502. At least respective portions of extended output tongue 308 and extended input tongue 502 are, for example, formed at the same height relative to bottom surface 316 of core 306 to facilitate surface mount connection of inductor 500 to a PCB. Extended input tongue 502 is, for example, an extension of winding 304. Extended input tongue 502 typically has mechanical characteristics (e.g., width, thickness) similar to that of extended output tongue 308. However, extended input tongue 502 is shorter in most embodiments of inductor 500 than extended output tongue 308 because switching devices are typically located near core 306 of inductor 500.

Extended output tongue 308 may be used to provide a low impedance electrical connection to inductor 300. For example, extended output tongue 308 may be configured and arranged for supplementing a foil PCB trace connected to inductor 300. In some embodiments, at least a portion of extended output tongue 308 is formed for soldering to and extending along a foil trace on a PCB outer surface, thereby serving as a conductor in parallel with the trace. Extended output tongue 308 typically has a thickness that is much greater than that of the PCB trace—accordingly, extended output tongue 308 typically has a much lower electrical and thermal impedance than the PCB trace. Extending extended output tongue 308 along a PCB trace to supplement the trace may significantly lower the trace's effective impedance, thereby reducing voltage drop and power loss in the trace, as well as improving the trace's heat sink ability. As another example, extended output tongue 308 may be used in place of a PCB trace to provide a low impedance electrical connection to one end of winding 304, and thereby free up a PCB layer for other uses, such as to route signal traces. Similarly, extended input tongue 502 (FIG. 5) may also supplement or be used in place of a PCB trace to provide a low impedance electrical connection to winding 304.

Extended output tongue 308 may also serve as a heat sink, thereby helping to cool inductor 300 and a PCB that tongue 308 is attached to. Extended output tongue 308 also typically has a low profile, which may advantageously allow use of rework equipment, pick and place equipment, and/or test probes in the vicinity of tongue 308. Furthermore, because extended output tongue 308 is part of inductor 300, extended output tongue 308 may withstand pressure from hot air rework equipment without being blown off a PCB.

In typical embodiments, winding 304 and extended output tongue 308 are formed of copper foil, such as between three and five millimeters wide, and from two tenths to one half millimeter thick. It is desirable for width 402 of extended output tongue 308 to be at least 1 millimeter to promote low impedance of tongue 308. The foil winding material typically used for winding 304 and extended output tongue 308 is substantially thicker than typical PCB copper foils (e.g., trace 116, FIG. 1) because half-ounce copper foil, as is typically used in PCB layers requiring fine lines, is approximately eighteen thousandths of a millimeter thick. Even three ounce copper foil, which may be used on special-purpose power and ground-plane layers, is only about a tenth of a millimeter thick. Since direct-current sheet-resistivity of a copper conductor is inversely proportional to its thickness, the sheet-resistivity of extended output tongue 308 may be as little as one-fiftieth that of a bare PCB trace of equivalent length and width. Extended output tongue 308 typically has length 406 of at least one centimeter to bridge a distance between inductor 300 and another component or portion of a PCB. However, extended output tongue 308 could be significantly shorter (e.g., two millimeters) if it only needs to run a short distance. Inductors including shorter extended tongues are typically easier to manufacture and assemble than inductors including longer extended tongues.

FIG. 3 shows one possible use of inductor 300 in an application having a height restriction 312 (e.g., due to a heat sink assembly). In the example of FIG. 3, inductor 300 is connected between a DC-to-DC converter (e.g., buck converter) switching node Vx (e.g., node 216, FIG. 2), and a converter output node Vo (e.g., node 218, FIG. 2). A load 314 (e.g., a processor) is powered from output node Vo. Extended output tongue 308 provides a low impedance path between inductor 300 and load 314, despite height restriction 312 dictating that inductor 300 be placed remote from load 314. If inductor 308 did not include extended output tongue 308, current from inductor 300 to load 314 would typically have to flow through a much higher impedance trace of PCB 302. Inductor 300, however, is not limited to use in buck converter or even in DC-to-DC converter applications. For example, some embodiments of inductor 300 could be used in inverter applications.

Figure 6:
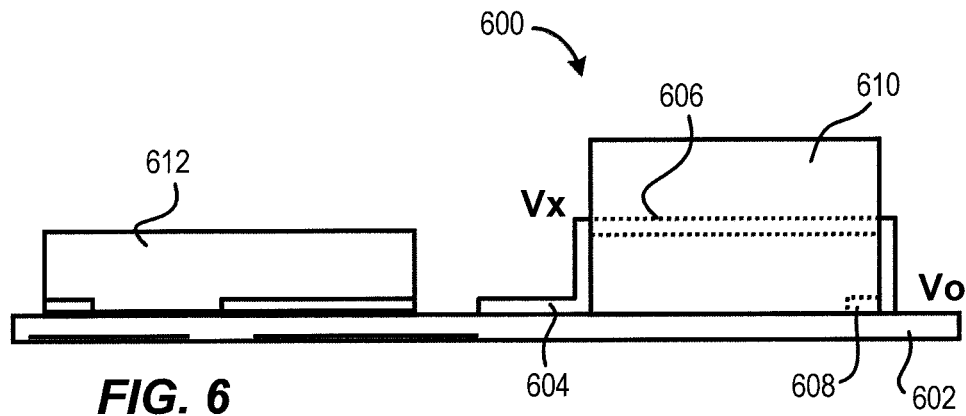
FIG. 6 shows a side plan view of yet another embodiment of the inductor of FIG. 3 installed on a PCB.
Figure 7:
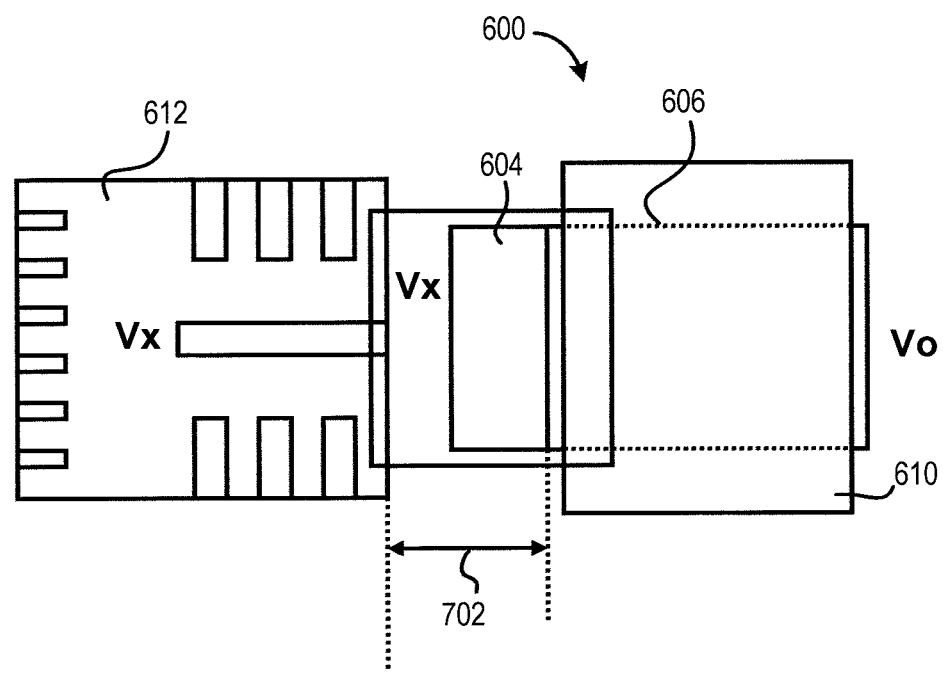
FIG. 7 shows a top plan view of the inductor of FIG. 6.

FIGS. 6 and 7 show one possible application of an embodiment of inductor 300. In particular, FIG. 6 shows a side plan view and FIG. 7 shows a top plan view of one inductor 600, which is an embodiment of inductor 300, installed on a PCB 602. In the examples of FIGS. 6 and 7, inductor 600 serves as a buck converter output inductor. Extended input tongue 604 connects one end of a winding 606 to a DC-to-DC converter switching node Vx, while a solder tab 608 connects the other end of winding 606 to a DC-to-DC converter output node Vo.

Winding 606 is wound at least partially around or through at least a portion of a magnetic core 610. Dashed lines indicate the outline of winding 606 where obscured by core 610. Extended input tongue 604 spans a significant portion of a distance 702 between inductor 600 and a switching device 612, thereby significantly lowering the impedance between switching device 612 and inductor 600. Such lowering of impedance may significantly decrease power loss, as switching node Vx typically conducts a large current magnitude.

As the extended tongues discussed above (e.g., extended output tongue 308 of FIG. 3, extended input tongue 502 of FIG. 5) may significantly improve electrical and thermal conductivity from switching devices (e.g., power semiconductors) towards the load in DC-to-DC converter applications, the concept of paralleling a thick foil with thin PCB traces can also be applied to ground return currents (i.e., currents from the load back to the DC-to-DC converter). An issue with applying naked foils to PCB traces is that such foils can be difficult to handle.

One or more ground return conductors can be attached to an inductor to improve ground return conductivity in the inductor's vicinity. The ground return conductors, for example, are configured and arranged such that their inductance is not significantly increased by presence of the inductor's core, while inductance of the inductor's winding (or windings) is significantly increased by presence of the inductor's core, relative to an otherwise identical inductor without the core. As an example, the ground return conductors may be configured and arranged such that the inductor's core does not form a magnetic path loop around the ground return conductors. In such embodiments, the ground return conductors are external to core, and the ground return conductors may have an inductance similar to that of a PCB ground plane extending under a standard surface mount inductor (without ground return conductors), where the ground plane is in close proximity to the standard surface mount inductor's core.

In many applications, current flows from switching devices through the inductor and to a load. Return current typically flows from the load, through PCB conductive layers under the inductor, and back to the switching devices. Accordingly, use of an inductor including ground return conductors may reduce ground return path impedance while maintaining the PCB's general current flow path.

Additionally, attaching a ground return conductor to an inductor allows both the inductor and the ground return conductor to be placed in a single step, thereby eliminating multiple placement operations required for placement of a discrete inductor and a discrete conductor. Furthermore, applying a foil conductor to a PCB may be difficult due to the foil's flexibility, but attaching a foil ground return conductor to an inductor increases the conductor's rigidity and may thereby facilitate the conductor's placement on a PCB.

Figure 8:
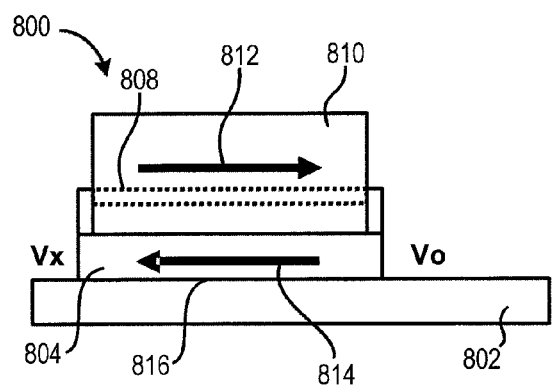
FIG. 8 shows a side plan view of one inductor including ground return conductors installed on a PCB, according to an embodiment.
Figure 10:
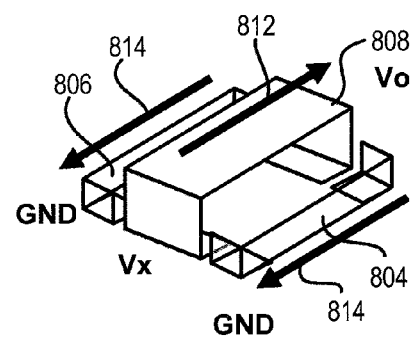
FIG. 10 shows a top perspective view of the inductor of FIGS. 8 and 9 with a magnetic core removed.
Figure 9:
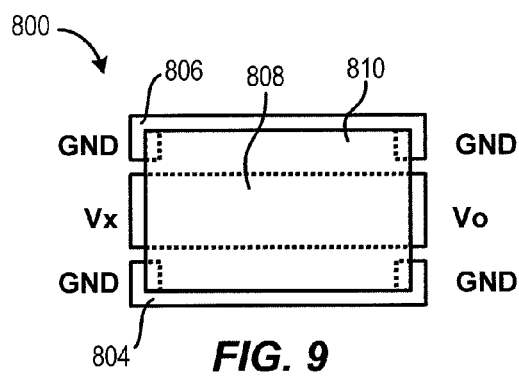
FIG. 9 shows a top plan view of the inductor of FIG. 8.
Figure 11:
FIG. 11 shows a top plan view of one PCB footprint for use with the inductor of FIGS. 8-10, according to an embodiment.

For example, FIG. 8 shows a side plan view of one inductor 800 installed on a PCB 802, and FIG. 9 shows a top plan view of inductor 800. Inductor 800 includes ground return conductors 804, 806, in addition to a winding 808 wound at least partially around or through at least a portion of a magnetic core 810. Dashed lines indicate the outline of winding 808 and ground return conductors 804, 806 where obscured by core 810 in FIGS. 8 and 9. Core 810 does not form a magnetic path loop around ground return conductors 804, 806. Accordingly, inductance of ground return conductors 804, 806 is not significantly increased by the presence of core 810, and ground return conductors 804, 806 have a lower inductance than winding 808. FIG. 10 shows a top perspective view of inductor 800 with core 810 removed, and FIG. 11 shows a top plan view of one possible PCB footprint for use with inductor 800.

In some embodiments, each end of ground return conductors 804, 806 and each end of winding 808 form respective solder tabs at a same height relative to a bottom surface 816 of core 810 to facilitate surface mount connection of inductor 800 to a PCB. Ground return conductors 804, 806, for example, have a thickness similar to that of winding 808 and are significantly thicker than foil typically forming a PCB ground return plane. Accordingly, ground return conductors 804, 806 may be used to supplement (or replace) a ground return conductor in a PCB (e.g., a PCB 802), and thereby significantly reduce the ground return impedance in the vicinity of inductor 800. Since ground-return conductors 804, 806 are attached to core 810, and thus to inductor 800, they are easier to handle than discrete conductors and may be positioned by pick-and-place equipment simultaneously with positioning inductor 800.

Accordingly, inductor 800 may be used to provide a low impedance, two-way path for current between DC-to-DC converter (e.g., buck converter) switching devices and a load, as shown in the examples of FIG. 8-11. In particular winding 808 may carry current from a switching node Vx to an output node Vo, as shown by arrows 812. Ground return conductors 804, 806 may in turn carry at least part of the ground return current from the load back to the switching devices, as shown by arrows 814.

The configuration and quantity of ground return conductors 804, 806 may be varied, and examples of some variations are discussed below. Additionally, although inductor 800 is discussed in the context of winding 808 carrying current to a load and ground return conductors 804, 806 carrying ground return current, inductor 800 could be used in other manners. For example, one or more of ground return conductors 804, 806 could be utilized to carry current, such as current from a memory-keep alive power supply (not shown) to the load, instead of ground return current. Furthermore, inductor 800 is not limited to use in DC-to-DC converter applications. For example, some embodiments of inductor 800 could be used in inverter applications.

Figure 12:
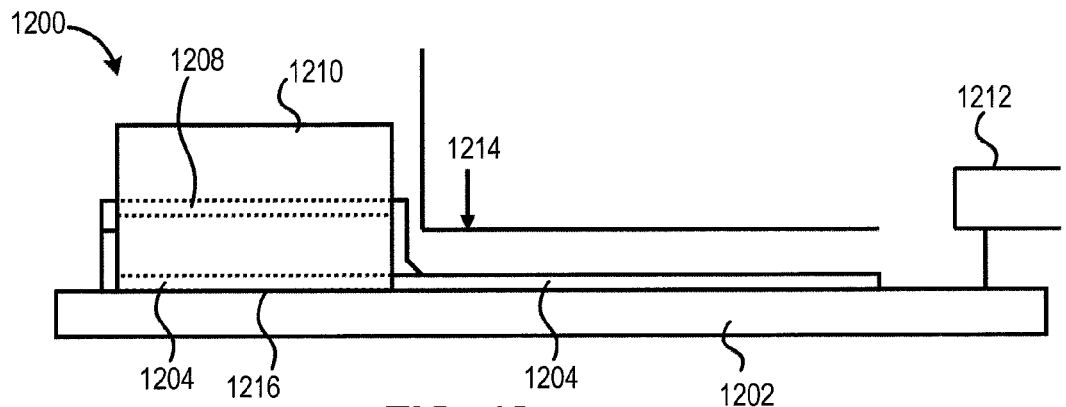
FIG. 12 is a side plan view of another embodiment of the inductor of FIG. 8 installed on a PCB.
Figure 13:
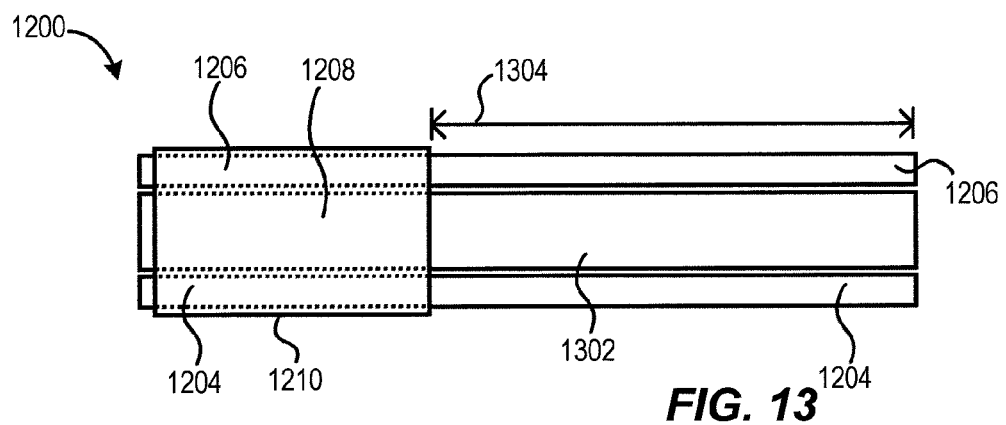
FIG. 13 is a top plan view of the inductor of FIG. 12.
Figure 14:
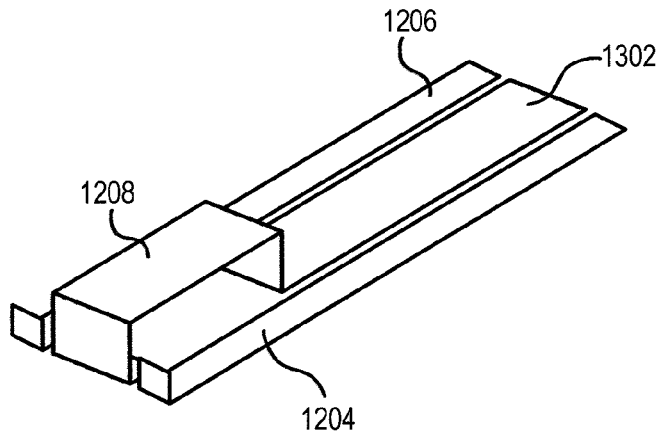
FIG. 14 is a top perspective view of the inductor of FIGS. 12 and 13 with a magnetic core removed.

A variation of inductor 800 is shown in FIGS. 12-14. FIG. 12 is a side plan view of one inductor 1200 installed on a PCB 1202, and FIG. 13 is a top plan view of inductor 1200. Inductor 1200 is similar to inductor 300 of FIG. 3; however, inductor 1200 includes ground return conductors 1204, 1206 in addition to a winding 1208 at least partially wound around or through at least a portion of a magnetic core 1210. Dashed lines indicate the outline of winding 1208 and ground return conductors 1204, 1206 where obscured by core 1210. Ground return conductors 1204, 1206 attach to a bottom surface 1216 of core 1210, and core 1210 does not form a magnetic path loop around ground return conductors 1204, 1206. Accordingly, inductance of ground return conductors 1204, 1206 is not significantly increased by presence of core 1210. An extended output tongue 1302 is electrically coupled to winding 1208, and ground return conductors 1204, 1206, for example, extend at least partially along a length 1304 of extended output tongue 1302. FIG. 14 shows a top perspective view of inductor 1200 with core 1210 removed. Portions of ground conductors 1204, 1206 are, for example, formed at the same height as extended output tongue 1302 with respect to bottom surface 1216 of core 1210 to facilitate surface mount connection of inductor 1200 to a PCB. FIG. 12 shows one possible application of inductor 1200 where extended output tongue 1302 and ground return conductors 1204, 1206 provide a two way, low impedance path between inductor 1200 and a load 1212 despite a height restriction 1214 dictating that inductor 1200 be placed remote from load 1212.

Figure 15:
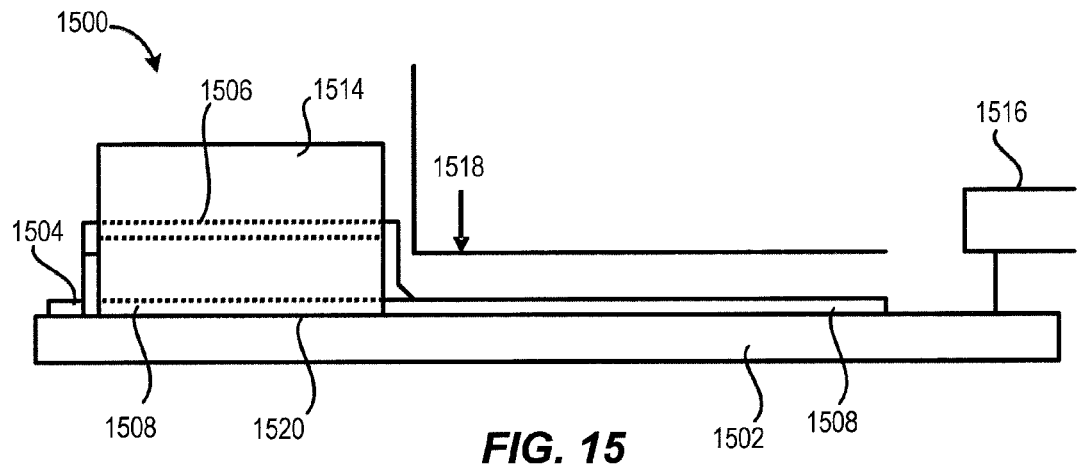
FIG. 15 shows a side plan view of yet another embodiment of the inductor of FIG. 8 installed on a PCB.
Figure 16:
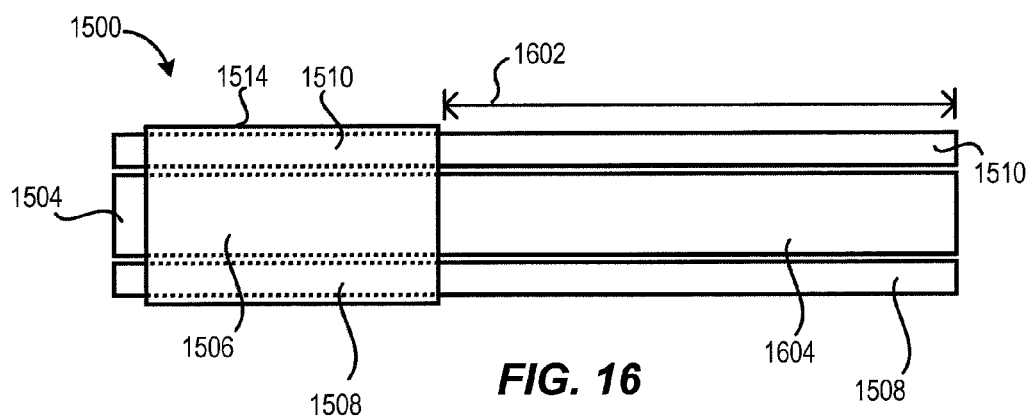
FIG. 16 shows a top plan view of the inductor of FIG. 15.
Figure 17:
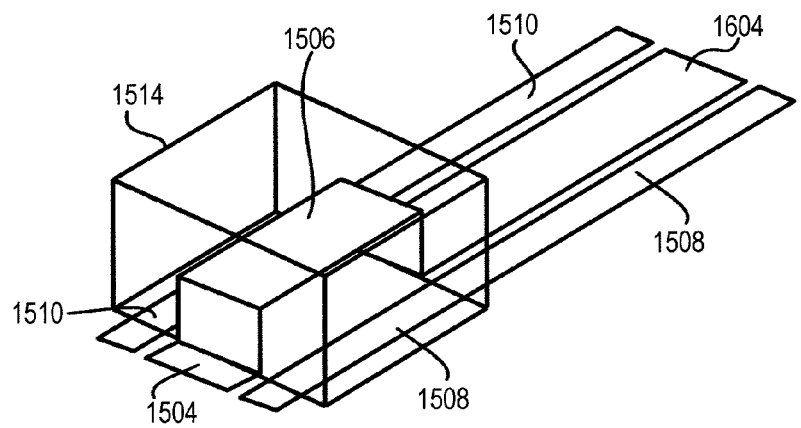
FIG. 17 shows a top perspective view of inductor of FIGS. 15 and 16.

FIGS. 15-17 show another variation of inductor 800. In particular, FIG. 15 shows a side plan view of one inductor 1500 installed on a PCB 1502. FIG. 16 shows a top plan view, and FIG. 17 shows a top perspective view of inductor 1500. Inductor 1500 is similar to inductor 1200 (FIGS. 12-14), but inductor 1500 includes an extended input tongue 1504 electrically coupled to a winding 1506. Ground return conductors 1508, 1510 extend at least partially along a length 1602 of an extended output tongue 1604. Winding 1506 is wound at least partially around or through at least a portion of a magnetic core 1514. Dashed lines indicate the outline of winding 1506 and ground return conductors 1508, 1510 where obscured by core 1514 in the plan views of FIGS. 15 and 16. Core 1514 is shown as being transparent in FIG. 17. Extended output tongue 1604, extended input tongue 1504, and the portions of ground return conductors 1508, 1510 extending along extended output tongue 1604 are, for example, formed at the same height relative to a bottom surface 1520 of core 1514 to facilitate surface mount connection of inductor 1500 to a PCB. Inductor 1500 is, for example, used to provide a two way, low impedance path between DC-to-DC converter switching devices and inductor 1500, as well as between inductor 1500 and a load 1516 separated from inductor 1500 by a height restriction 1518.

Figure 18:
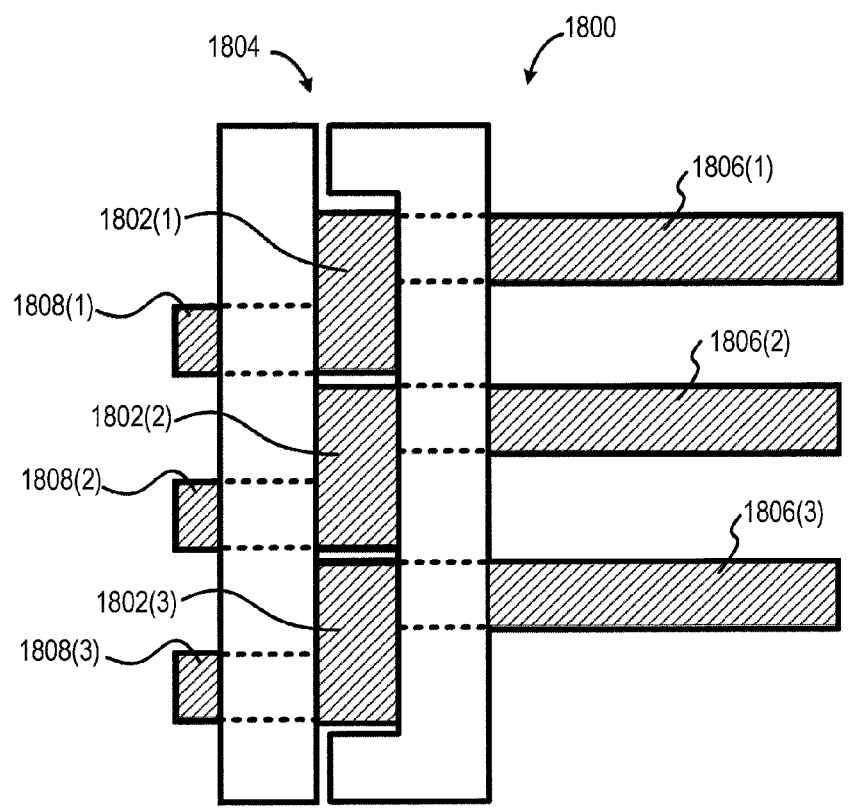
FIG. 18 shows a top plan view one coupled inductor including extended output tongues, according to an embodiment.
Figure 19:
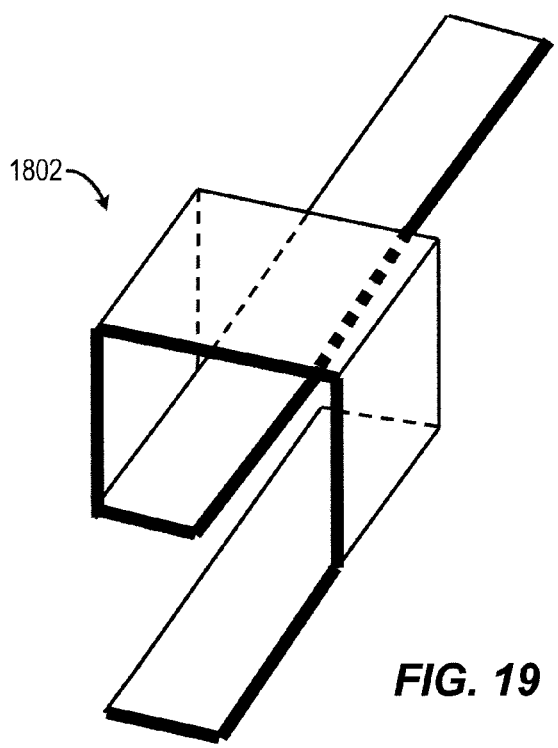
FIG. 19 shows a top perspective view of one winding of the inductor of FIG. 18.

Some embodiments of inductors with an extended tongue (e.g., inductor 300, FIG. 3) and inductors with ground return conductors (e.g., inductor 800, FIG. 8) are multiple winding inductors with N windings, where N is an integer greater than one. For example, FIG. 18 shows a top plan view of one coupled inductor 1800, which includes three windings 1802 which are magnetically coupled together by a magnetic core 1804. Dashed lines indicate the outline of windings 1802 where obscured by core 1804. A respective extended output tongue 1806 is electrically coupled to one end of each winding 1802, and a respective extended input tongue 1808 is electrically coupled to the other end of each winding 1802. Each extended output tongue 1806 and each extended input tongue 1808 is, for example, an extension of a respective winding 1802. FIG. 19 shows a top perspective view of one winding 1802.

Figure 20:
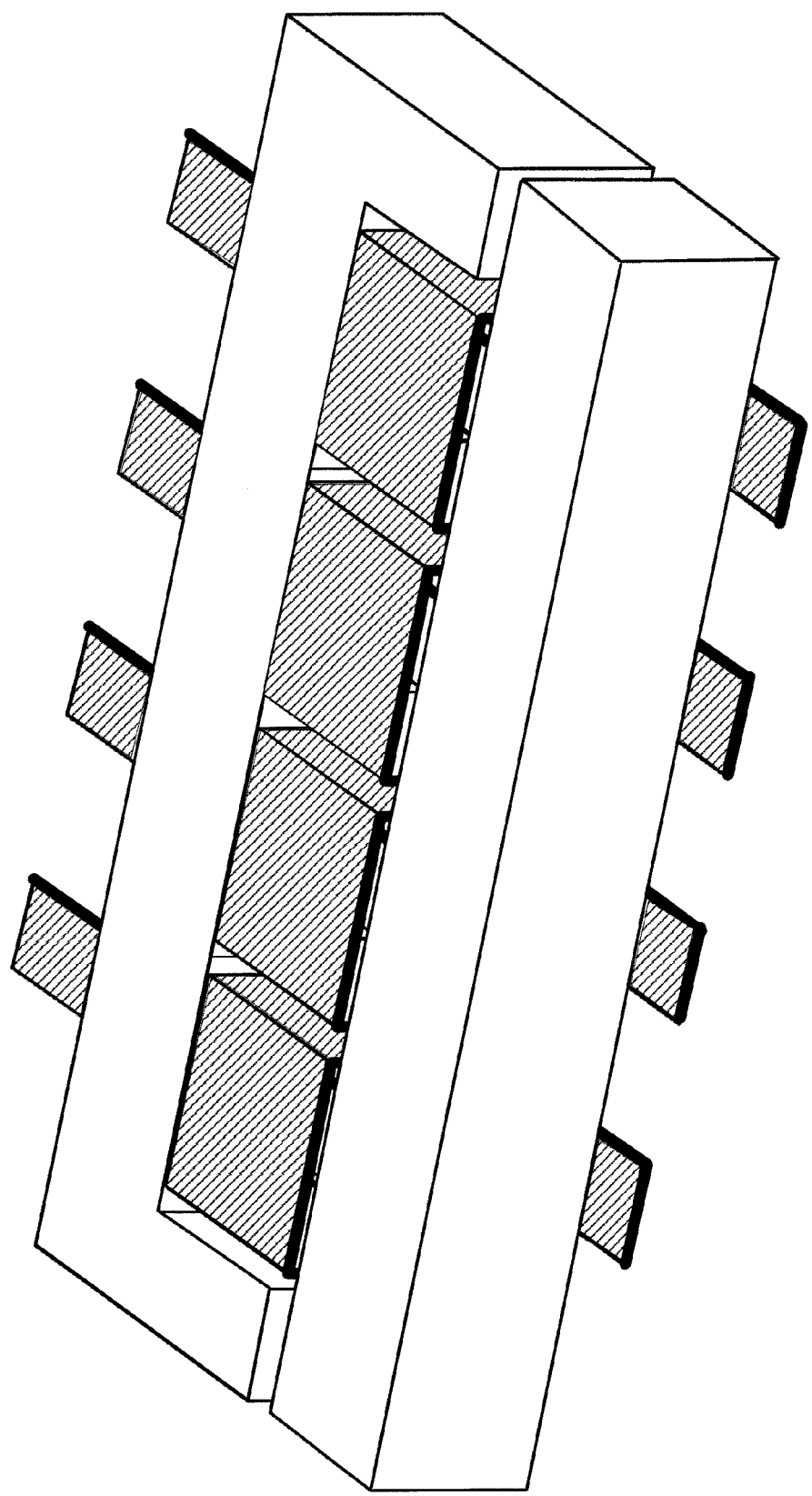
FIG. 20 shows a top perspective view of another embodiment of the inductor of FIG. 18.

At least portions of extended output tongues 1806 and extended input tongues 1808 are, for example, formed at a same height relative to a bottom surface of core 1804 to facilitate surface mount connection of inductor 1800 to a PCB. Each extended output tongue 1806, for example, supplements or replaces a PCB trace connecting inductor 1800 to a load (e.g., a processor). Each extended input tongue 1808, for example, supplements or replaces a PCB trace connecting inductor 1800 to DC-to-DC converter switching devices. Although FIG. 18 shows inductor 1800 as including three windings, inductor 1800 could have any number of windings greater than one. For example, FIG. 20 shows a top perspective view of a four winding embodiment of inductor 1800.

In some systems, each winding of a multiple winding inductor (e.g., inductor 1800) may be part of a separate phase of a multiphase DC-to-DC converter, such as discussed above with respect to FIG. 2.

Figure 21:
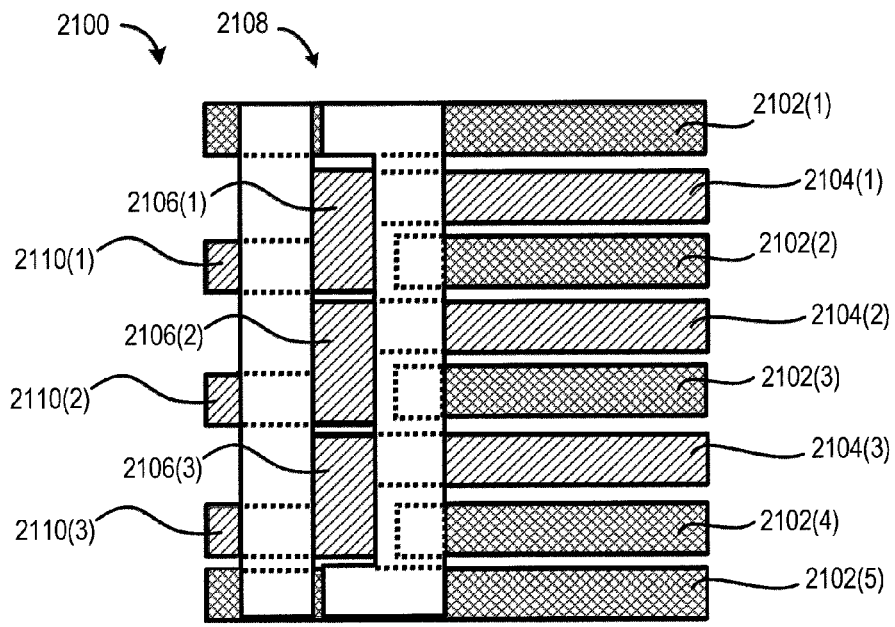
FIG. 21 shows a top plan view of one coupled inductor including ground return conductors and extended input and output tongues, according to an embodiment.

FIG. 21 shows a top plan view of one coupled inductor 2100, which is similar to inductor 1800 (FIG. 18); however, inductor 2100 includes ground return conductors 2102 disposed along extended output tongues 2104, where each extended output tongue 2104 is electrically coupled to a respective winding 2106. Ground return conductors 2102, for example, provide a low impedance ground return path between inductor 2100 and another component (e.g., a load, such as a processor). Ground return conductors 2102 as well as extended output tongues 2104 also may serve as heat sinks to cool a PCB that inductor 2100 is installed on. Dashed lines in FIG. 21 indicate outlines of windings 2106 and ground return conductors 2102 where obscured by a magnetic core 2108 of inductor 2100. At least respective portions of ground return conductors 2102, extended output tongues 2104, and extended input tongues 2110 are, for example, formed at a same height relative to a bottom surface of inductor 2100 to facilitate surface mount connection to a PCB.

Figure 22:
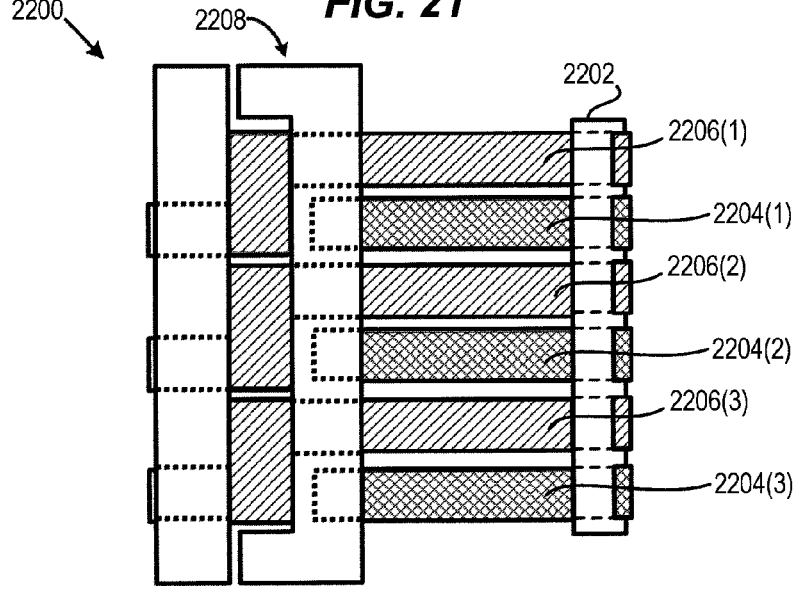
FIG. 22 shows a top plan view of an embodiment of the coupled inductor of FIG. 21 including an isolator.
Figure 23:
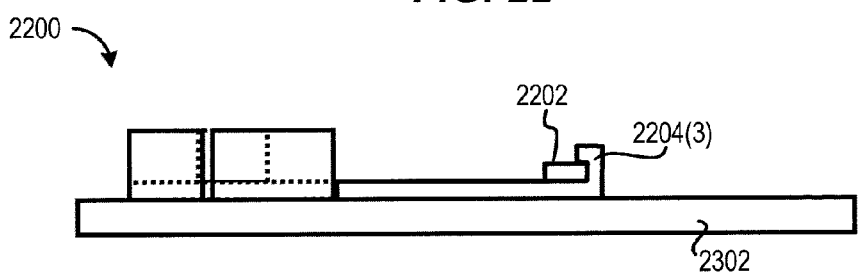
FIG. 23 shows a side plan view of the inductor of FIG. 22.

It should be noted that the quantity of windings as well as the quantity and configuration of ground return conductors may be varied. For example, FIG. 22 is a top plan view and FIG. 23 is a side plan view of one coupled inductor 2200, which is an embodiment of coupled inductor 2100 including at least one mechanical isolator 2202 connected to at least some of ground return conductors 2204 and/or extended output tongues 2206. Isolator 2202 increases mechanical strength of inductor 2200, as well as the planarity of ground return conductors 2204 and/or extended output tongues 2206. FIG. 23 shows inductor 2200 installed on a PCB 2302. Dashed lines indicate the outlines of windings and ground return conductors 2204 obscured by a magnetic core 2208 or isolator 2202.

Figure 24:
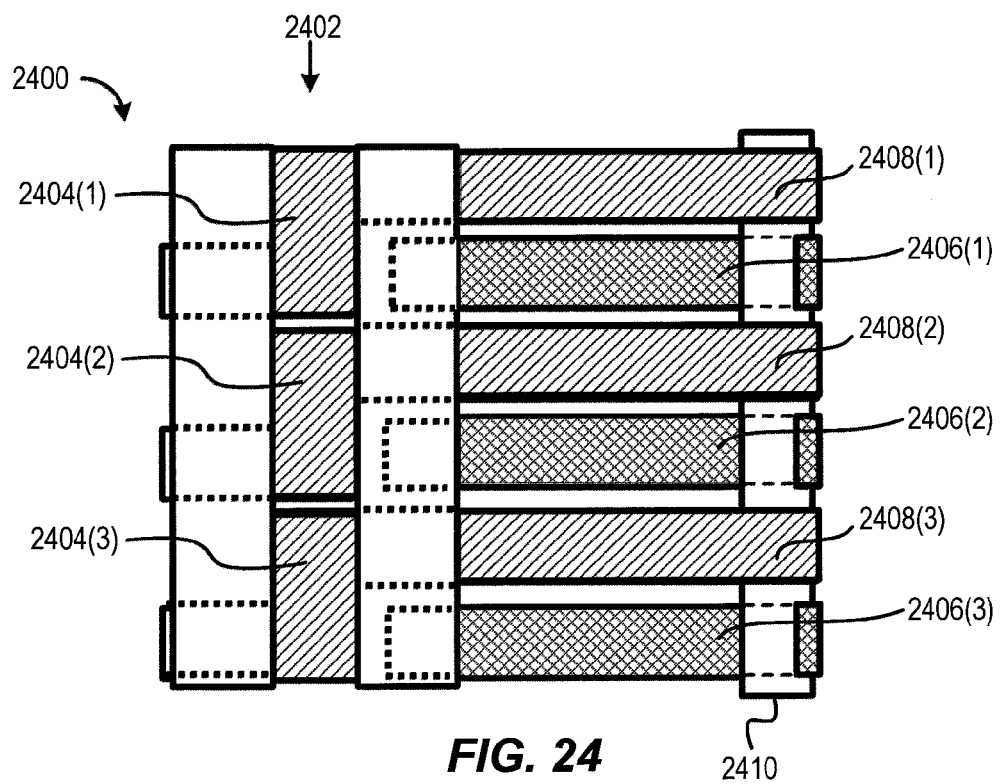
FIG. 24 shows a top plan view of one coupled inductor including ground return conductors and extend output tongues, according to an embodiment.
Figure 25:
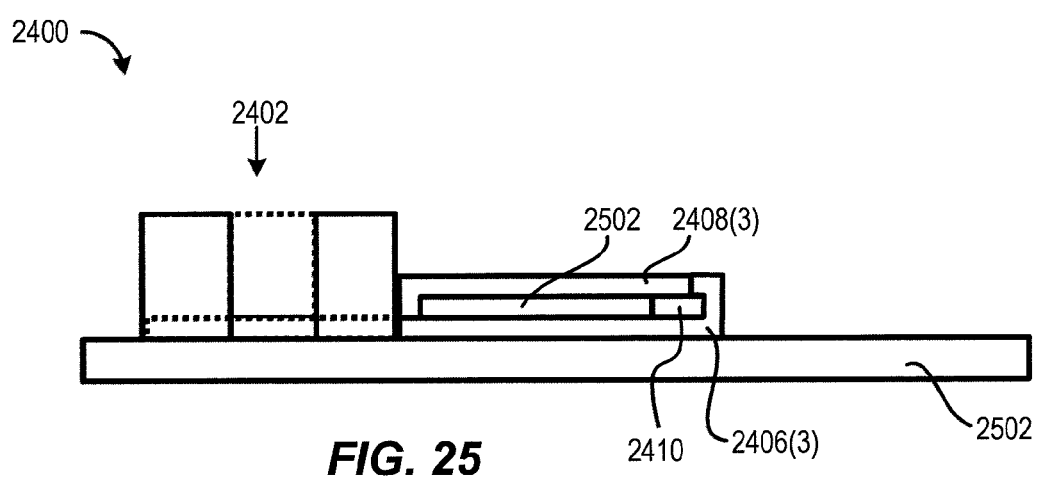
FIG. 25 shows a side plan view of the coupled inductor of FIG. 24 installed on a PCB.
Figure 26:
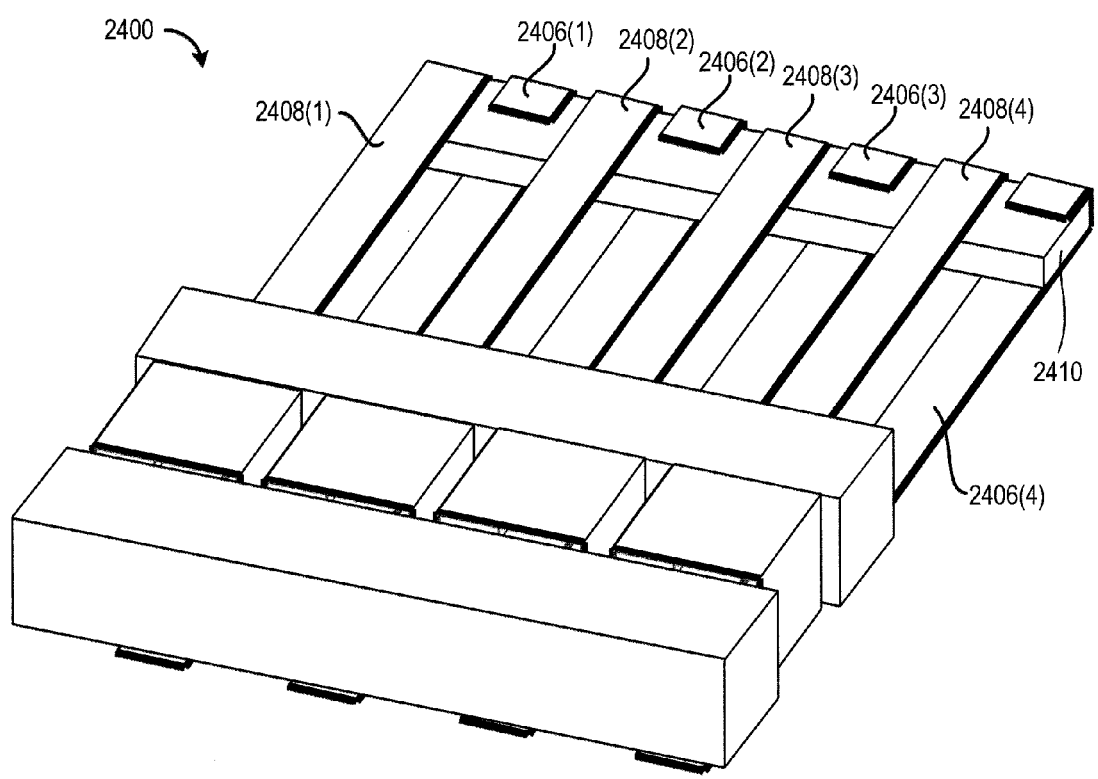
FIG. 26 is a top perspective view of the coupled inductor of FIGS. 24 and 25.

FIG. 24 is a top plan view of one coupled inductor 2400, FIG. 25 is a side plan view of coupled inductor 2400 installed on a PCB 2502, and FIG. 26 is a top perspective view of a four winding embodiment of coupled inductor 2400. Coupled inductor 2400 is similar to coupled inductor 2200 (FIG. 22). However, in contrast with coupled inductor 2200, coupled inductor 2400's magnetic core 2402 does not include features (e.g., gapped outer legs) to boost leakage inductance values. Instead, core 2402 and windings 2404 form a nearly-ideal transformer, and an area or channel 2502 formed by ground return conductors 2406 and extended output tongues 2408 serves as an "air core inductor" which boosts the leakage inductance values of windings 2404. The air core advantageously has close to zero core losses. Isolator 2410 can optionally be formed of a magnetic material (e.g., a ferrite and/or a powdered iron material) to increase the leakage inductance values of inductor 2400. Such magnetic material could be selected such that isolator 2410 at least partially saturates during normal operation of inductor 2400, thereby resulting in a significant decrease in leakage inductance values at high but normal winding currents. Dashed lines indicate an outline of windings 2404 and ground return conductors 2406 where obscured by core 2402 or isolator 2410.

Figure 27:
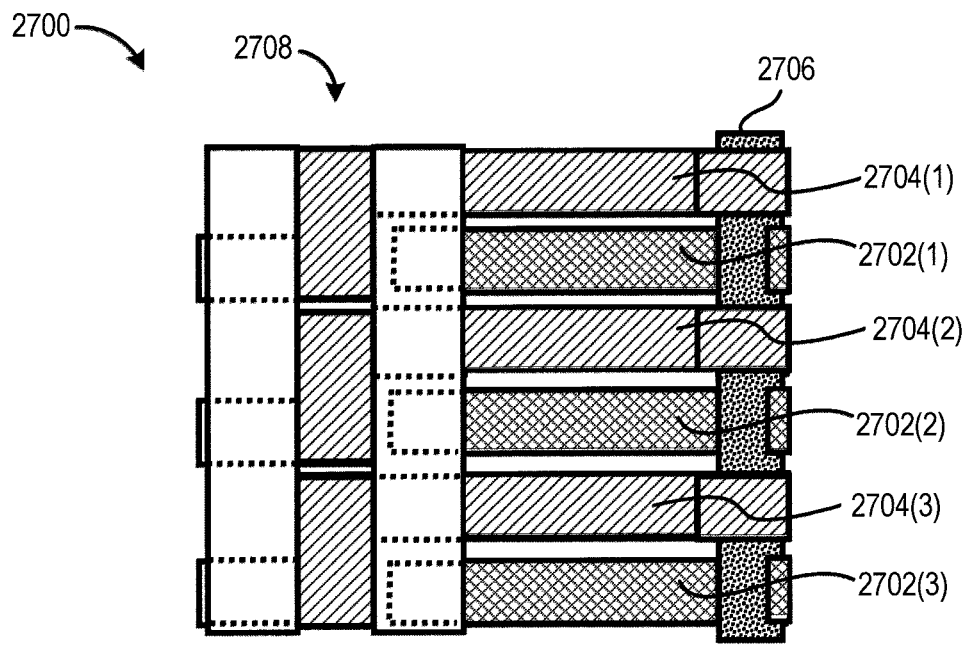
FIG. 27 shows a top plan view of one coupled inductor including ground return conductors and extended output tongues, according to an embodiment.
Figure 28:
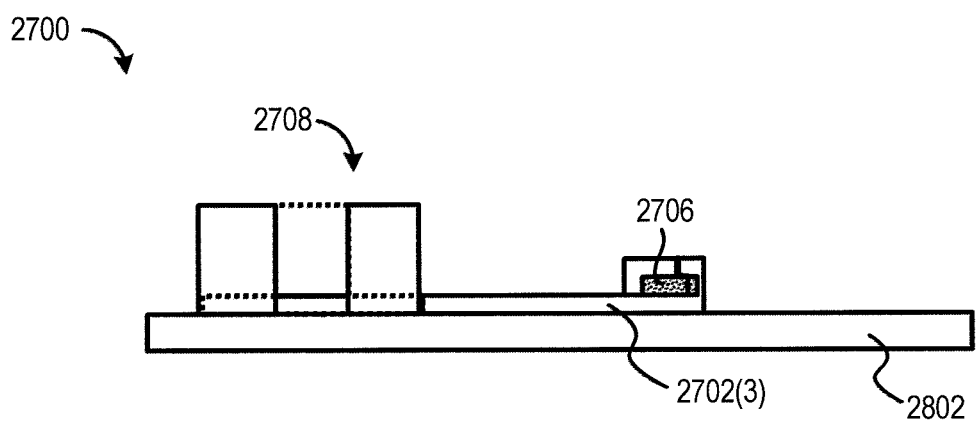
FIG. 28 shows a side plan view of the coupled inductor of FIG. 27 installed on a PCB.

FIG. 27 shows a top plan view of one coupled inductor 2700, and FIG. 28 shows a side plan view of coupled inductor 2700 installed on a PCB 2802. Coupled inductor 2700 is similar to inductor 2400 (FIG. 24). However, in inductor 2700, ground return conductors 2702 and extended output tongues 2704 are formed at least substantially at the same height with respect to magnetic core 2708 and do not form air core inductors. Isolator 2706 is formed of a magnetic material, which may be selected such that isolator 2706 at least partially saturates during normal operation of inductor 2700, thereby resulting in a significant decrease in leakage inductance values at high but normal winding currents. Dashed lines indicate the outline of windings and ground return conductors 2702 obscured by magnetic core 2708.

In other embodiments, low profile inductors as illustrated in FIG. 29-32, 33-35, or 36-38 have a low resistance foil winding, which is for example in part used to bridge the distance from a height-unrestricted area of a PCB to a load.

Figure 29:
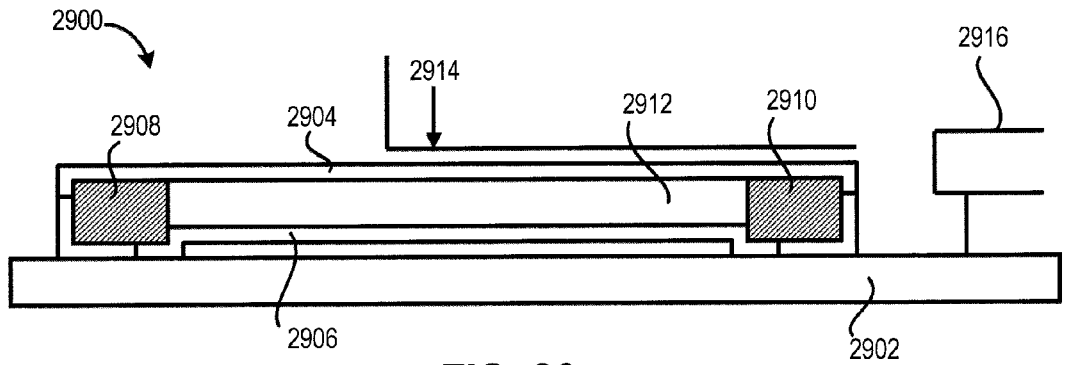
FIG. 29 shows a side plan view of one inductor having a low profile installed on a PCB, according to an embodiment.
Figure 30:
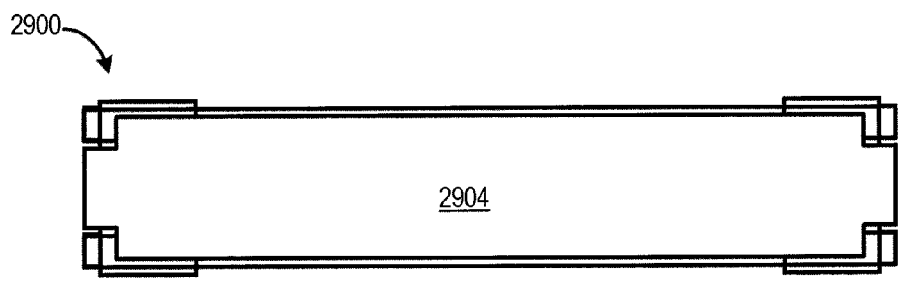
FIG. 30 shows a top plan view of the inductor of FIG. 29.
Figure 31:
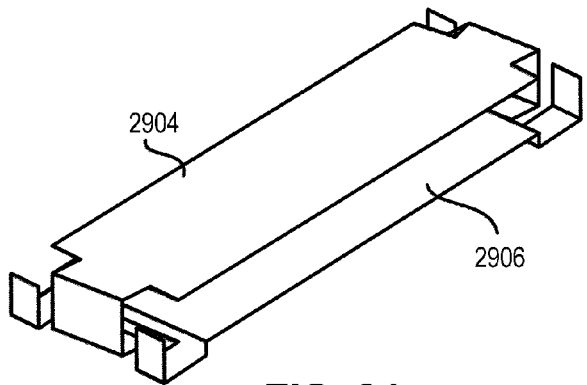
FIG. 31 shows a top perspective view of the inductor of FIGS. 29 and 30 with isolators removed.
Figure 32:
FIG. 32 shows one PCB footprint for use with the inductor of FIGS. 29-31, according to an embodiment.

FIG. 29 shows a side plan view of one inductor 2900 having a low profile installed on a PCB 2902, and FIG. 30 shows a top plan view of inductor 2900. Inductor 2900 includes an elongated foil winding 2904 disposed above an elongated foil ground return conductor 2906. Ground return conductor 2906 is, for example, configured such that it only partially contacts a PCB, as shown in FIG. 29. Isolators 2908, 2910 separate winding 2904 and ground return conductor 2906 such that inductor 2900 forms an area or channel 2912 that serves as an air core. Winding 2904 and ground return conductor 2906 are, for example, at least substantially parallel along channel 2912. One or more of isolators 2908, 2910 may optionally include a magnetic material (e.g., a ferrite material and/or a powdered iron material) to boost inductance of inductor 2900. FIG. 31 is a top perspective view of inductor 2900 with isolators 2908, 2910 removed, and FIG. 32 is a top plan view of one PCB footprint that could be used with inductor 2900. As shown in FIG. 29, one possible application of inductor 2900 is to bridge a height restriction 2914 in the vicinity of a load 2916.

Figure 33:
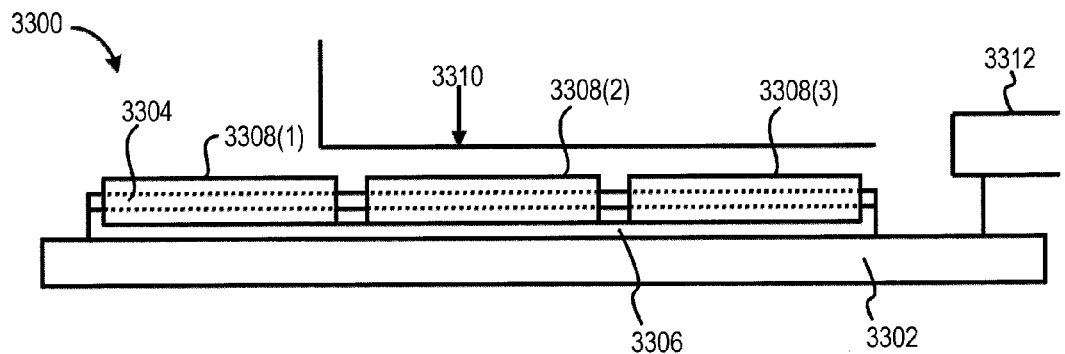
FIG. 33 shows a side plan view of one inductor having a low profile installed on a PCB, according to an embodiment.
Figure 34:
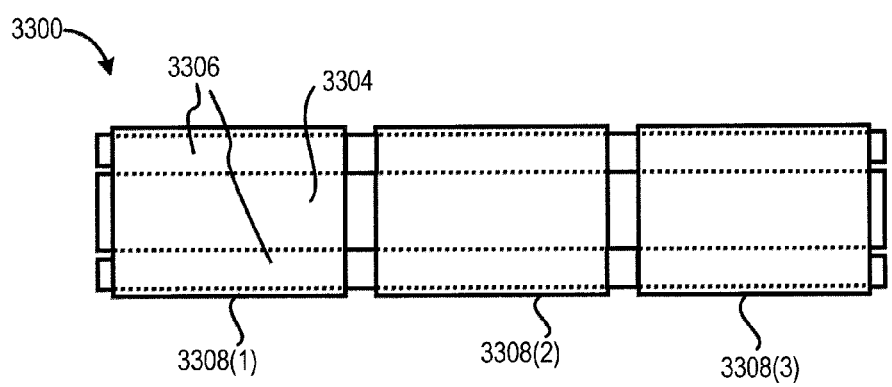
FIG. 34 shows a top plan view of the inductor of FIG. 33.
Figure 35:
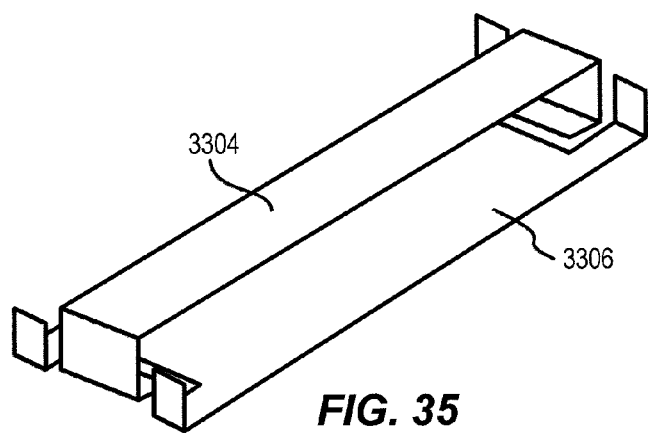
FIG. 35 shows a top perspective view of the inductor of FIGS. 33 and 34 with magnetic sections removed.

FIG. 33 shows a side plan view of one inductor 3300 having a low profile installed on a PCB 3302, and FIG. 34 shows a top plan view of inductor 3300. Inductor 3300 includes a foil winding 3304 disposed above a foil ground return conductor 3306. Inductor 3300 includes at least one magnetic section 3308 formed of a magnetic material (e.g., a ferrite material and/or a powdered iron material) disposed on ground return conductor 3306. Winding 3304 extends through an opening in each magnetic section 3308. Magnetic sections 3308 increase inductance of inductor 3300, provide mechanical support, and cause inductor 3300 to be "shielded". It may be advantageous for inductor 3300 to include a number of smaller magnetic sections 3308 instead of one large magnetic section because smaller magnetic sections may facilitate manufacturability, resist cracking, and tolerate PCB flexing, while nevertheless providing significant collective core cross section, which helps minimize core loss in switching power supply applications. Winding 3304 and ground return conductor 3306 are shown by dashed lines where obscured by magnetic sections 3308 in FIGS. 33-34. FIG. 35 shows a top perspective view of inductor 3300 with magnetic sections 3308 removed. As shown in FIG. 33, one possible application of inductor 3300 is to bridge a height restriction 3310 in the vicinity of a load 3312.

Figure 36:
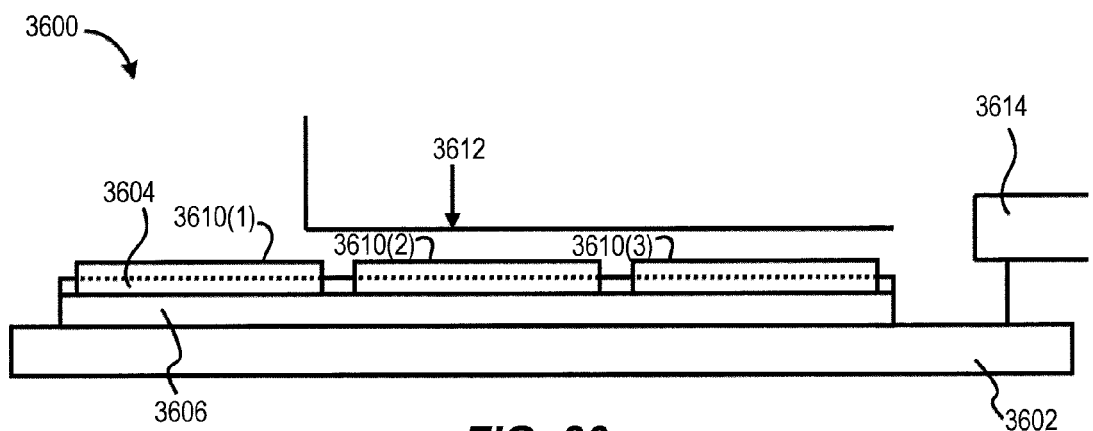
FIG. 36 shows a side plan view of one inductor having a low profile installed on a PCB, according to an embodiment.
Figure 37:
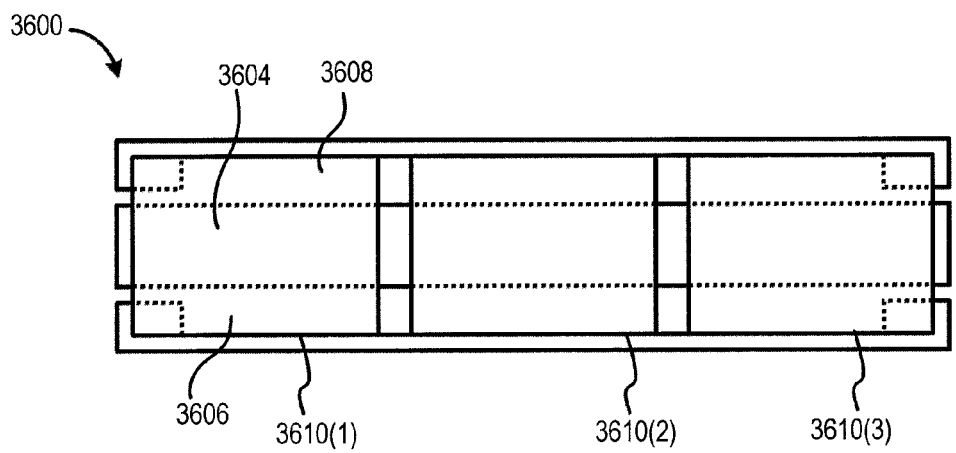
FIG. 37 shows a top plan view of the inductor of FIG. 36.
Figure 38:
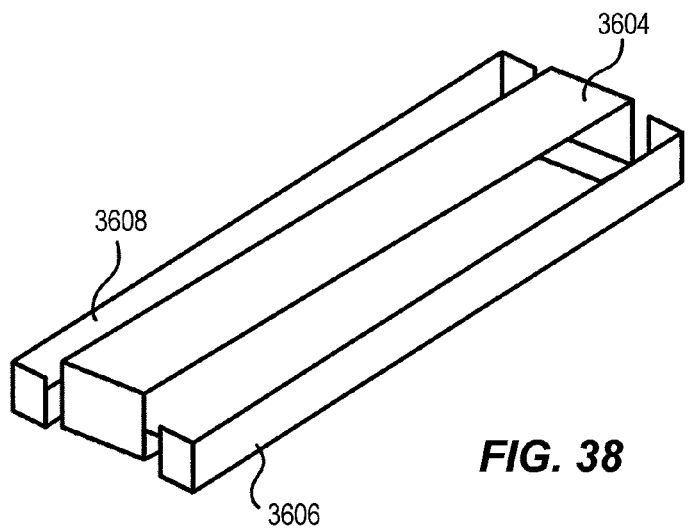
FIG. 38 shows a top perspective view of the inductor of FIGS. 36 and 37 with magnetic sections removed.

FIG. 36 shows a side plan view of one low profile inductor 3600 installed on a PCB 3602, and FIG. 37 shows a top plan view of inductor 3600. Inductor 3600 includes a foil winding 3604 disposed between ground return conductors 3606, 3608. At least one magnetic section 3610 (e.g., formed of a ferrite material and/or a powdered iron material) is disposed between ground return conductors 3606, 3608. Winding 3604 is wound through an opening in each magnetic section 3610 in FIGS. 36-37. For the same reasons as discussed above with respect to inductor 3300 (FIGS. 33-35), it may be advantageous for inductor 3600 to include a number of smaller magnetic sections 3610 instead of one large magnetic section. The outlines of winding 3604 and ground return conductors 3606, 3608 are shown by dashed lines where obscured by magnetic sections 3610. FIG. 38 shows a top perspective view of inductor 3600 with magnetic sections 3610 removed. Inductor 3600 may allow for use of larger cross section magnetic sections than inductor 3300 due to ground return conductors 3606, 3608 being disposed only on the sides of inductor 3600, which allows magnetic sections 3610 to occupy the portion of inductor 3600's height that would otherwise be occupied by ground return conductors. As shown in FIG. 36, one possible application of inductor 3600 is to bridge a height restriction 3612 in the vicinity of a load 3614.

State of the art switching devices generally have a height of less than one millimeter when assembled on a PCB. Other commonly used surface mount components, such as ceramic capacitors, also have a similarly low height. Inductors, however, typically have a height of several millimeters so that their cores have a sufficiently large cross section to keep core losses to an acceptable level.

Figure 39:
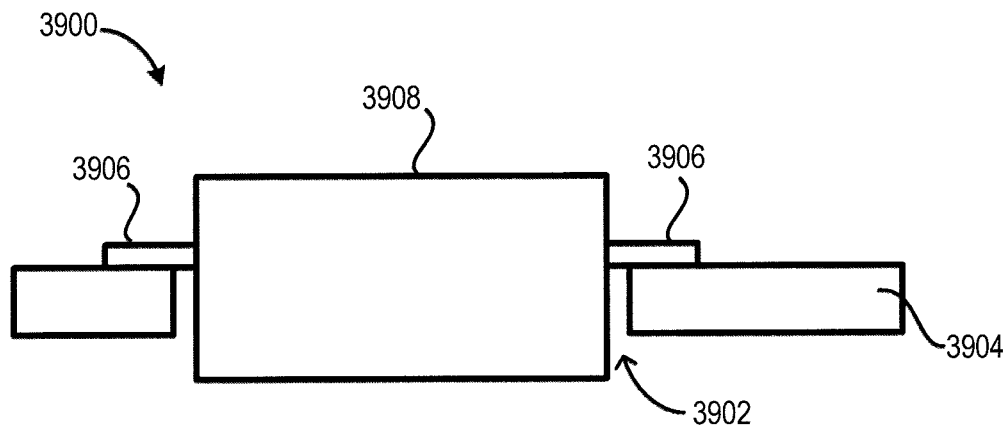
FIG. 39 shows a side cross-sectional view of a PRIOR ART drop-in inductor installed in a PCB aperture.

Accordingly, in height restricted applications, it may be desirable to use a "drop-in" inductor disposed in a PCB aperture. For example, FIG. 39 shows a side cross-sectional view of a prior art drop-inductor 3900 installed in an aperture 3902 of a PCB 3904. Inductor 3900 includes solder tabs 3906, a magnetic core 3908, and a soft, multi-turn wire winding (not shown in FIG. 39) wound around core 3908 and connected to solder tabs 3906.

Figure 40:
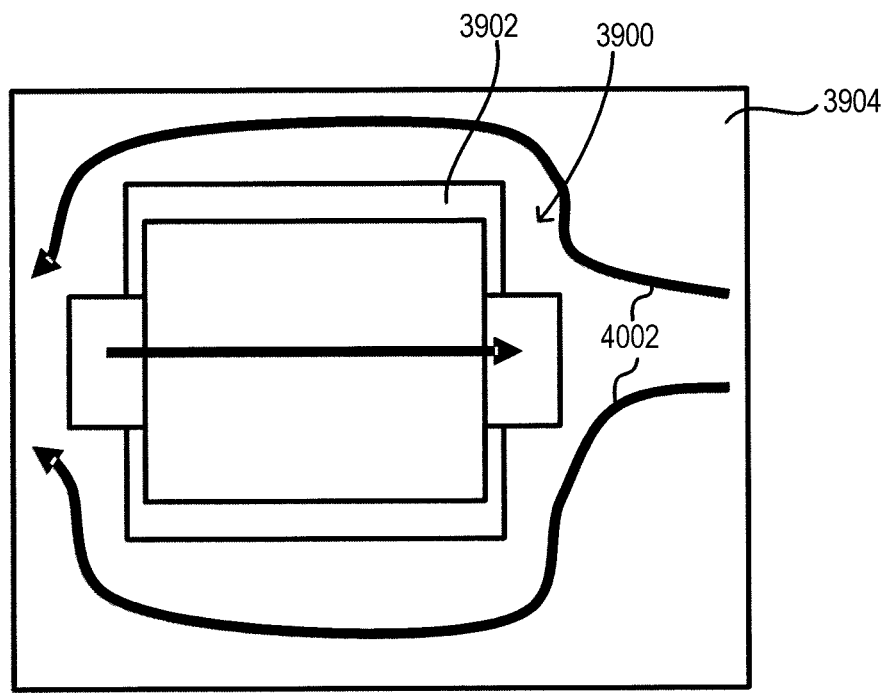
FIG. 40 shows a top plan view of the inductor of FIG. 39 installed in a PCB aperture.
Figure 41:
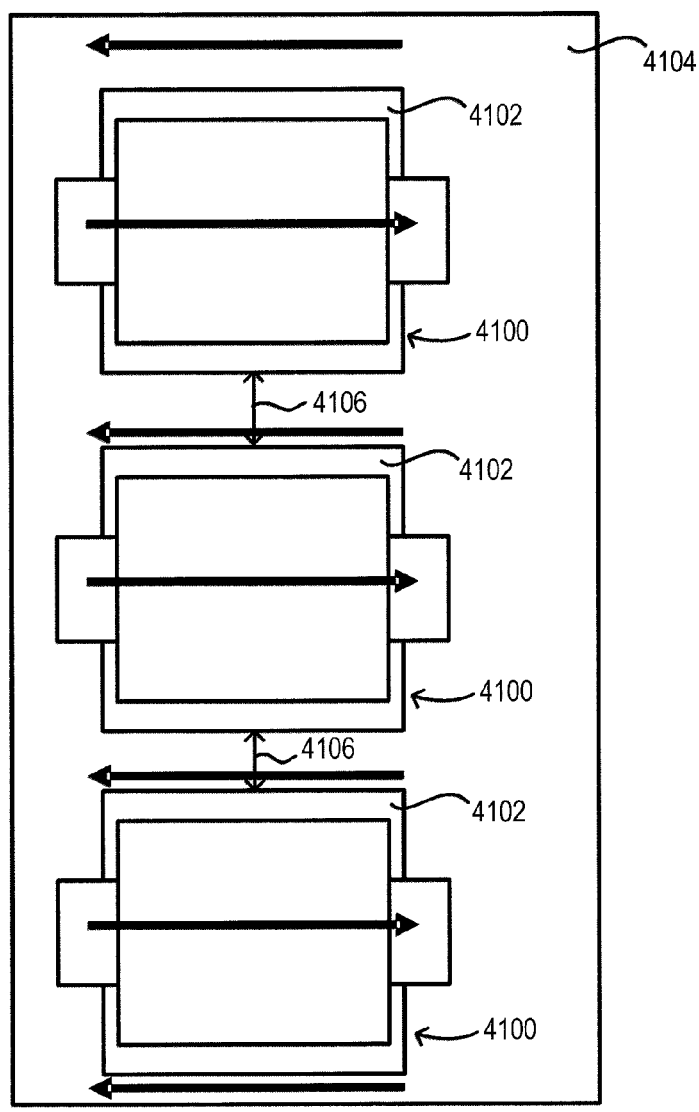
FIG. 41 shows a top plan view of a plurality of PRIOR ART drop-in inductors installed in respective PCB apertures.

Inductor 3900 advantageously utilizes the height on both side of PCB 3904, as well as the thickness of PCB 3904. However, the aperture required for drop-in inductor 3900 reduces the path for return current through ground plane or interconnect layers of the PCB in the vicinity of the inductor, thereby increasing the return path impedance and associated losses. For example, FIG. 40 shows a top plan view of inductor 4000 installed in aperture 3902 of PCB 3904. Return current cannot flow through aperture 3902—accordingly, return current must flow around aperture 3902, as represented by arrows 4002, which increases return path impedance. Accordingly, with typical drop-in inductors, sufficient space must be provided around aperture 3902 for return current conduction. Additionally, inductance is affected by the return current path, and aperture 3902 will affect the inductance of inductor 3900 because return current does not flow under inductor 3900. The situation may be amplified in multiphase applications, such as shown in FIG. 41, where a plurality of apertures 4102 in a PCB 4104 are required for prior art drop-in inductors 4100. Apertures 4102 significantly increase return path impedance, and significant spacing 4106 between apertures 4102 is required to provide a return current path.

Furthermore, inductor 3900 is often fragile when installed in a PCB aperture. In particular, inductor 3900's solder tabs 3906 typically support inductor 3900's entire weight because inductor 3900's core 3908 typically does not contact PCB 3904. Accordingly, solder tabs 3906 are typically subject to significant mechanical stress, and may cause core 3908, which is typically formed of a relatively fragile magnetic material, to crack.

Figure 42:
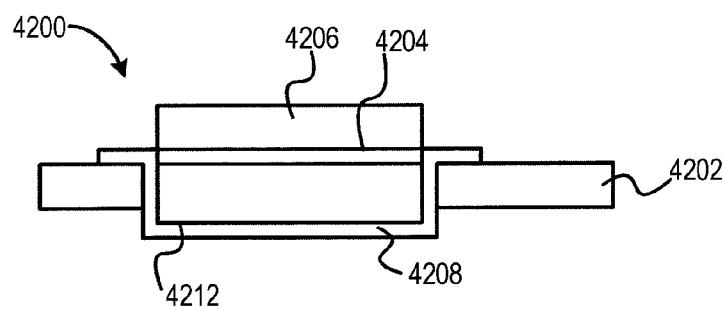
FIG. 42 shows a side cross-sectional view of one drop-in inductor including ground return conductors installed in a PCB aperture, according to an embodiment.
Figure 43:
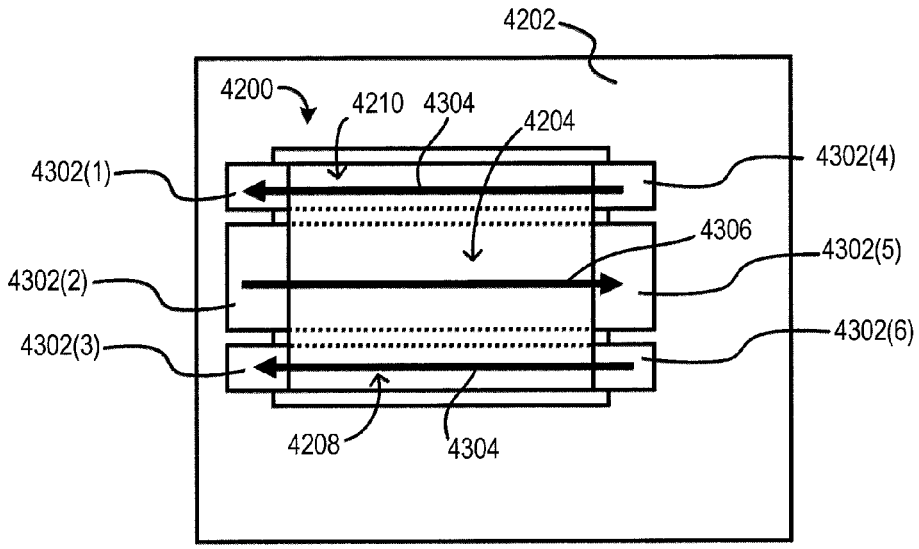
FIG. 43 shows a top plan view of the inductor of FIG. 42 installed in a PCB aperture.
Figure 44:
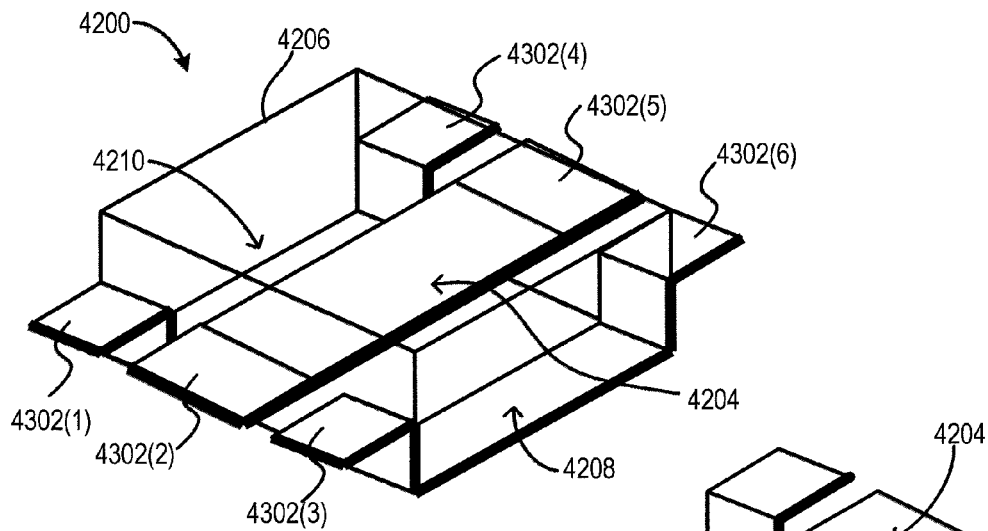
FIG. 44 shows a top perspective view of the inductor of FIGS. 42 and 43.

At least some of the problems discussed above can be reduced or eliminated with a drop-in inductor including one or more ground return conductors. For example, FIG. 42 shows a side cross-sectional view and FIG. 43 shows a top plan view of one drop-in inductor 4200 installed in an aperture of a PCB 4202. FIG. 44 shows a top perspective view of inductor 4200.

Figure 45:
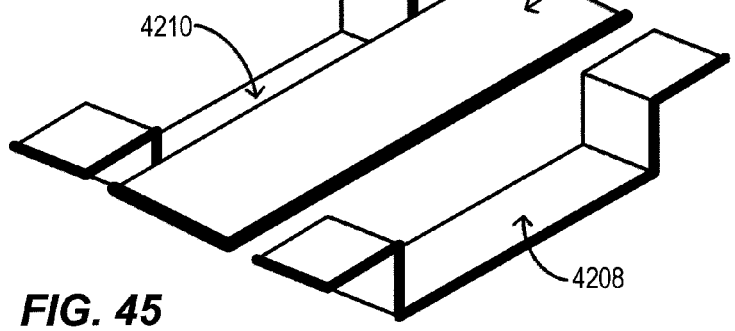
FIG. 45 shows a top perspective view of the inductor of FIGS. 42-44 with a magnetic core removed.

Inductor 4200 includes a winding 4204 wound at least partially around or through at least a portion of a magnetic core 4206 (e.g., formed of a ferrite and/or powdered iron material). Winding 4204, for example, extends through a channel in core 4206. FIG. 45 shows a top perspective view of inductor 4200 with core 4206 removed. Inductor 4200 also includes ground return conductors 4208, 4210. Outlines of winding 4204 and ground return conductors 4208, 4210 are shown by dashed lines in FIG. 43 where obscured by core 4206, and core 4206 is shown as transparent in FIG. 44. Winding 4204 and/or ground return conductors 4208, 4210 are, for example, foil conductors, as shown in FIGS. 42-45. Such foil conductors may, but need not be, sufficiently thick to be relatively rigid. Core 4206 does not form a magnetic path loop around ground return conductors 4208, 4210. Accordingly, inductance of ground return conductors 4208, 4210 is, for example, not significantly increased by presence of core 4206.

Inductor 4200 can be used, for example, to provide a path for return current, as shown by arrows 4304 in FIG. 43, as well as to provide a path for current to a load, as shown by arrow 4306. Thus, in contrast to prior art drop-in inductors, return current does not need to flow around inductor 4200—instead return current can flow through ground return conductors 4208, 4210 attached to inductor 4200.

In contrast to prior art drop-in inductors, use of inductor 4200 does not necessarily increase return path impedance. Ground return conductors 4208, 4210 are often of similar thickness to that of winding 4204 and are frequently ten to fifty times thicker than typical PCB trace foil thickness. Use of drop-in inductor 4200 may therefore significantly decrease return path impedance, despite a PCB aperture being required for inductor 4200. Furthermore, inductance of inductor 4200 is less affected by PCB layout than prior art drop-in inductors because return current flows through inductor 4200.

Moreover, because inductor 4200 provides a path for return current, a number of inductors 4200 can be spaced close together without having to allow for space between inductors for a return current path, such as spacing 4106 required between prior art drop-in inductors 4100 of FIG. 41. Ground return conductors 4208, 4210 may even allow a number of inductors 4200 to be placed in a single aperture. Accordingly, a number of inductors 4200 may require less space on a PCB than the same number of prior art drop-in inductors because inductors 4200 can be placed closer together than the prior art drop-in inductors, or a number of inductors 4200 can be placed in a common aperture.

Winding 4204 and ground return conductors 4208, 4210, for example, have respective solder tabs 4302 electrically coupled to their ends to facilitate surface mount connection of inductor 4200 to a PCB. Solder tabs 4302 are typically formed at the same height relative to a bottom surface 4212 of core 4206 to facilitate surface mount connection of inductor 4200 to a PCB. In some embodiments, solder tabs 4302 are extensions of winding 4204 or ground return conductors 4208, 4210, which may facilitate manufacturability of inductor 4200. For example, winding 4204 and its respective solder tabs 4302 may be formed of a single foil winding. Each of solder tabs 4302, for example, connect to PCB traces on a common PCB layer.

Inductor 4200 may be more mechanically robust than prior art drop-in inductors. For example, in embodiments where winding 4204 is a relatively rigid foil extending through a channel in core 4206, winding 4204 may provide significant mechanical support for inductor 4200. In contrast, the soft, multi-turn wire winding of prior art drop-in inductor 3900 typically provides little to no mechanical support for inductor 3900.

Additionally, ground return conductor 4208, 4210 may increase mechanical robustness of inductor 4200. For example, solder tabs 4302 coupled to ground return conductors 4208, 4210 may provide additional points to support inductor 4200 on a PCB, thereby reducing stress on inductor 4200's solder tabs and consequently reducing the likelihood of core 4206 cracking. For example, if each of winding 4204 and ground return conductors 4208, 4210 have respective solder tabs 4302 coupled to their ends, inductor 4200 may be supported on a PCB at six different places, as opposed to prior art inductor 3900, which is supported at only two places.

Furthermore, ground return conductors 4208, 4210 may promote overall mechanical strength of inductor 4200.

Figure 46:
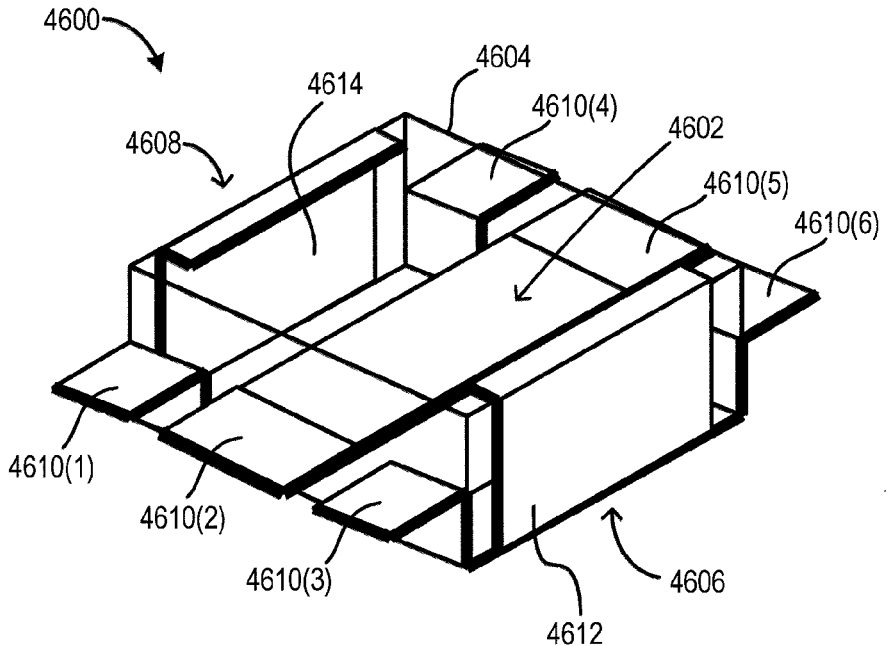
FIG. 46 shows a top perspective view of one drop-in inductor including ground return conductors, according to an embodiment.
Figure 47:
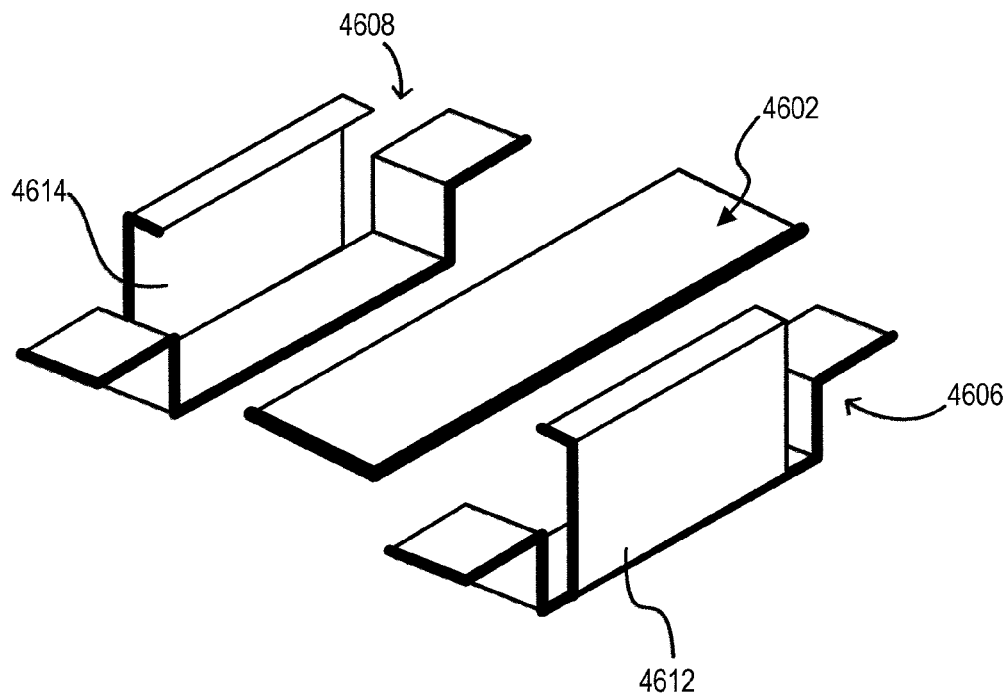
FIG. 47 shows an exploded perspective view of the inductor of FIG. 46 with a magnetic core removed.

Drop-in inductors with ground return conductors may have other configurations. For example, FIG. 46 shows a top perspective view of one drop-in inductor 4600, which is a variation of inductor 4200 (FIGS. 42-45). Inductor 4600 includes a winding 4602 wound at least partially around or through at least a portion of a magnetic core 4604 (shown as transparent in FIG. 46). Inductor 4600 further includes ground return conductors 4606, 4608. FIG. 47 is an exploded perspective view of inductor 4600 with magnetic core 4604 removed. A respective solder tab 4610 may be electrically coupled to each end of winding 4602 and ground return conductors 4606, 4608. Each of solder tabs 4610 are, for example, formed at the same height relative to a bottom surface of core 4604 to facilitate surface mount connection of inductor 4600 to a PCB.

Figure 48:
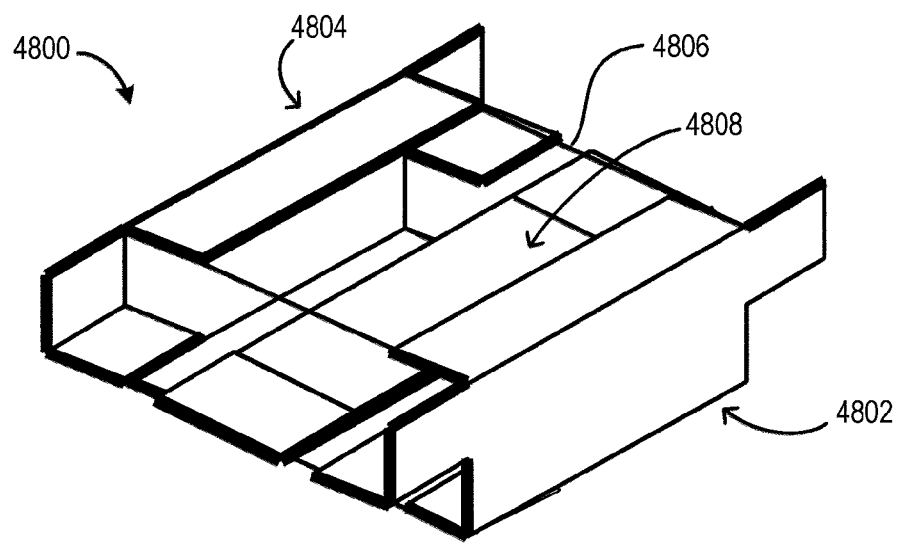
FIG. 48 shows a top perspective view of another embodiment of the inductor of FIGS. 46-47.
Figure 49:
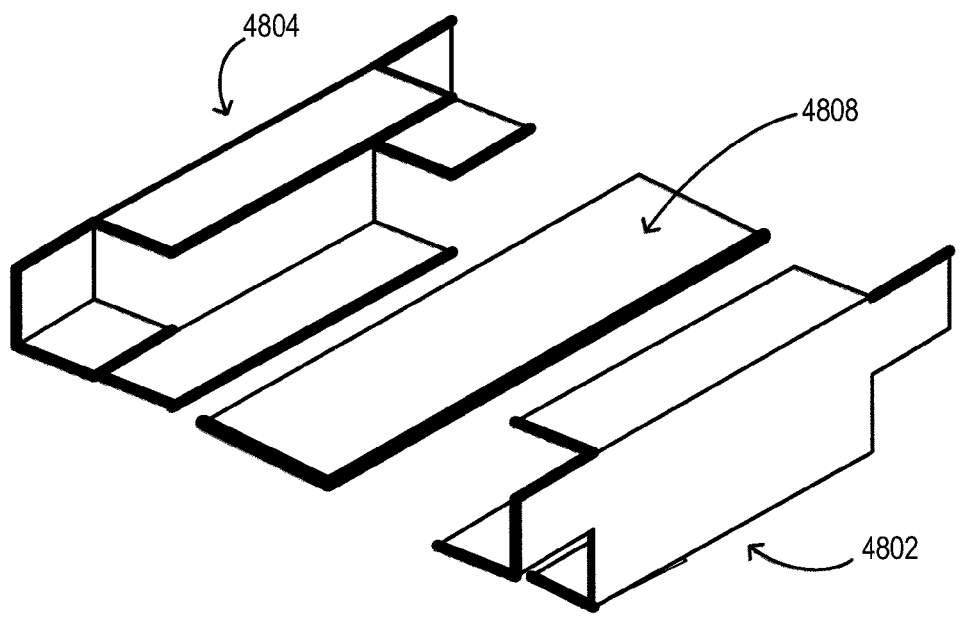
FIG. 49 shows an exploded perspective view of the inductor of FIG. 48 with a magnetic core removed.

Ground return conductors 4606, 4608 respectively include clamps 4612, 4614 which may allow for easier clamping of the ground return conductors to magnetic core 4604. Clamps 4612, 4614 may also increase robustness, physical attachment strength, and heat sinking ability of ground return conductors 4606, 4608. FIG. 48 shows a top perspective view of inductor 4800, which is an alternate embodiment of inductor 4600 including ground return conductors 4802, 4804 that provide enhanced clamping to magnetic core 4806 and enhanced conductivity. Winding 4808 is wound at least partially around or though a least a portion of core 4806, and core 4806 is shown as transparent in FIG. 48. FIG. 49 is an exploded perspective view of inductor 4800 with magnetic core 4806 removed.

Figure 50:
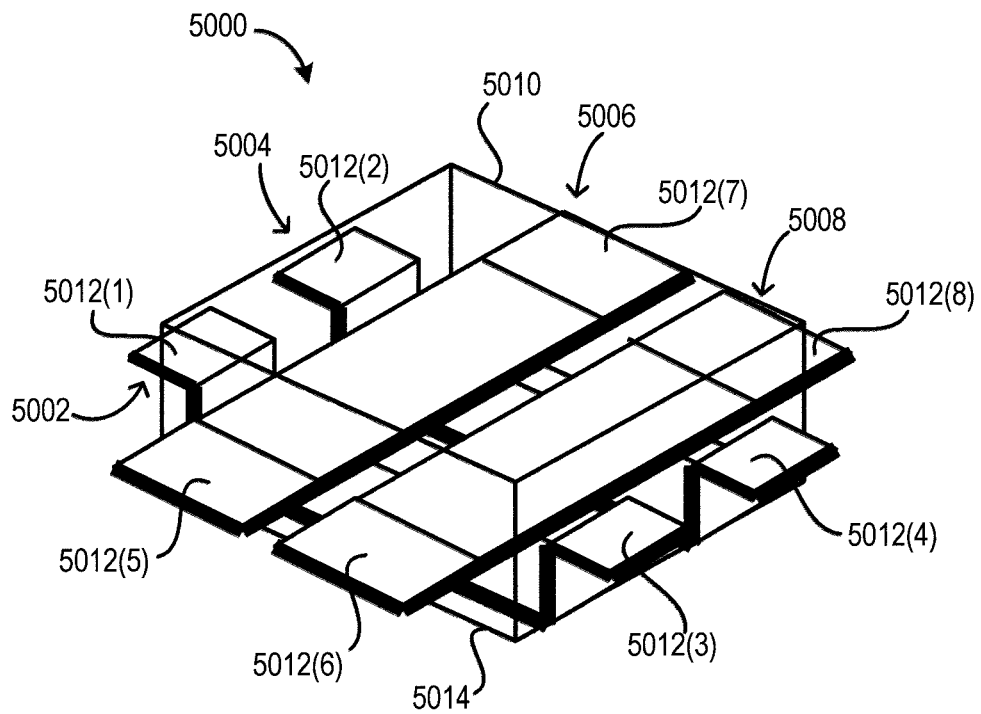
FIG. 50 shows a top perspective view of one drop-in coupled inductor including ground return conductors, according to an embodiment.
Figure 51:
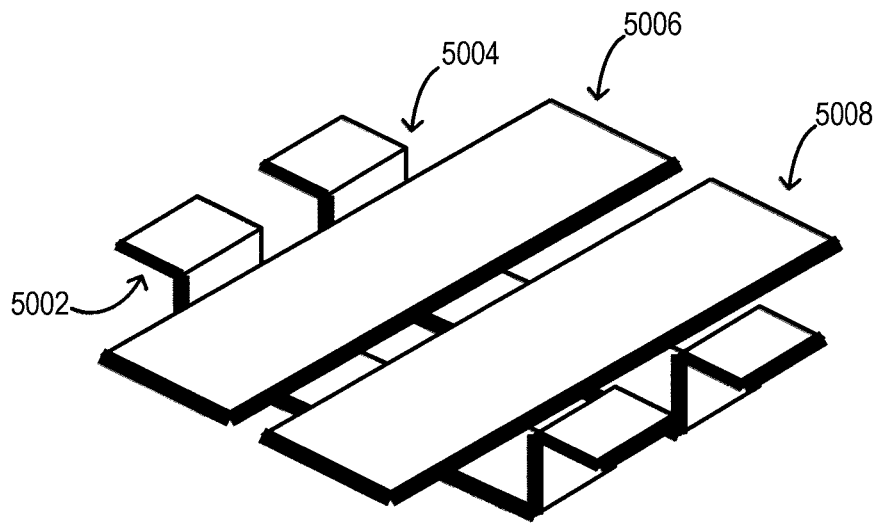
FIG. 51 shows a top perspective view of the inductor of FIG. 50 with a magnetic core removed.

The concept of adding ground return conductors to drop-in inductors can be extended to inductors including multiple, magnetically coupled windings. For example, FIG. 50 shows a top perspective view of a drop-in coupled inductor 5000 including ground return conductors 5002, 5004. Coupled inductor 5000 further includes windings 5006, 5008 wound at least partially around or through at least a portion of a magnetic core 5010 (shown as transparent in FIG. 50). FIG. 51 is a top perspective view of inductor 5000 with magnetic core 5010 removed. A respective solder tab 5012 is, for example, electrically coupled to each of ground return conductors 5002, 5004, and windings 5006, 5008. Solder tabs 5012 are, for example, formed at the same height relative to a bottom surface 5014 of core 5010 to facilitate surface mount connection of inductor 5000 to a PCB. Although inductor 5000 is shown as being a two winding coupled inductor, inductor 5000 could be extended to support three or more windings. Additional ground return conductors could also be added, or ground return conductors 5002, 5004 could be combined into a single conductor.

Figure 52:
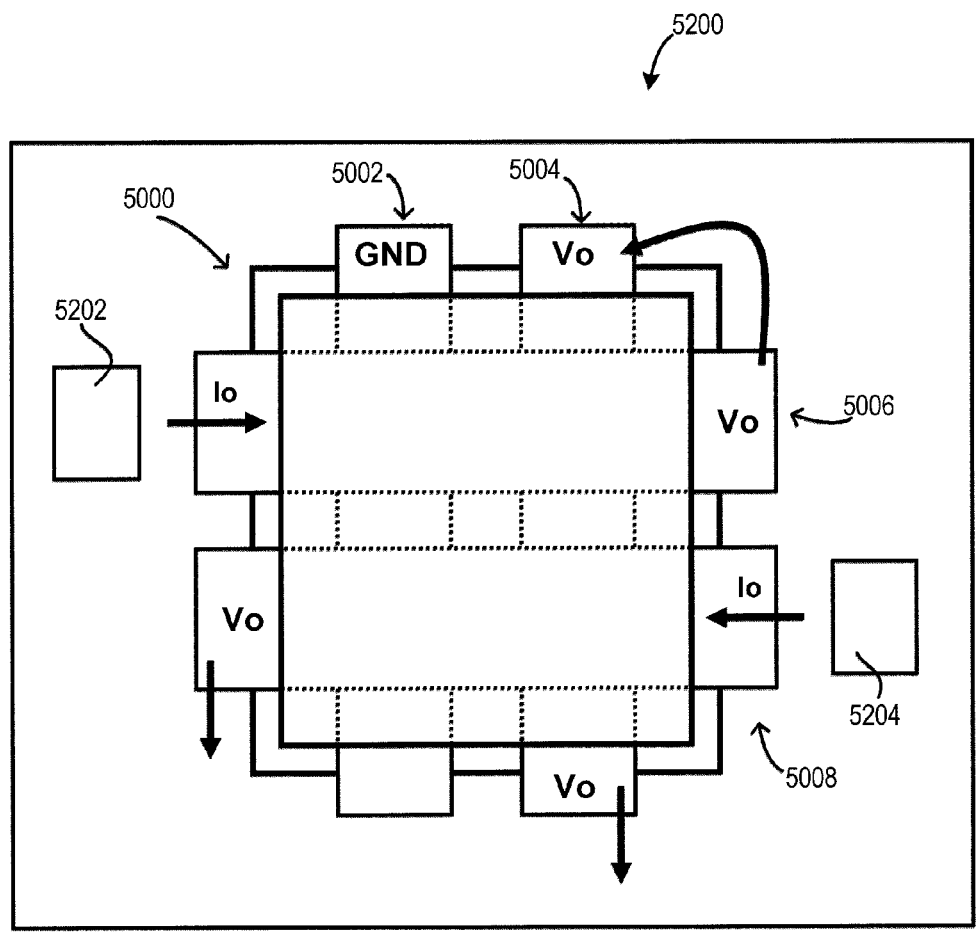
FIG. 52 shows a top plan view of one PCB assembly including an embodiment of the inductor of FIGS. 50-51.

FIG. 52 shows a top plan view of one PCB assembly 5200, which shows one possible application of coupled inductor 5000. In assembly 5200, not only do windings 5006, 5008 respectively carry current from power stages 5202, 5204 to a load, ground return conductor 5004 also carries current to the load. Ground return conductor 5002, however, serves to carry return current.

Figure 53:
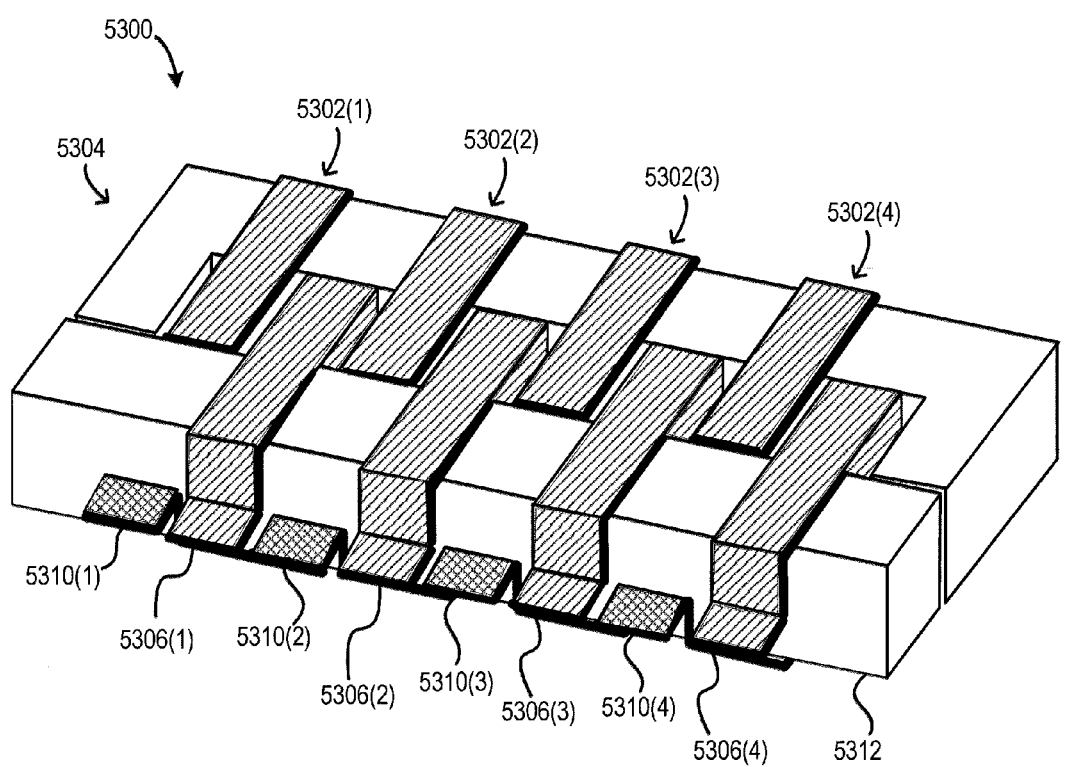
FIG. 53 shows a top perspective view of one N-winding coupled inductor including a ground return structure, according to an embodiment.
Figure 54:
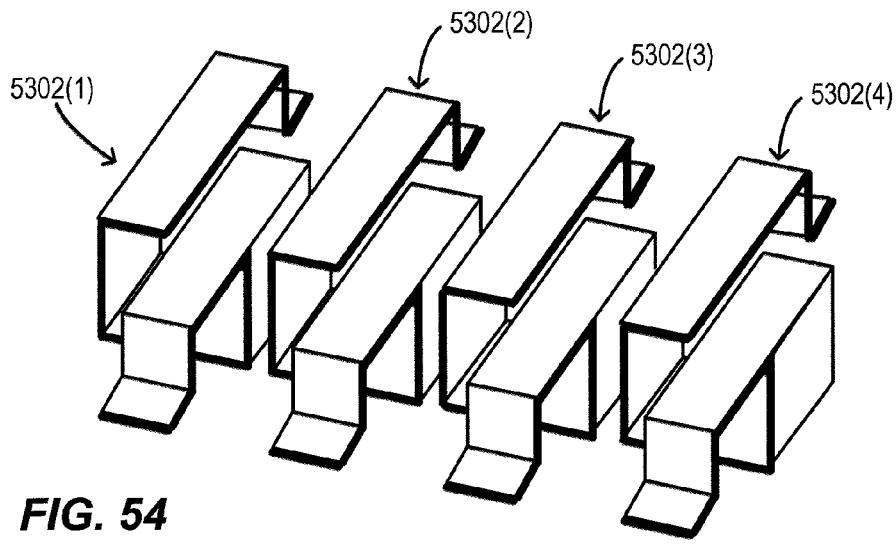
FIG. 54 shows a top perspective view of the windings of the inductor of FIG. 53.

FIG. 53 shows a top perspective view of one N-winding coupled inductor 5300, which is another example of a drop-in inductor including a ground return conductor. Inductor 5300 includes N windings 5302, where N is an integer greater than one. Although inductor 5300 is shown as including four windings, inductor 5300 could be modified to include any number of windings greater than one. Each winding 5302 is at least partially wound around a respective leg of a magnetic core 5304. A respective solder tab 5306 is electrically coupled to each end of each winding 5300. Solder tabs 5306 allow windings 5302 to be soldered to a PCB that inductor 5300 is installed in an aperture of. Solder tabs 5306 are, for example, extensions of their respective windings 5302. FIG. 54 shows a top perspective view of windings 5302.

Figure 55:
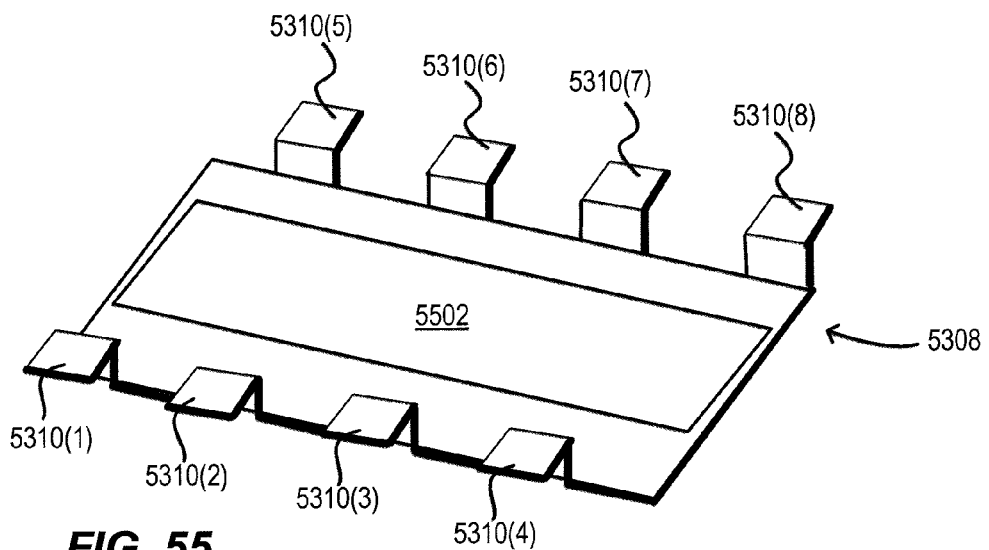
FIG. 55 shows a top perspective view of the ground return structure of the inductor of FIG. 53.

Inductor 5300 further includes a ground return current conductor in the form of a return current structure 5308 to provide a low impedance path for return current. FIG. 55 shows a top perspective view of structure 5308. Structure 5308 can also advantageously serve as a heat sink for inductor 5300 and a PCB that inductor 5300 is installed in. Structure 5308 includes, for example, several solder tabs 5310 for soldering to a PCB. Solder tabs 5306 and 5310 are, for example, formed at the same height relative to a bottom surface 5312 of core 5304 to facilitate surface mount connection of inductor 5300 to a PCB. Structure 5308 optionally includes an isolator 5502 to prevent structure 5308 from electrically shorting to windings 5302. Isolator 5502 is, for example, a dielectric coating or an isolating layer, such as dielectric tape. In the example of FIG. 53, structure 5308 is disposed on the bottom side of inductor 5300—accordingly, only some of solder tabs 5310 of structure 5308 are visible in FIG. 53.

Figure 56:
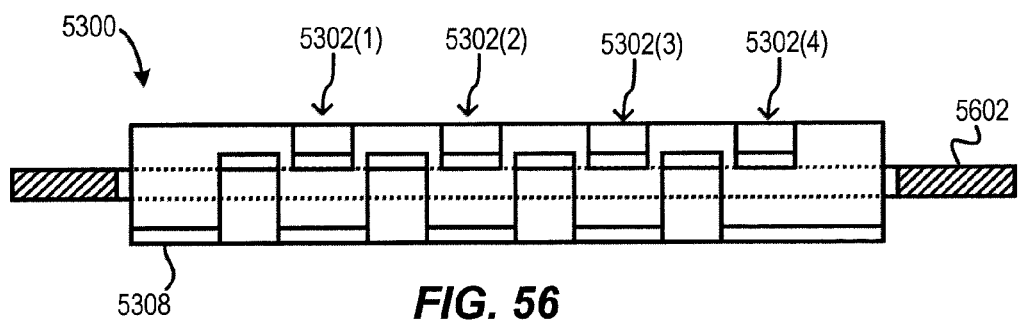
FIG. 56 shows an embodiment of the inductor of FIG. 53 installed in a PCB.

FIG. 56 shows an example of one possible application of inductor 5300. In particular, FIG. 56 is a side cross-sectional view of inductor 5300 installed in an aperture of a PCB 5602. The vertical position of inductor 5300 with respect to PCB 5602 could be varied by changing the dimensions of windings 5302 and structure 5308.

Figure 57:
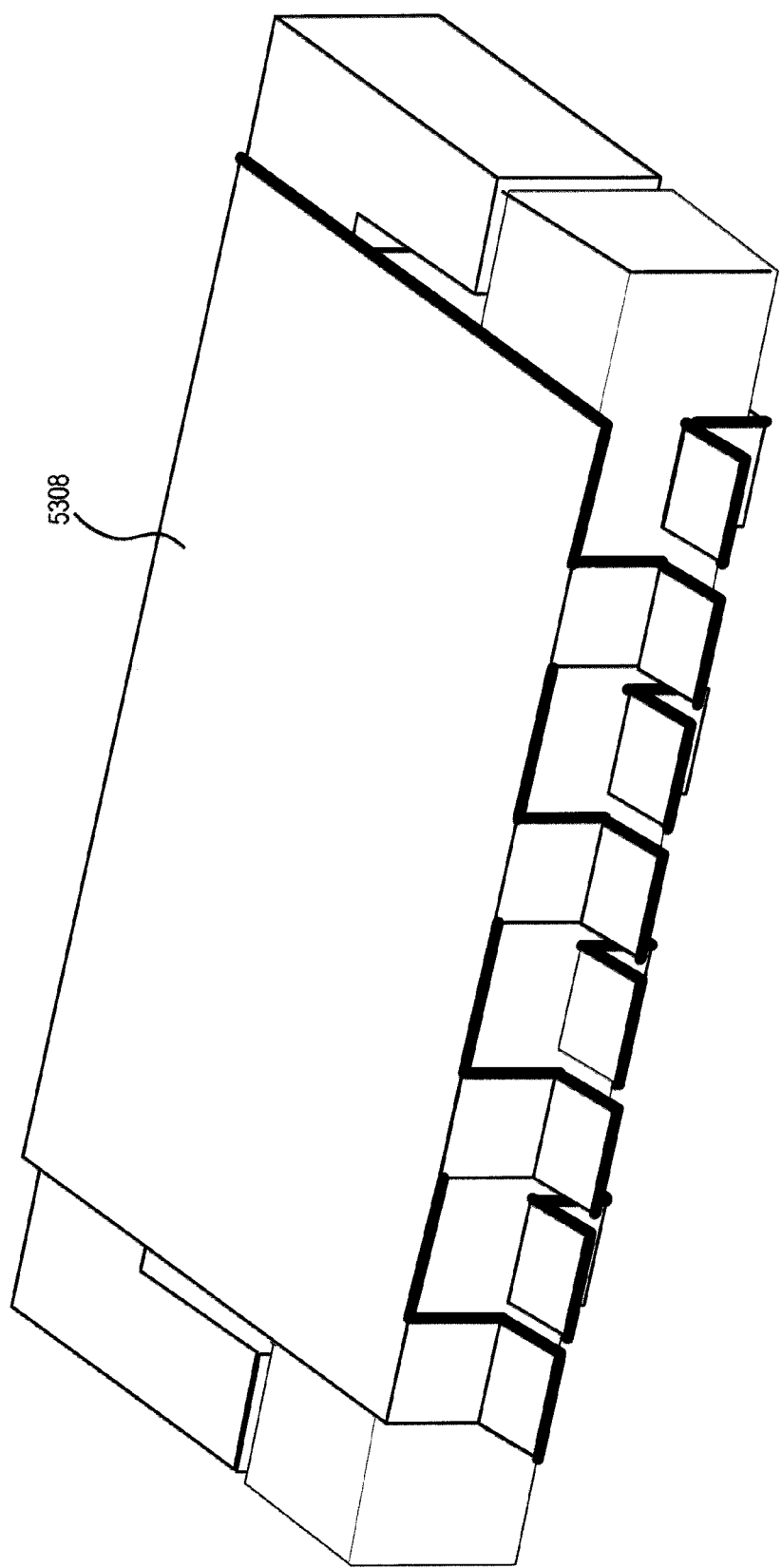
FIG. 57 shows an alternate embodiment of the inductor of FIG. 53.

Although return current structure 5308 is disposed on the bottom side of inductor 5300 in FIGS. 53 and 56, structure 5308 could alternately disposed on the top side of inductor 5300, as shown in FIG. 57. Placing structure 5308 on the top side advantageously offers a flat (or substantially flat) surface to permit pick and place installation of inductor 5300 without a top side label. Placing structure 5308 on the top side of inductor 5300 may also facilitate cooling when there is more air flow on a particular side of the PCB.

Although structure 5308 is shown as a ground current return conductor, it could be modified to carry additional signals. For example, an alternate embodiment of structure 5308 includes two electrically isolated electrical conductors, where one conductor serves as a ground return conductor, and the other conductor serves as a low current power supply conductor (e.g., a conductor for a keep-alive power supply).

Figure 58:
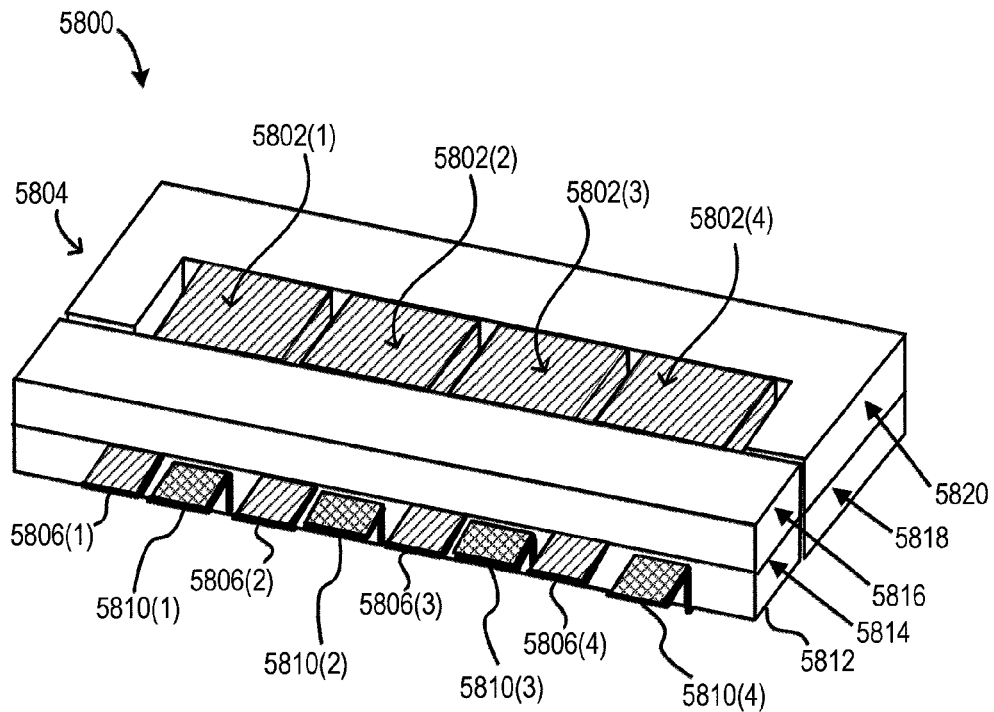
FIG. 58 shows a top perspective view of one N-winding coupled inductor including a ground return structure, according to an embodiment.
Figure 59:
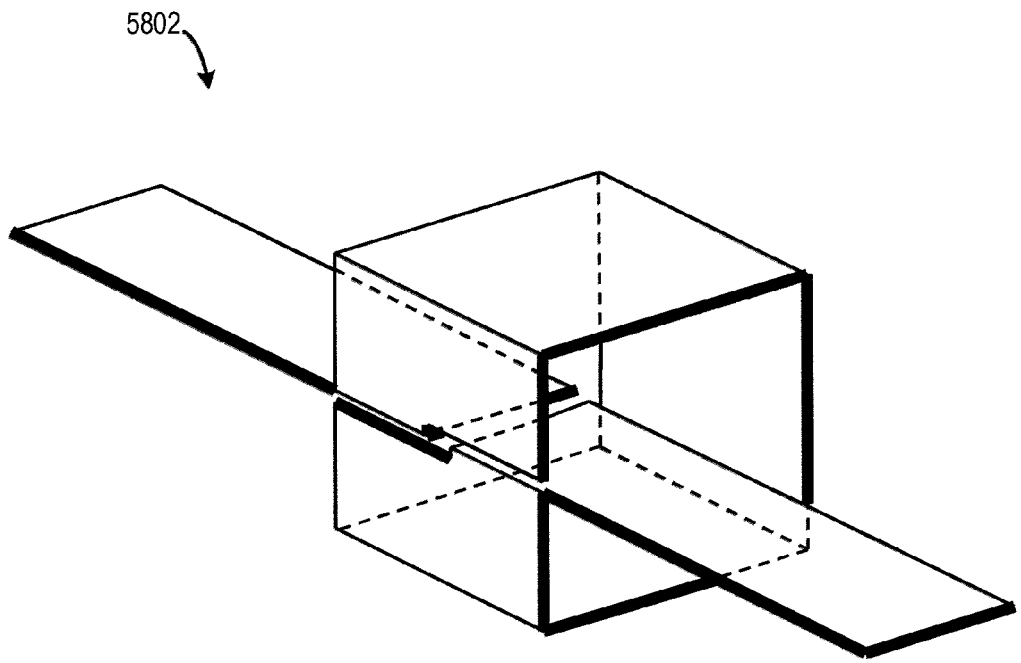
FIG. 59 shows a top perspective view of one winding of the inductor of FIG. 58.

FIG. 58 shows a top perspective view of one drop-in N-winding coupled inductor 5800, where N is an integer greater than one. Inductor 5800 is similar to inductor 5300 (FIG. 53); however windings 5802 of inductor 5800 have a shorter length and thus a lower resistance than windings 5302 of inductor 5300. FIG. 59 shows a top perspective view of one winding 5802 which is, for example, symmetrical in order to reduce winding length. Inductor 5800 includes a magnetic core 5804, and a respective solder tab 5806 is electrically coupled to each end of each winding 5802. Similar to inductor 5300, inductor 5800 includes a ground return structure 5808, which, for example, includes several solder tabs 5810. Solder tabs 5806 and 5810 may be formed at the same height relative to a bottom surface 5812 of core 5804 to facilitate surface mount connection of inductor 5800 to a PCB.

Core 5804 is, for example, formed of pairs of corresponding magnetic elements 5814, 5816 and 5818, 5820, as shown in FIG. 58. In such embodiments, solder tabs 5806 extend from spaces between corresponding magnetic elements 5814, 5816 and 5818, 5820. In embodiments where windings 5802 are symmetrical, each of corresponding magnetic elements 5814, 5816 and 5818, 5820 have, for example, an identical shape and size.

Figure 60:
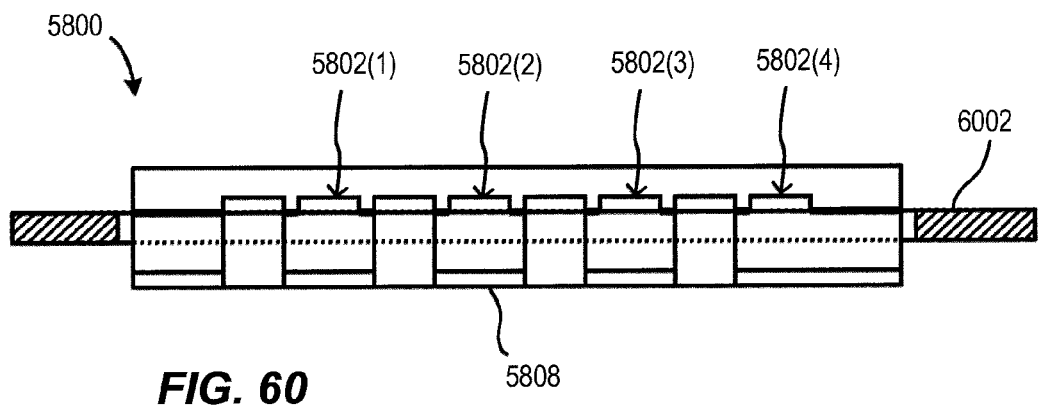
FIG. 60 shows an embodiment of the inductor of FIG. 58 installed in a PCB.
Figure 61:
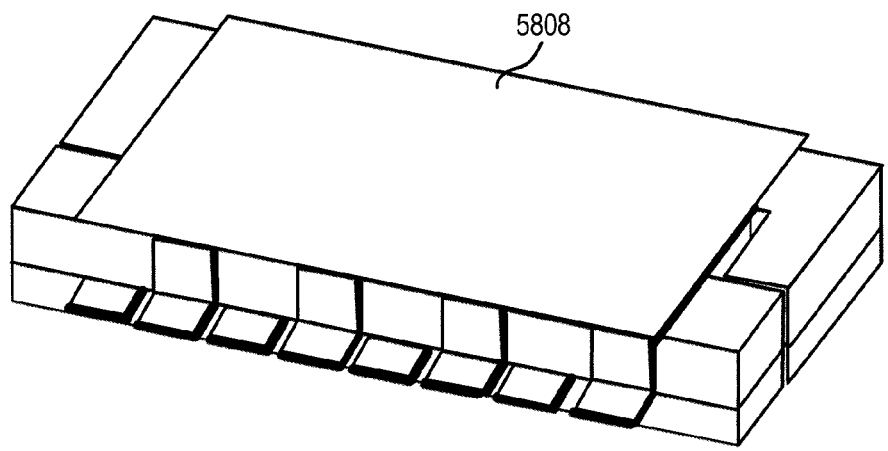
FIG. 61 shows an alternate embodiment of the inductor of FIG. 58.

FIG. 60 shows an example of one possible application of inductor 5800. In particular, FIG. 60 is a side cross-sectional view of inductor 5800 installed in an aperture of a PCB 6002. The vertical position of inductor 5800 with respect to PCB 6002 could be varied by changing the dimensions of windings 5802 and structure 5808. Although ground return structure 5808 is installed on the bottom side of inductor 5800 in FIGS. 58 and 60, structure 5808 could be installed on the top side of inductor 5800, as shown in FIG. 61.

As discussed above, use of prior art drop-in inductors typically results in problems including significantly increased return current path impedance, poor mechanical robustness, and the need to separate multiple instances of the prior art drop-in inductors. However, drop-in inductors with ground return conductors, such as some embodiments of the inductors discussed above, may reduce or eliminate one or more of these problems, as previously discussed. Accordingly, the addition of ground return conductors to drop-in inductors may allow for use of drop-in inductors in applications where prior art drop-in inductors would be impractical. Use of drop-in inductors instead of standard (non drop-in) surface mount inductors may offer a number of advantages, such as the following: (1) reduced inductor height relative to the PCB surface; (2) increased inductor core size and cross section, which helps minimize core loss; (3) reduced PCB surface area required for the inductors; and/or (4) inductor height being closer to that of other power supply components, resulting in improved power supply volume utilization.

Adding one or more ground return conductors to a drop-in inductor may also significantly reduce or eliminate inductance dependence on layout and/or PCB aperture configuration. In particular, adding one or more ground return conductors to a drop-in inductor helps minimize length of the inductor's current loop in output inductor applications, where the current loop is defined by the path current takes when flowing through the inductor to a load, and from the load back by the inductor. Inductance is affected by the current loop's configuration, and increasing the current loop's size generally increases inductance. Accordingly, by minimizing current loop length through use of ground return conductors, current loop length may be significantly or completely unaffected by PCB layout and/or aperture configuration, thereby reducing or eliminating inductance dependence on such application characteristics. In contrast, in the prior art drop-in inductor of FIGS. 39-41, current loop size is significantly dependent on PCB layout and aperture configuration. For example, in the case of prior art inductor 3900 (FIGS. 39-40), inductor 3900's inductance will change if the size of aperture 3902 or the PCB layout around aperture 3902 is changed.

Figure 62:
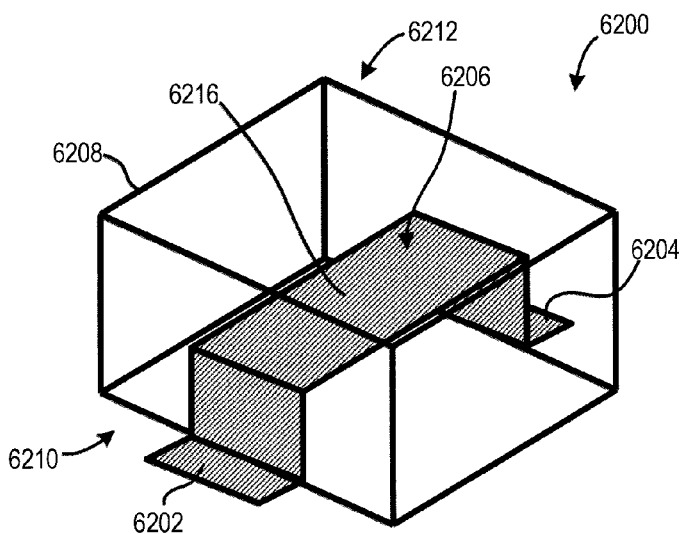
FIGS. 62-64 respectively show a perspective, a side plan, and a top plan view of an inductor including two extended tongues, according to an embodiment.
Figure 63:
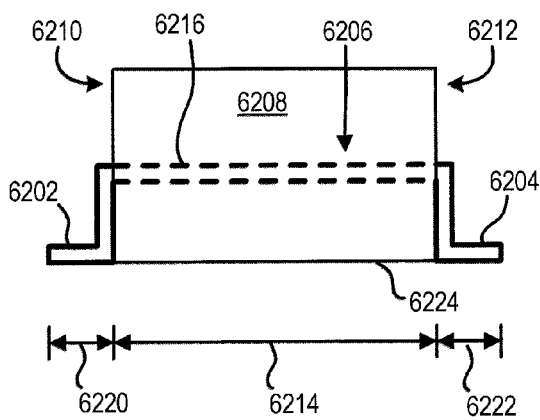
Figure 64:
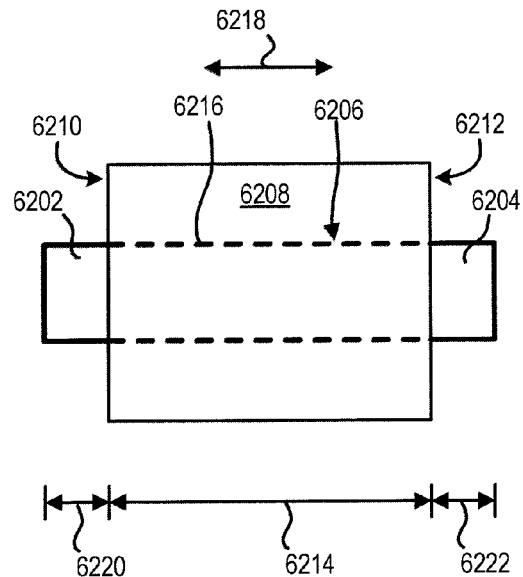

FIGS. 62-64 respectively show a perspective, a side plan, and a top plan view of an inductor 6200. Inductor 6200 is similar to inductor 500 (FIG. 5), but with foil extended input and output tongues 6202, 6204 of at least substantially the same length. Inductor 6200 includes a foil winding 6206 and a core 6208 formed of magnetic material. Core 6208 has a first side 6210 opposite to a second side 6212. A linear separation distance between first and second sides 6210, 6212 of core 6208 defines a length 6214 of core 6208.

Foil winding 6206 includes a core winding portion 6216 wound through core 6208. Extended input and output tongues 6202, 6204 are electrically coupled to opposite respective ends of foil winding 6206. In certain embodiments, input and output tongues 6202, 6204 are each an extension of winding 6206. Input tongue 6202 is at first side 6210 of core 6208 and extends away from core 6208 in a lengthwise direction 6218, and output tongue 6204 is at second side 6212 of core 6208 and extends away from core 6208 in lengthwise direction 6218. Dashed lines indicate the outline of winding 6206 where obscured by core 6208. Extended input and output tongues 6202, 6204, for example, supplement or serve as a substitute for respective foil traces disposed on a surface of a printed circuit board. For example, one or more of input and output tongues 6202, 6204 may be configured for soldering to and extending along respective PCB foil traces.

Extended input tongue 6202 has a length 6220, and extended output tongue 6204 has a length 6222. Length 6220 is at least substantially equal to length 6222. In certain embodiments, each of lengths 6220, 6222 of tongues 6202, 6204 are less than length 6214 of core 6208. Each of tongues 6202, 6204 are formed at a same height relative to a bottom surface 6224 of core 6208 to facilitate surface mount soldering of tongues 6202, 6204 to a PCB.

Figure 65:
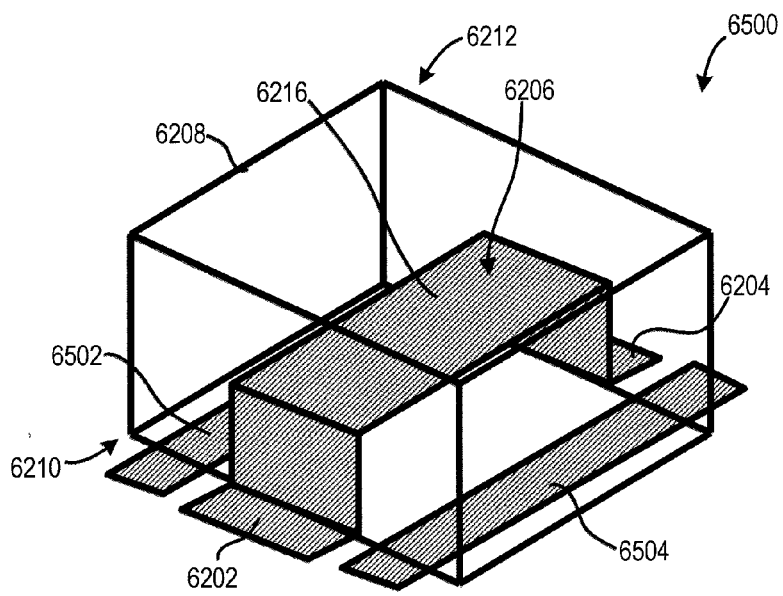
FIGS. 65-67 respectively show a perspective, a side plan, and a top plan view of an embodiment of the inductor of FIGS. 62-64 including ground return conductors.
Figure 66:
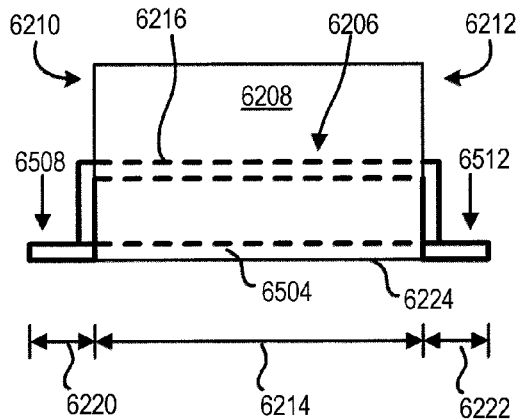
Figure 67:
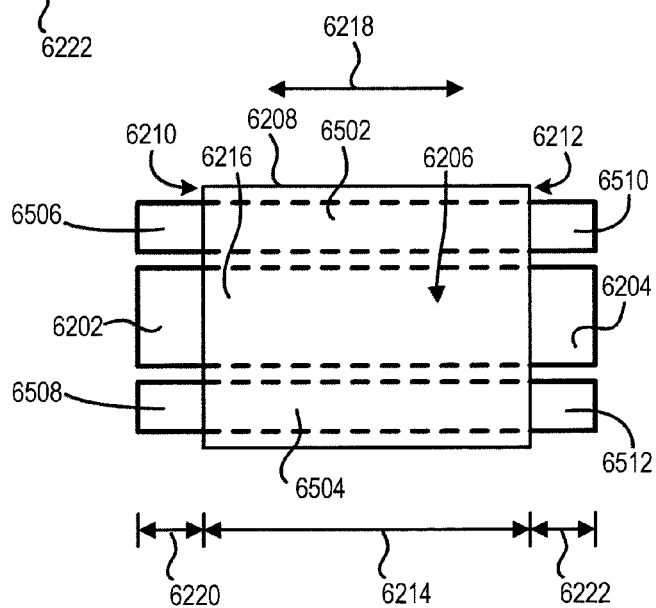

FIGS. 65-67 respectively show a perspective, a side plan, and a top plan view of an inductor 6500, which is an alternate embodiment of inductor 6200 (FIGS. 62-64), and includes two ground return conductors 6502, 6504. Inductor 6500 is similar to inductor 1500 (FIGS. 15-17), but with ground return conductor extensions and extended input and output tongues of at least substantially equal length. Ground return conductors 6502, 6504 attach to bottom surface 6224 of core 6208, and core 6208 does not form a magnetic path loop around ground return conductors 6502, 6504. Accordingly, inductance of ground return conductors 6502, 6504 is not significantly increased by presence of core 6208, while inductance of winding 6206 is increased by presence of core 6208, relative to an otherwise identical inductor without core 6208. As can be seen in FIGS. 65 and 67, ground return conductors 6502, 6504 are each adjacent foil winding 6206 in lengthwise direction 6218.

Both of ground return conductors 6502, 6504 include a respective first extension 6506, 6508 at first side 6210 of core 6208 and extending away from core 6208 in lengthwise direction 6218. Similarly, both of ground return conductors 6502, 6504 include a respective second extension 6510, 6512 at second side 6212 of core 6208 and extending away from core 6208 in lengthwise direction 6218. Each extension 6506, 6508, 6510, 6512, as well as extended input and output tongues 6202, 6204, are formed at a same height relative to bottom surface 6224 of core 6208 to facilitate surface mount soldering to a PCB. Each first extension 6506, 6508 has the same length 6220 as extended input tongue 6202, and each second extension 6510, 6512 has the same length 6222 as extended output tongue 6204. As discussed above, each of extended input and output tongues 6202, 6204 has the same length, and each extension 6506, 6508, 6510, 6512 therefore has the same length as each tongue.

Figure 68:
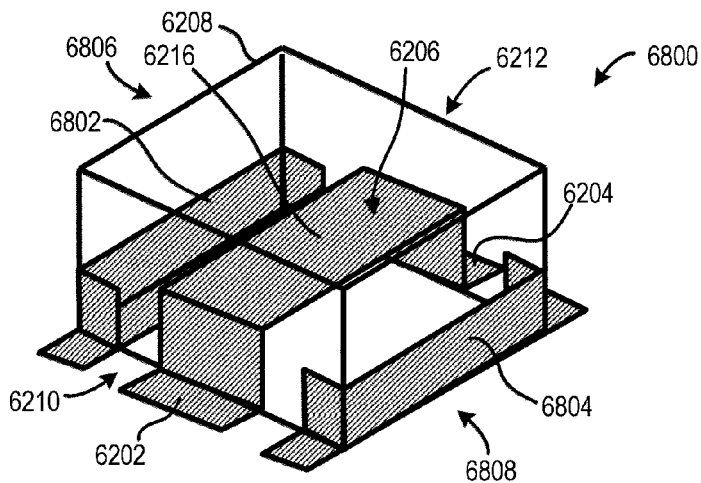
FIG. 68 shows a perspective view of an inductor similar to the inductor FIGS. 65-67, according to an embodiment.

FIG. 68 shows a perspective view of an inductor 6800, which is similar to inductor 6500 (FIGS. 65-67), but with an alternative ground return conductor configuration. Inductor 6800 includes ground return conductors 6802, 6804, which are similar to the ground return conductors of inductor 6500, but extend up at least partially along sides 6210, 6212, 6806, 6808 of core 6208, as shown in FIG. 68. Such extensions of ground return conductors 6802, 6804 along sides of core 6208 advantageously promote mechanical robustness of inductor 6800 and also increase the effective cross sectional area of ground return conductors 6802, 6804. Increased ground return conductor 6802, 6804 cross sectional area promotes low impedance of the ground return conductors, as well as cooling of inductor 6800 and a PCB in contact with inductor 6800. Furthermore, the portions of ground return conductors 6802, 6804 that extend along sides of core 6208 are exposed (i.e., do not contact a PCB) in typical applications, and therefore are particularly effective in cooling inductor 6800.

Figure 69:
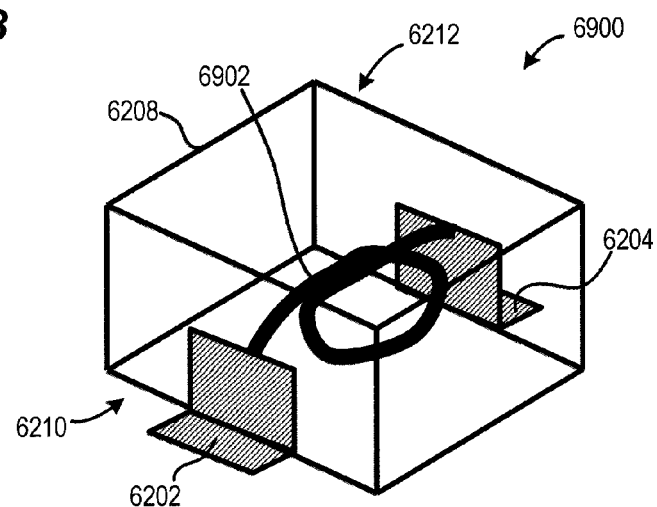
FIG. 69 shows a perspective view of an inductor similar to the inductor of FIGS. 62-64, according to an embodiment.
Figure 70:
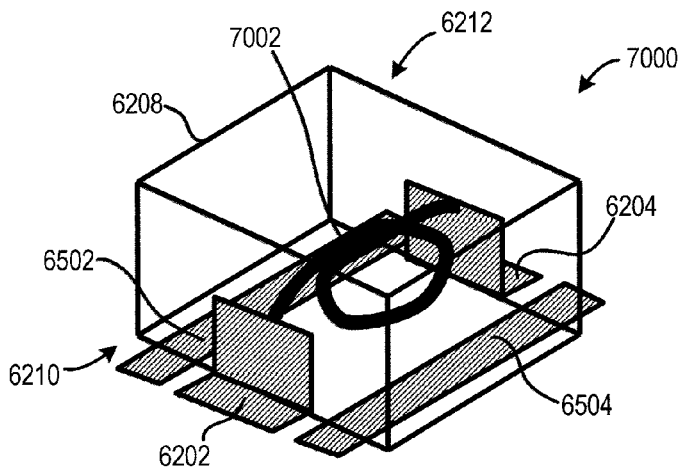
FIG. 70 shows a perspective view of another inductor similar to the inductor of FIGS. 65-67, according to an embodiment.

In certain embodiments of the inductors disclosed herein, the core is formed of a powder magnetic material, such as powdered iron within a binder, and the one or more windings are at least partially embedded in the core. For example, FIG. 69 shows a perspective view of inductor 6900, which is similar to inductor 6200 (FIGS. 62-64), but with foil core winding portion 6216 replaced with a wire core winding portion 6902 embedded in core 6208. As another example, FIG. 70 shows a perspective view of inductor 7000, which is similar to inductor 6500 (FIGS. 65-67), but with foil core winding portion 6216 replaced with a wire core winding portion 7002 embedded in core 6208.

Figure 72:
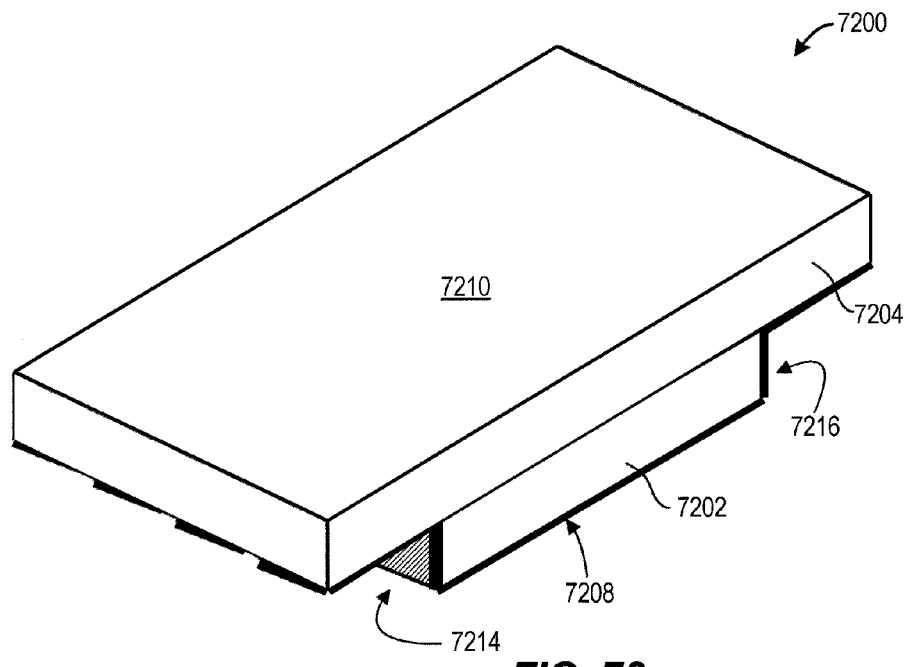
FIG. 72 shows a perspective view of a drop-in coupled inductor, according to an embodiment.
Figure 73:
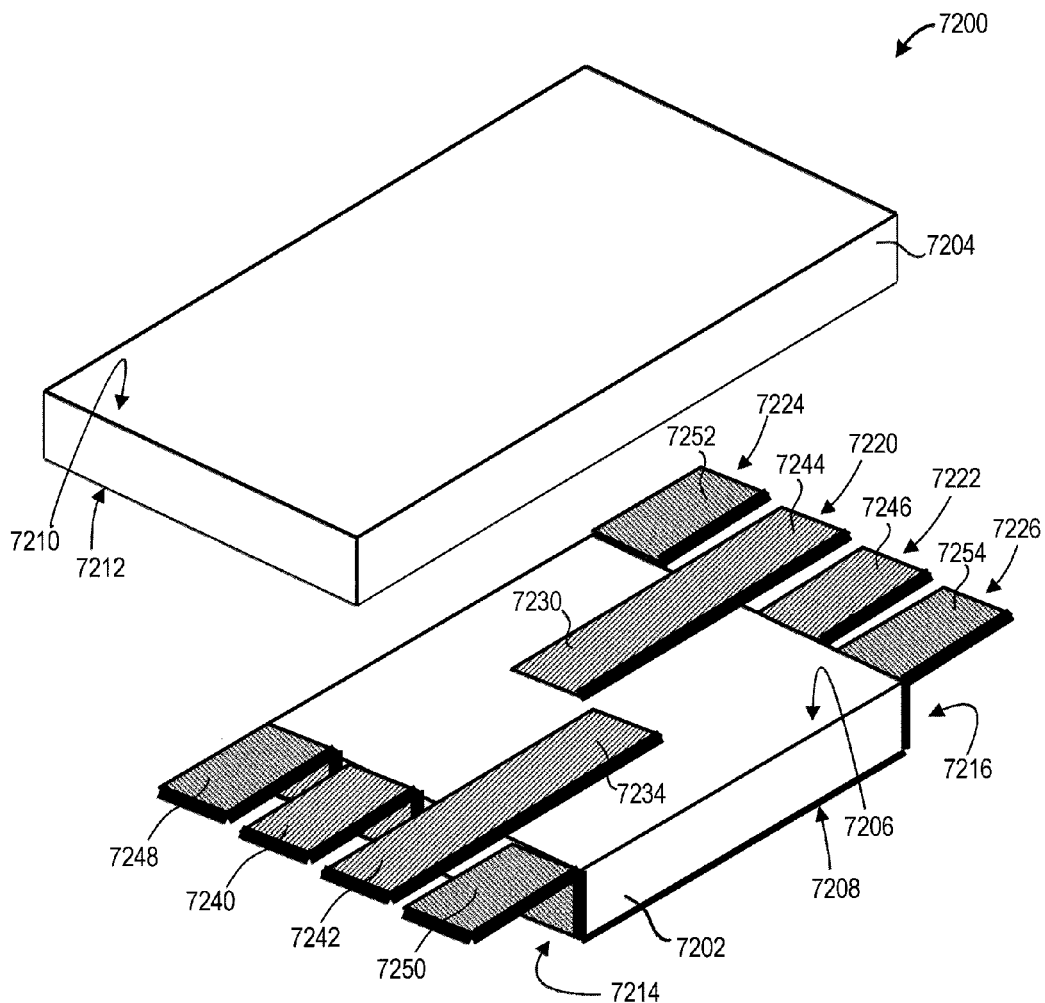
FIG. 73 shows the inductor of FIG. 72 with its leakage plate separated from the remainder of the inductor.
Figure 74:
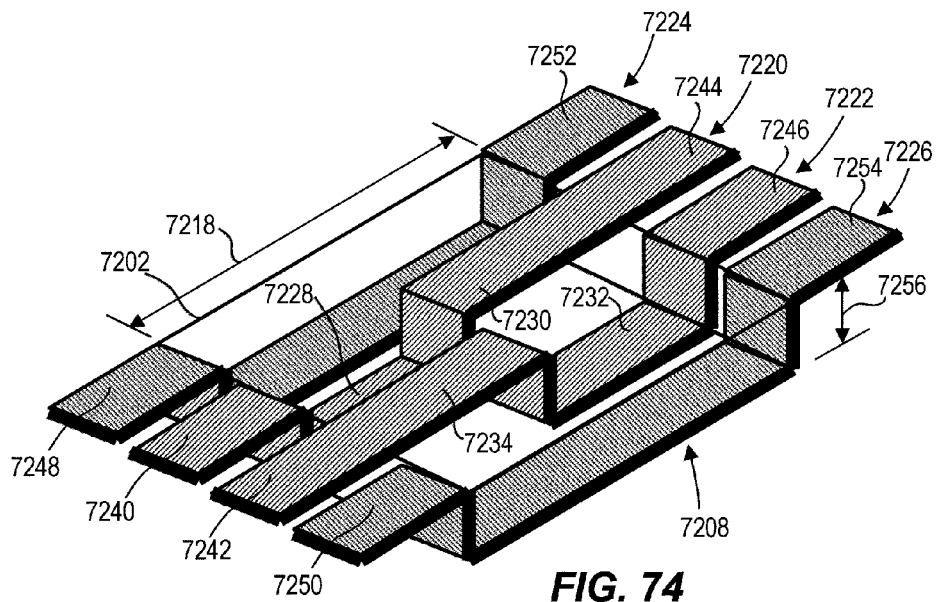
FIG. 74 shows the core of the FIG. 72 inductor as transparent.

FIG. 72 shows a drop-in coupled inductor 7200 including a core 7202 formed of a magnetic material and a leakage plate 7204 formed of a magnetic material. FIG. 73 shows inductor 7200 with leakage plate 7204 separated from the remainder of the inductor, and FIG. 74 shows core 7202 as transparent.

Core 7202 has opposing top and bottom surfaces 7206, 7208, and leakage plate 7204 has opposing top and bottom surfaces 7210, 7212 (see FIG. 73). Core 7202 further includes opposing first and second sides 7214, 7216, each generally perpendicular to core top and bottom surfaces 7206, 7208 and separated by a linear separation distance 7218 (see FIG. 74). Leakage plate 7204 is disposed on core 7202 such that leakage plate bottom surface 7212 faces core top surface 7206. As discussed below, there is typically a slight separation between core 7202 and leakage plate 7204 to set and control inductance values.

Figure 75:
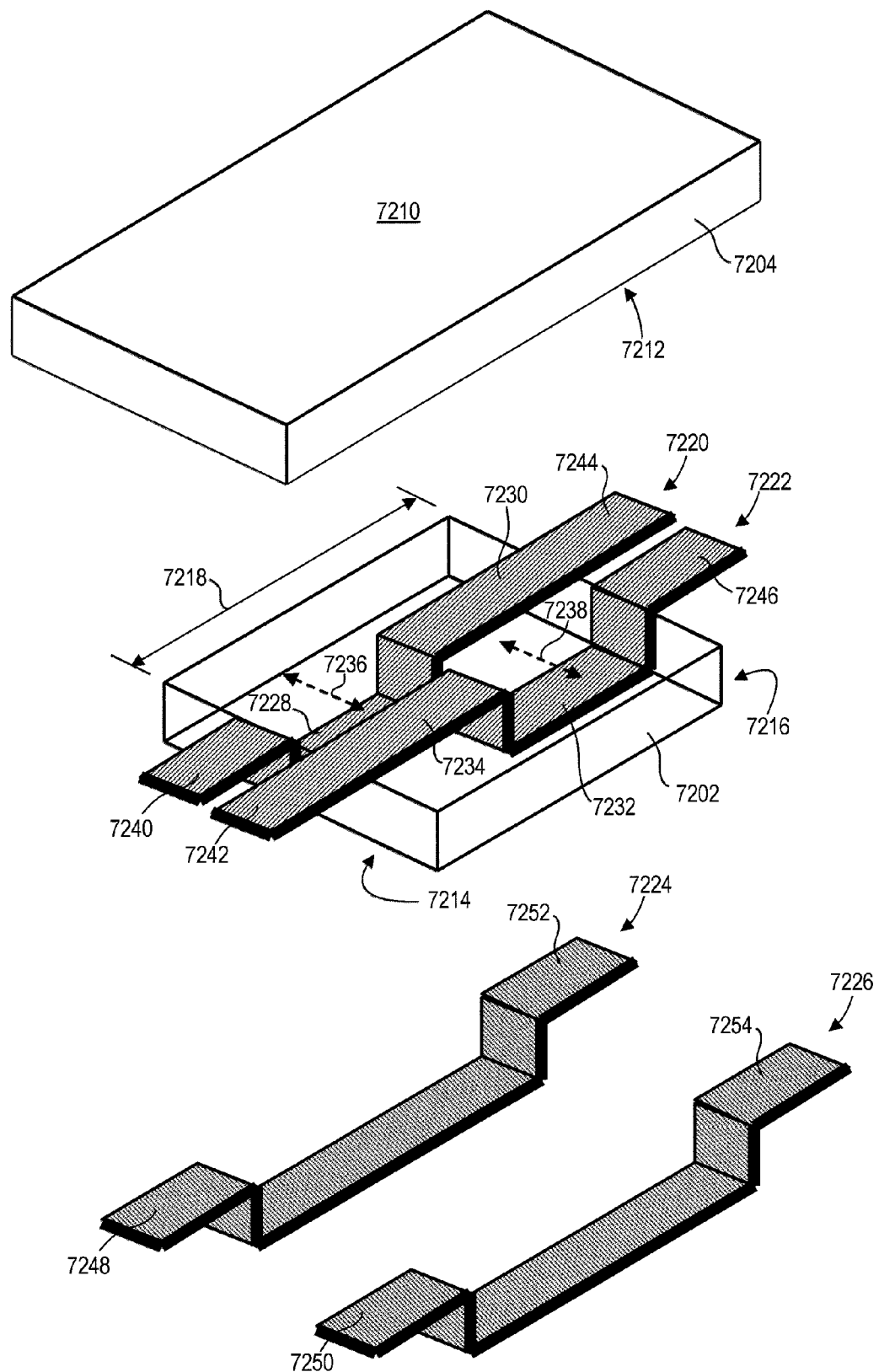
FIG. 75 shows an exploded perspective view of the FIG. 72 inductor, with its leakage plate and ground return conductors separated from the remainder of the inductor.
Figure 76:
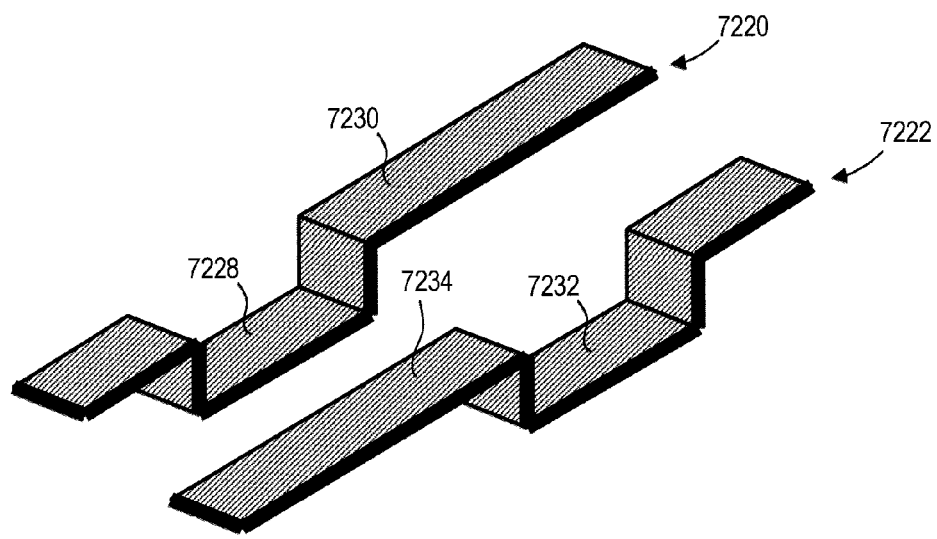
FIG. 76 shows a perspective view of the windings of the FIG. 72 inductor.

Drop-in coupled inductor 7200 further includes first and second windings 7220, 7222 and first and second ground return conductors 7224, 7226. FIG. 75 shows an exploded perspective view of inductor 7200, with leakage plate 7204 and ground return conductors 7224, 7226 separated from the remainder of inductor 7200, and with core 7202 shown as transparent. FIG. 76 shows a perspective view of windings 7220, 7222.

First winding 7220 is wound through core 7202 with portions 7228, 7230 alternately disposed on core bottom and top surfaces 7208, 7206. Second winding 7222 is also wound through core 7202, but with portions 7232, 7234 alternately disposed on core bottom and top surfaces 7208, 7206 in a manner opposite to that of first winding 7220. In particular, first and second portions 7228, 7230 of first winding 7220 are disposed on core bottom and top surfaces 7208, 7206, respectively, while first and second portions 7232, 7234 of second winding 7222 are disposed on core bottom and top surfaces 7208, 7206, respectively. Thus, first portion 7228 is immediately adjacent to second portion 7234 in the lengthwise 7218 direction, and second portion 7230 is immediately adjacent to first portion 7232 in the lengthwise 7218 direction. Accordingly, each winding 7220, 7222 is wound around a respective winding axis 7236, 7238 extending through core 7202, where axes 7236, 7238 are offset and are substantially parallel (see FIG. 75).

Inductor 7200's configuration causes windings 7220, 7222 to have "inverse" or "reverse" magnetic coupling. Such magnetic coupling is characterized, for example, by current of increasing magnitude flowing into first winding 7220 from core first side 7214 inducing a current of increasing magnitude flowing into second winding 7222 from core first side 7214. In other words, current of increasing magnitude flowing through first winding 7220 from core first side 7214 to core second side 7216 induces current of increasing magnitude flowing through second winding 7222 from core first side 7214 to core second side 7216.

Ground return conductors 7224, 7226 are disposed on core bottom surface 7208 and wrap around core sides 7214, 7216. Neither core 7202 nor leakage plate 7204 forms a magnetic path loop around ground return conductors 7224, 7226. Accordingly, inductance of ground return conductors 7224, 7226 is not significantly increased by presence of core 7202 and leakage plate 7204, while inductance of windings 7220, 7222 is significantly increased by presence of core 7202 and leakage plate 7204, relative to an otherwise identical inductor without the core and leakage plate. Although it is anticipated that ground return conductors 7224, 7226 will typically carry return current from a load back to an electric power source, one or more of ground return conductors 7224, 7226 could be used for another purpose, such as to electrically couple a load to an auxiliary electric power source.

Each of first and second windings 7220, 7222 has opposing first and second ends respectively forming a first solder tab 7240, 7242 and a second solder tab 7244, 7246. Each first solder tab 7240, 7242 is disposed at core first side 7214 and extends away from core 7202 in the lengthwise 7218 direction. Each second solder tab 7244, 7246, on the other hand, is disposed at core second side 7216 and extends way from core 7202 in the lengthwise 7218 direction. Each of first and second ground return conductors 7224, 7226 has opposing first and second ends respectively forming a first ground return solder tab 7248, 7250 and a second ground return solder tab 7252, 7254. Each first ground return solder tab 7248, 7250 is disposed at core first side 7214, and each second ground return solder tab 7252, 7254 is disposed at core second side 7216. In some embodiments, ground return solder tabs 7248, 7250, 7252, 7254 extend away from core 7202 in the lengthwise 7218 direction, as shown in FIGS. 73-75.

Although each solder tab 7240-7254 is shown as having the same configuration, two or more solder tab instances could have different configurations. For example, in an alternate embodiment, first solder tabs 7240, 7242 are longer than second solder tabs 7244, 7246. Each solder tab 7240-7254 is offset by a common distance 7256 from core bottom surface 7208 (see FIG. 74). In other words, each solder tab 7240-7254 is disposed in a common plane between core bottom surface 7208 and leakage plate top surface 7210 to facilitate use of inductor 7200 as a drop-in inductor in a PCB aperture.

Figure 71:
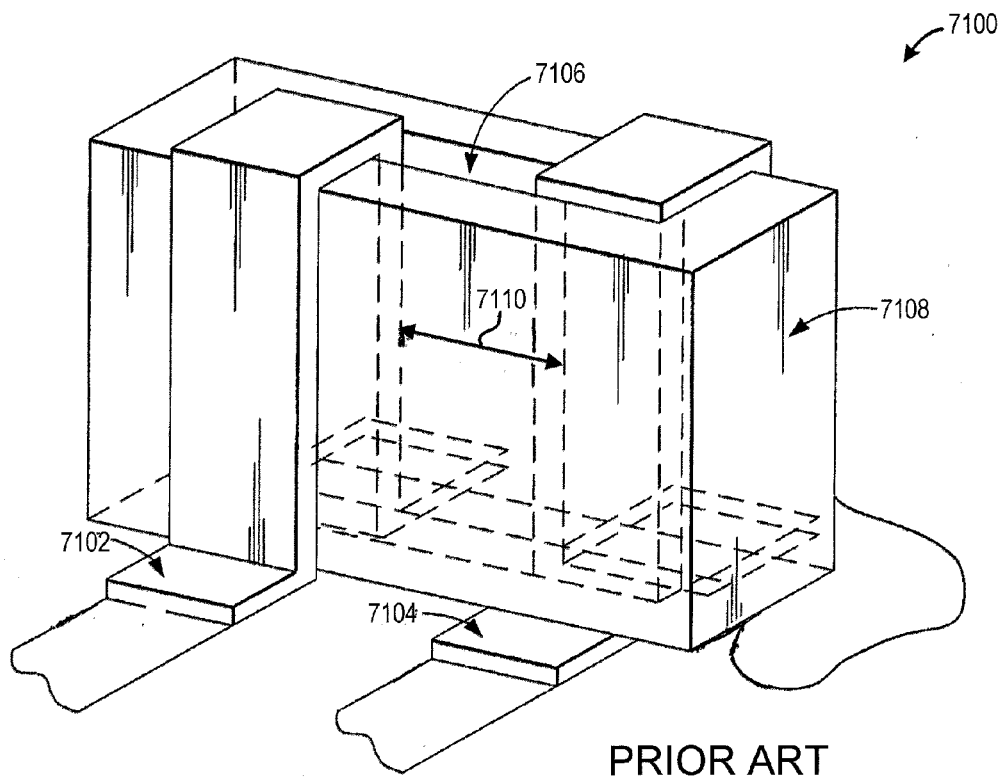
FIG. 71 shows a perspective view of a PRIOR ART coupled inductor.

Leakage plate 7204 provides a path for leakage magnetic flux, which is flux generated by current flowing through one of windings 7220, 7222 that does not link the other of windings 7220, 7222. Thus, leakage plate 7204 boosts leakage inductance associated with windings 7220, 7222, thereby allowing windings 7220, 7222 to be placed very close together in core 7202, while still achieving relatively large leakage inductance values. Placement of windings 7220, 7222 close together, in turn, promotes small inductor foot print size. In prior art coupled inductor 7100 (FIG. 71), in contrast, a non-negligible separation distance 7110 typically separates windings 7102, 7104 to achieve sufficiently large leakage inductance values.

Leakage inductance values can be adjusted during inductor design and/or construction without adjusting winding configuration and/or placement by varying the separation distance between leakage plate 7204 and core 7202. Leakage inductance is approximately inversely proportional to spacing between core 7202 and leakage plate 7204, and these two magnetic elements are typically separated from each other by winding portions 7230, 7234 and/or by an air gap. A non-magnetic spacer (not shown), such as a paper, plastic, or adhesive, is optionally disposed between leakage plate 7204 and core 7202 to increase their separation distance.

Figure 77:
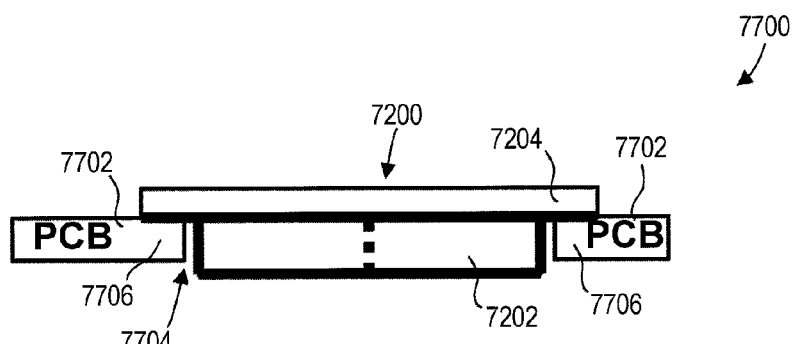
FIG. 77 shows a cross-sectional view of a printed circuit assembly including the inductor of FIG. 72, according to an embodiment.

Leakage plate 7204 optionally extends over some or all of solder tabs 7240-7254, such that the solder tabs extend along leakage plate bottom surface 7212. Such configuration promotes solder tab planarity and strong mechanical coupling of inductor 7200 to a PCB. For example, FIG. 77 shows a cross-sectional view of a printed circuit assembly 7700 including drop-in coupled inductor 7200 installed in a PCB 7702 aperture 7704. Leakage plate 7204 overlaps PCB portions 7706, thereby promoting strong mechanical coupling of inductor 7200 to PCB 7702 and assembly 7700 mechanical robustness.

Figure 78:
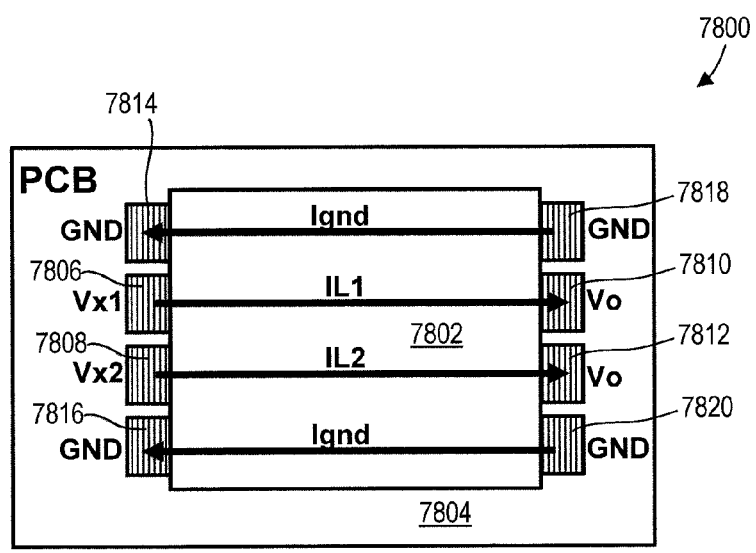
FIG. 78 shows one possible PCB footprint for use with the inductor of FIG. 72, according to an embodiment.

FIG. 78 shows a PCB footprint 7800, which is one possible footprint for use with inductor 7200 in a multi-phase buck converter application, such as in a converter having a schematic similar to that of FIG. 2. In this embodiment, inductor 7200 installs in an aperture 7802 of a PCB 7804. Solder tabs 7240-7254 respectively couple PCB pads 7806-7820. Not shown in FIG. 78 are buck converter switching devices electrically coupled to switching nodes Vx and a load electrically coupled to output node Vo. As shown by arrows IL1 and IL2, windings 7220, 7222 provide a path for current from an electrical power source, which is modulated by the buck converter switching devices, to a load. On the other hand, ground return conductors 7224, 7226 provide a path for return current from the load back to the electric power source, as shown by arrows Ignd. Inductor 7200 is not limited to use with footprint 7800 or in multi-phase buck converter applications. For example, inductor 7200 could be used in other topologies such as boost converters and buck-boost converters.

Figure 79:
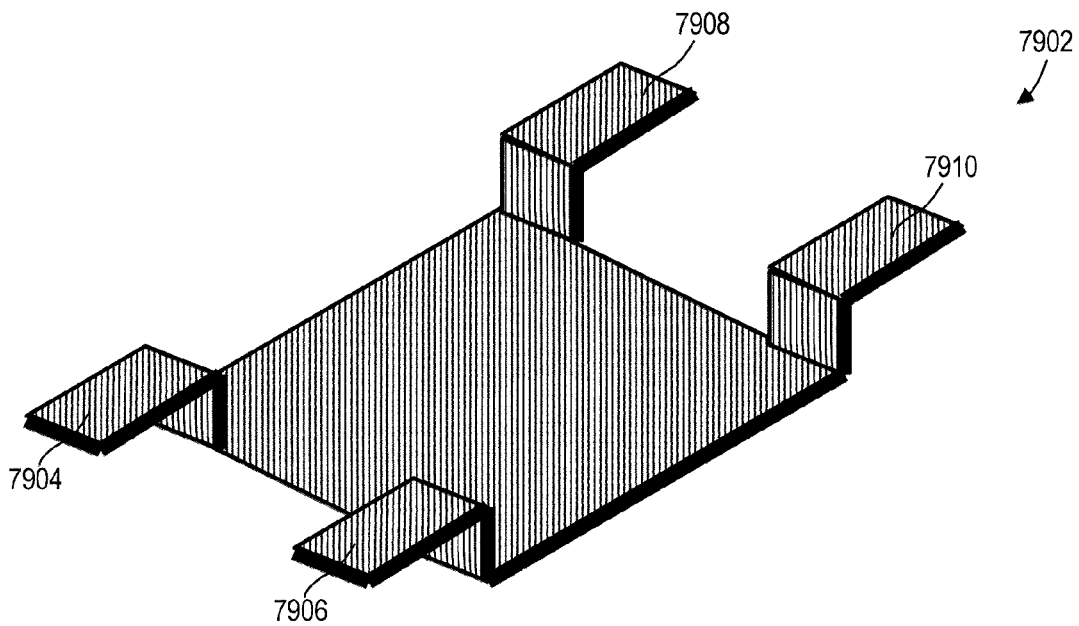
FIG. 79 shows a perspective view of an alternative ground return conductor, according to an embodiment.
Figure 80:
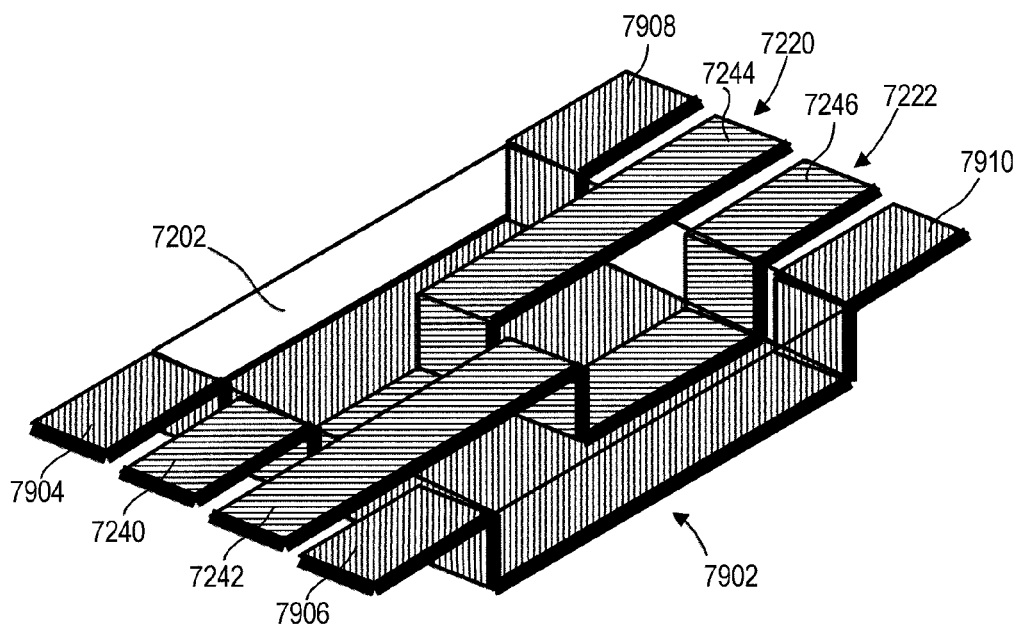
FIG. 80 shows a perspective view of the FIG. 72 inductor's core with the alternative ground return conductor of FIG. 79, according to an embodiment.

In some alternate embodiments, first and second ground return conductors 7224, 7226 are substituted with a single ground return conductor. For example, FIG. 79 shows a ground return conductor 7902, which is used in place of ground return conductors 7224, 7226 in certain alternate embodiments. Opposing first and second ends of ground return conductor 7902 respectively form first ground return solder tabs 7904, 7906 and second ground return solder tabs 7908, 7910. FIG. 80 shows a perspective view of core 7202 shown as transparent and including single ground return conductor 7902, instead of dual ground return conductors 7224, 7226. An insulator (not shown) separates ground return conductor 7902 from windings 7220, 7222 along core bottom surface 7208.

Ground return conductor 7902 substantially covers core bottom surface 7208, thereby acting as a shield. Ground return conductor 7902's large surface area also promotes cooling of inductor 7200 and other components in its vicinity, as well as mechanical robustness of inductor 7200 and an assembly it is installed in. Single ground return conductor 7902 and dual ground return conductors 7224, 7226 could be adapted to work with a common PCB footprint, such as footprint 7800 (FIG. 78), thereby enabling interchangeability of inductors with different ground return conductors.

Figure 81:
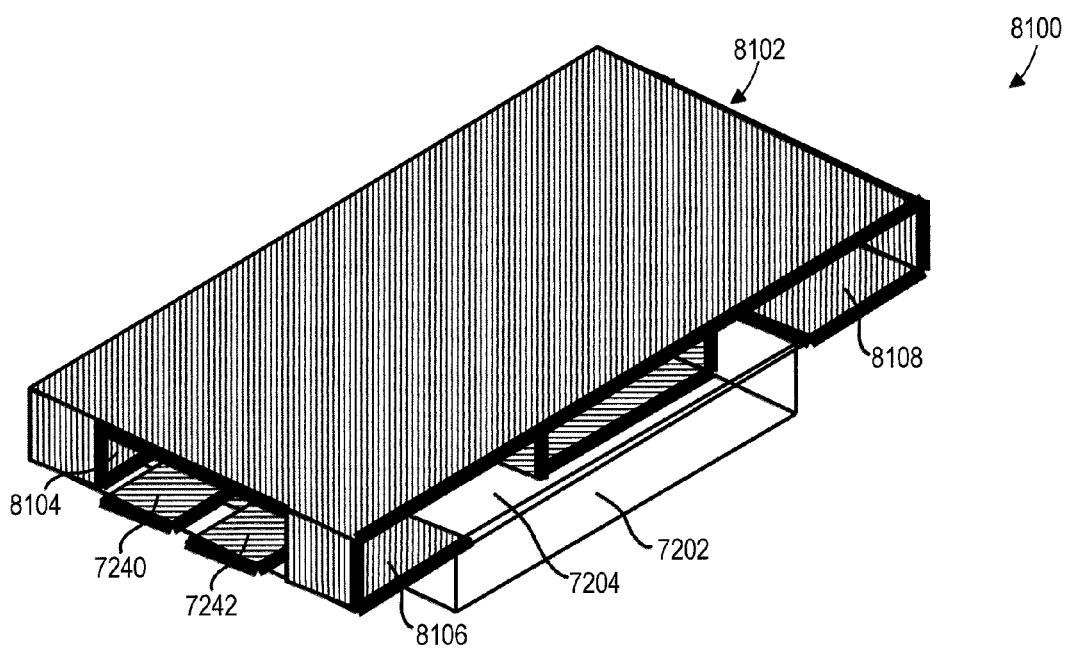
FIG. 81 shows a perspective view of a drop-in coupled inductor with an alternative ground return conductor, according to an embodiment.
Figure 82:
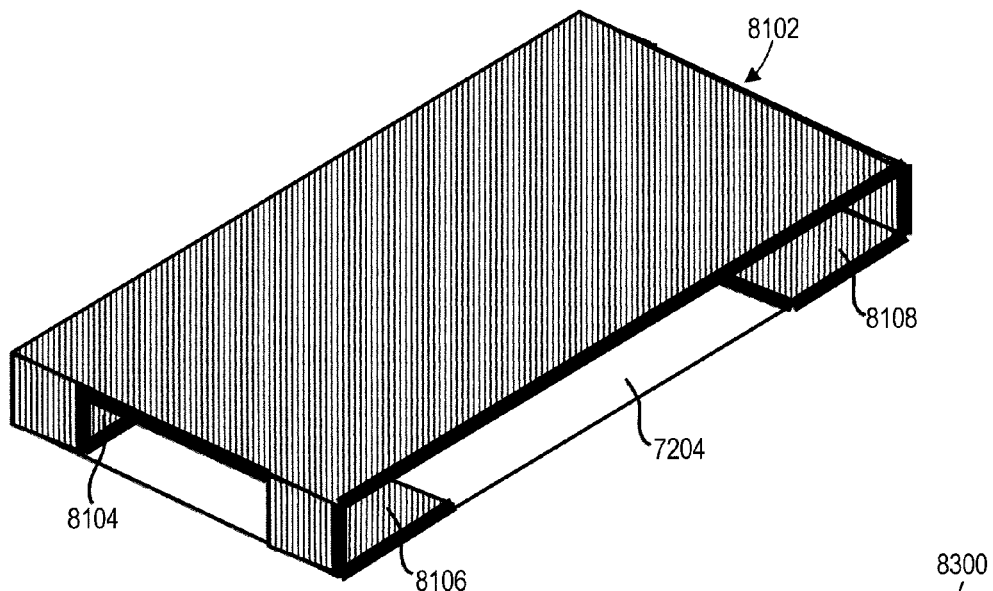
FIG. 82 shows a perspective view of the leakage plate and the ground return conductor of the FIG. 81 inductor.

In some other alternate embodiments, one or more ground return conductors are disposed on leakage plate top surface 7210 as well as on core bottom surface 7208, or on leakage plate top surface 7210 instead of on core bottom surface 7208. For example, FIG. 81 shows a perspective view of a drop-in coupled inductor 8100, which is similar to inductor 7200 (FIG. 72), but with dual ground return conductors 7224, 7226 replaced with a ground return conductor 8102 disposed on leakage plate top surface 7210. Opposing first and second ends of ground return conductor 8102 respectively form first ground return solder tabs 8104, 8106 and second ground return solder tab 8108. Ground return conductor 8102's second end also forms an additional second ground return solder tab that is not visible in the perspective view. FIG. 82 shows leakage plate 7204 and ground return conductor 8102 without the remainder of inductor 8100. Core 7202 and leakage plate 7204 are shown as transparent in FIGS. 81-82.

Ground return conductor 8102 substantially covers leakage plate top surface 7210, thereby providing a low impedance path for return current, for example. The large surface area of ground return conductor 8102 also promotes cooling and mechanical robustness in a manner similar that discussed above with respect to FIGS. 79 and 80. Ground return conductor 8102 could be adapted for footprint compatibility with dual ground return conductors 7224, 7226 (FIGS. 72 and 74) and/or single ground return conductor 7902 (FIG. 79), thereby promoting inductor interchangeability.

Figure 83:
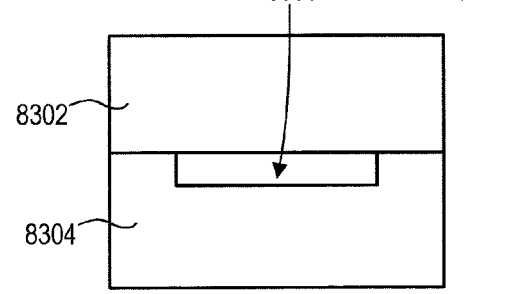
FIG. 83 shows a top plan view of a magnetic core, according to an embodiment.

Core 7202 and leakage plate 7204 may each be single piece magnetic elements as shown, such as single piece ferrite or powdered iron magnetic elements. For example, in some embodiments, core 7202 is formed of powder iron within a binder with first and second windings 7220, 7222 embedded therein. Alternately, one or more of core 7202 and leakage plate 7204 are formed of two or more pieces. For example, FIG. 83 shows a top plan view of a core 8300, which is an embodiment of core 7202 formed of two discrete magnetic elements 8302, 8304 joined together. Discrete magnetic elements 8302, 8304 collectively form a passageway 8306 through which windings 7220, 7222 pass.

Figure 84:
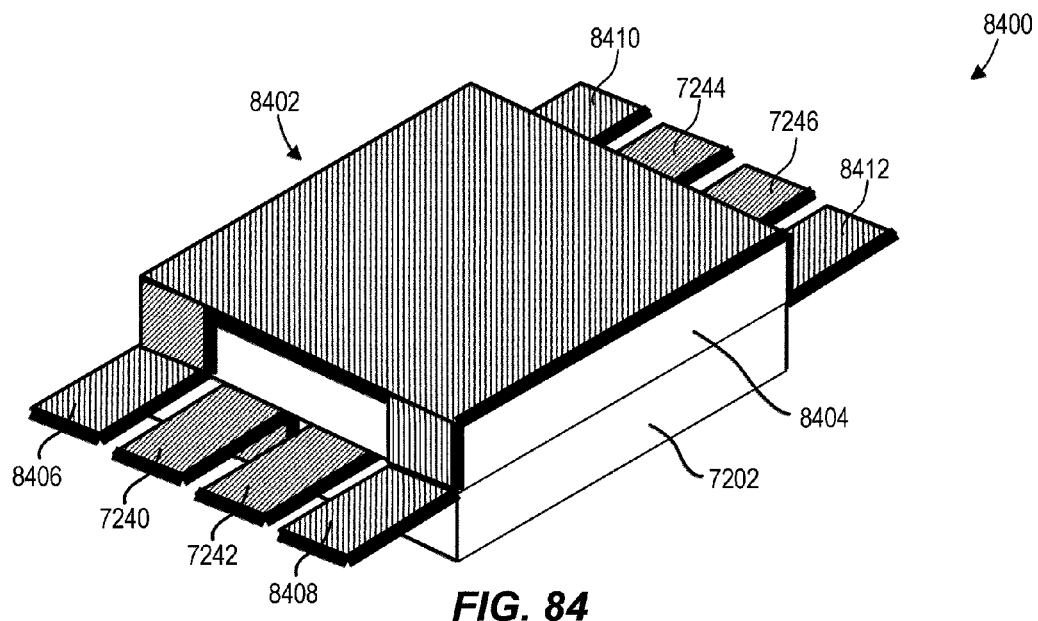
FIG. 84 shows a perspective view of a drop-in coupled inductor similar to that of FIG. 81 but with an alternative leakage plate, according to an embodiment.
Figure 85:
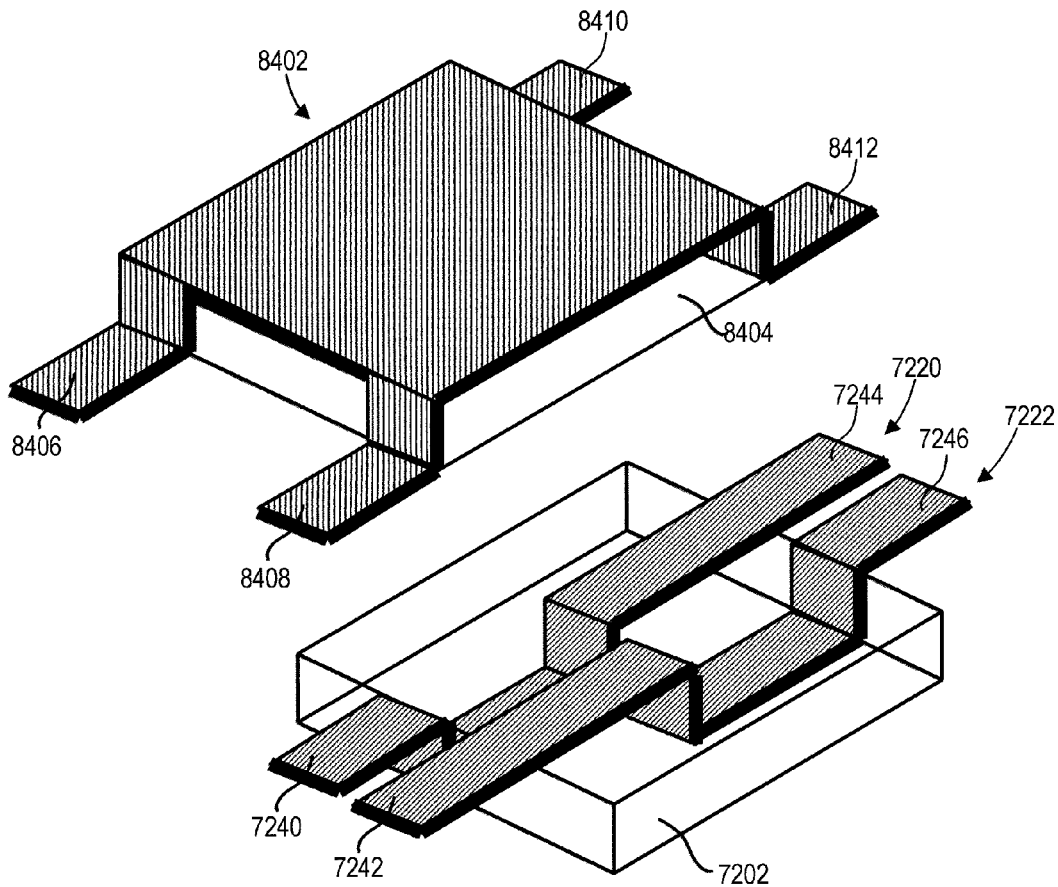
FIG. 85 shows the FIG. 84 inductor with its leakage plate separated from its core.

FIG. 84 shows a perspective view of a drop-in coupled inductor 8400, which is similar to coupled inductor 8100 (FIG. 81), but with leakage plate 7204 and ground return conductor 8102 replaced with a leakage plate 8404 and ground return conductor 8402, respectively. FIG. 85 shows a perspective view of coupled inductor 8400 with leakage plate 8404 separated from core 7202, and with leakage plate 8404 and core 7202 shown as transparent. In contrast to coupled inductor 8100, leakage plate 8402 of coupled inductor 8400 does not extend over winding solder tabs 7240-7246 or ground return solder tabs 8406-8412. Such configuration allows for a smaller leakage plate and ground return conductor than in inductor 8100, assuming all else is equal, thereby promoting material conservation and low cost. The fact that leakage plate 8404 does not extend over the solder tabs enables simultaneous pressing or stamping of both winding solder tabs 7240-7246 and ground return solder tabs 8406-8412, while manufacturing certain embodiments of coupled inductor 8400. In some embodiments, solder tab pressing or stamping is performed while forming other parts of coupled inductor 8400, such as while curing core 7202 and/or leakage plate 8404, thereby promoting manufacturing efficiency.

Figure 86:
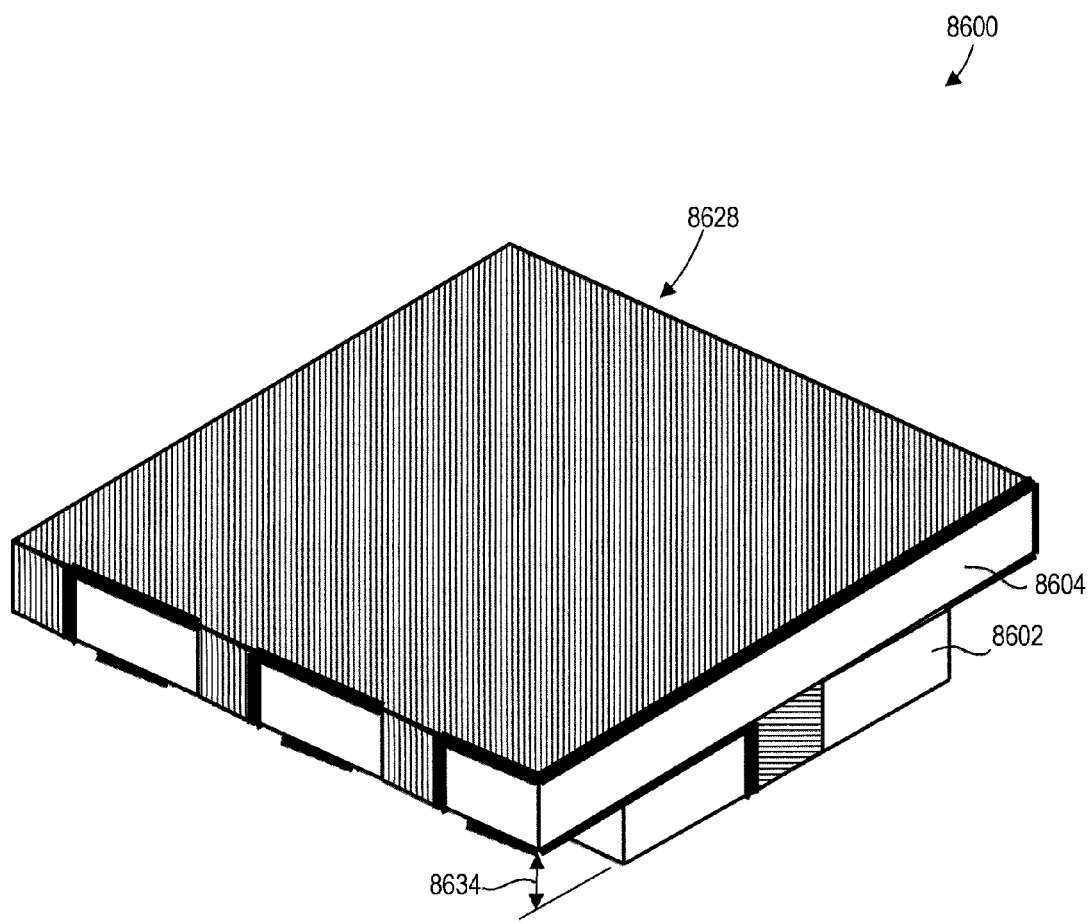
FIG. 86 shows a perspective view of another drop-in coupled inductor, according to an embodiment.

FIG. 86 shows a perspective view of a coupled inductor 8600, which is another drop-in coupled inductor. Inductor 8600 is shown as including three windings, or being a "three-phase" inductor. However, inductor 8600 can be modified to have a different number of windings, and inductor 8600 can thus be adapted to support N phases, where N is an integer greater than one.

Figure 87:
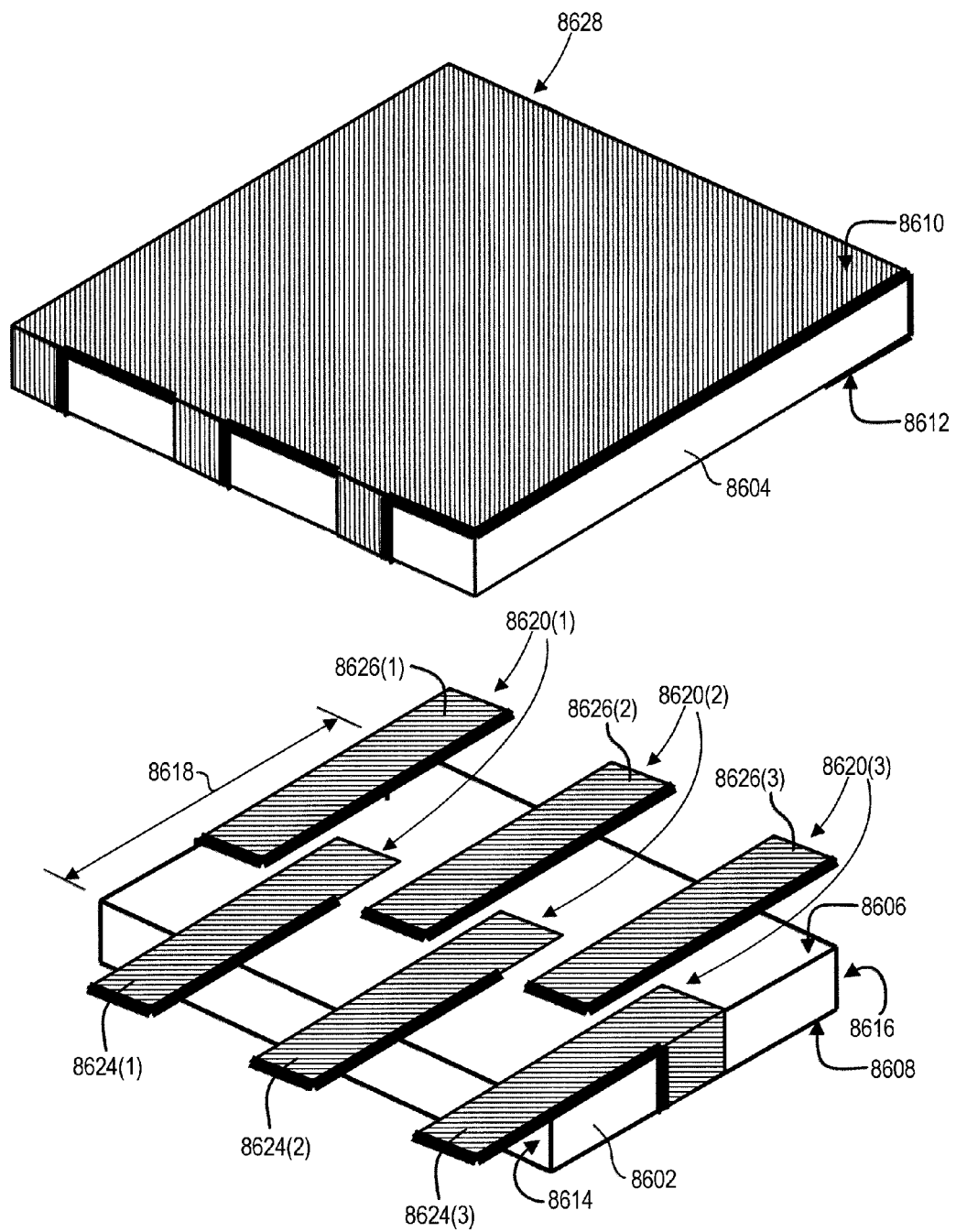
FIG. 87 shows the inductor of FIG. 86 with the leakage plate separated from the core.
Figure 88:
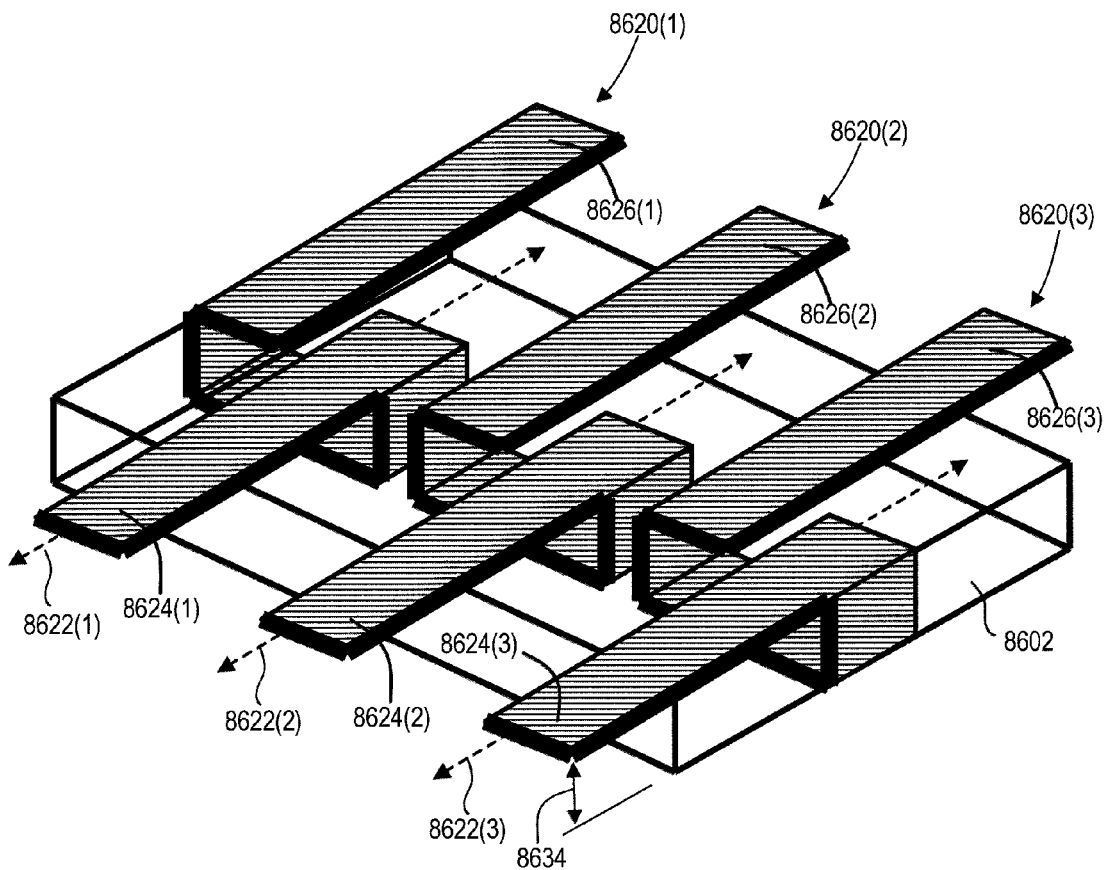
FIG. 88 shows the core of the FIG. 86 inductor as transparent.

Similar to inductor 7200 (FIG. 72), inductor 8600 includes a core 8602 and a leakage plate 8604, each formed of a magnetic material. FIG. 87 shows inductor 8600 with leakage plate 8604 separated from core 8602, and FIG. 88 shows core 8602 as transparent. Core 8602 has opposing top and bottom surfaces 8606, 8608, and leakage plate 8604 has opposing top and bottom surfaces 8610, 8612. Core 8602 includes opposing first and second sides 8614, 8616, separated by a linear separation distance 8618, and each generally perpendicular to core top and bottom surfaces 8606, 8608 (see FIG. 87). Leakage plate 8604 is disposed on core 8602 such that leakage plate bottom surface 8612 faces core top surface 8606. A small separation distance typically separates leakage plate

8604 from core 8602 to boost leakage inductance values, in a manner similar to that discussed above with respect to inductor 7200 (FIG. 72).

Drop-in coupled inductor 8600 includes three windings 8620 wound around a different portion of core 8602. Each winding 8620 is wound around a respective winding axis 8622 extending through core 8602, where winding axes 8622 are offset from each other and are substantially parallel to each other. Opposing first and second ends of each winding 8620 respectively form first and second solder tabs 8624, 8626. Although solder tabs 8624, 8626 are shown as having the same configuration, solder tab configuration may vary among solder tab 8624, 8626 instances. Windings 8620 have inverse or reverse magnetic coupling. Consequentially, current of increasing magnitude flowing into one of windings 8620 from core first side 8614 induces current of increasing magnitude flowing into each other of windings 8620 from core first side 8614. In other words, current of increasing magnitude flowing through one of windings 8620 from core first side 8614 to core second side 8616 induces current of increasing magnitude flowing through the remaining windings 8620 from core first side 8614 to 8616.

Figure 89:
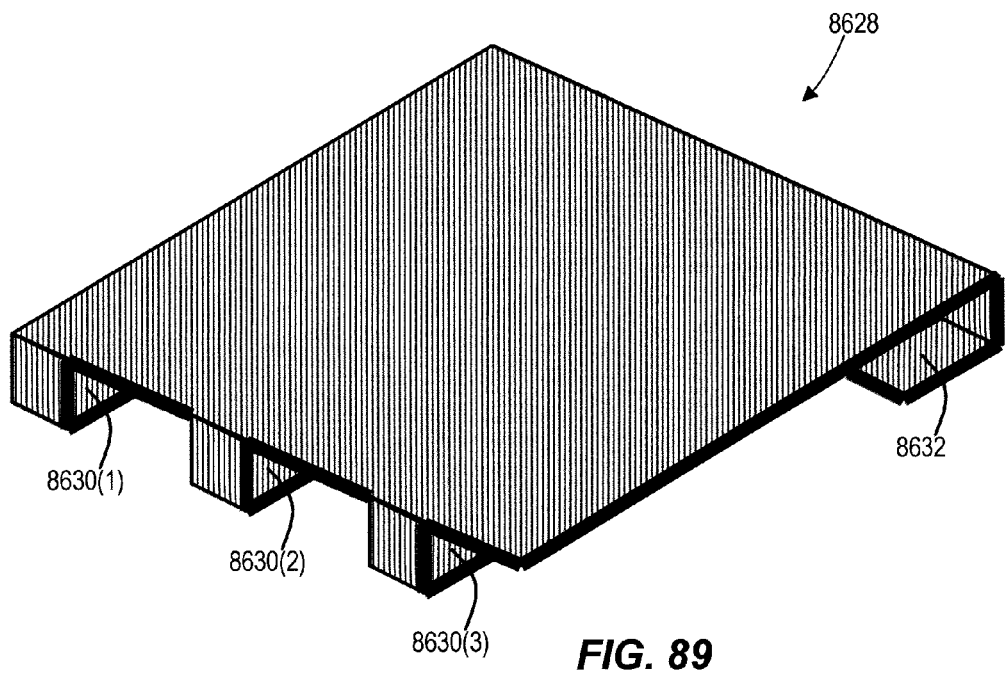
FIG. 89 shows a perspective view of the ground return conductor of the FIG. 86 inductor.

Drop-in coupled inductor 8600 further includes a ground return conductor 8628 disposed on leakage plate top surface 8610 and wrapping around the sides of leakage plate 8604. FIG. 89 shows a perspective view of ground return conductor 8628. Neither core 8602 nor leakage plate 8604 forms a magnetic path loop around ground return conductor 8628. Accordingly, inductance of ground return conductor 8628 is not significantly increased by presence of core 8602 and leakage plate 8604, while inductance of windings 8620 is significantly increased by presence of core 8602 and leakage plate 8604, relative to an otherwise identical inductor without the core and leakage plate. Although it is anticipated that ground return conductor 8628 will typically carry return current from a load back to an electric power source, ground return conductor 8628 could be used for another purpose, such as to electrically couple a load to an auxiliary electric power source.

Opposing first and second ends of ground return conductor 8628 respectively form first and second ground return solder tabs 8630, 8632 (see FIG. 89). First ground return solder tabs 8630 are disposed at core first side 8614, and second ground return solder tabs 8632 are disposed at core second side 8616. Although only a single second ground return solder tab 8632 is visible in the perspective view of FIG. 89, many ground return conductor 8628 embodiments form two or more second ground return solder tabs 8632. Ground return conductor 8628 substantially covers leakage plate top surface 8610, thereby acting as a shield and helping cool inductor 8600 and components in its vicinity. In certain alternate embodiments, single ground return conductor 8628 is replaced with multiple ground return conductors and/or disposed on core bottom surface 8608.

Leakage plate 8604 typically extends over some or all of first and second solder tabs 8624, 8626 and of first and second ground return solder tabs 8630, 8632, thereby promoting solder tab planarity and mechanical robustness. First and second solder tabs 8624, 8626 and first and second ground return solder tabs 8630, 8632 are each offset by a common distance 8634 from core bottom surface 8608 (see FIGS. 86 and 88). In other words, each solder tab 8624, 8626, 8630, 8632 is disposed in a common plane between core bottom surface 8608 and leakage plate top surface 8610 to facilitate use of inductor 8600 as a drop-in inductor in a PCB aperture.

In a manner similar to that discussed above with respect to inductor 7200, leakage plate 8604 provides a path for leakage magnetic flux, which is flux generated by current flowing through one of windings 8620 that does not link the others of windings 8620. Thus, leakage plate 8604 boosts leakage inductance values associated with windings 8620, thereby allowing windings 8620 to be placed close together in core 8602 while still achieving relatively large leakage inductance values.

Leakage inductance values can be adjusted during inductor design and/or construction without adjusting winding configuration and/or placement by varying the separation distance between leakage plate 8604 and core 8602. Leakage inductance is approximately inversely proportional to spacing between core 8602 and leakage plate 8604, and these two magnetic elements are typically separated from each other by portions of windings 8620 and/or by an air gap. A non-magnetic spacer (not shown), such as a paper, plastic, or adhesive, is optionally disposed between leakage plate 8604 and core 8602 to increase their separation distance.

Figure 90:
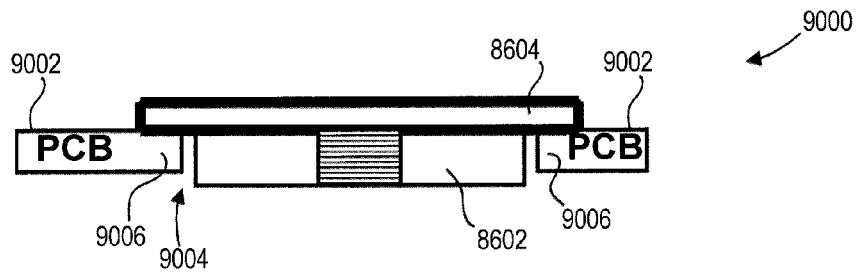
FIG. 90 shows a cross-sectional view of a printed circuit assembly including the inductor of FIG. 86, according to an embodiment.

FIG. 90 shows a cross-sectional view of printed circuit assembly 9000 including drop-in coupled inductor 8600 installed in a PCB 9002 aperture 9004. Leakage plate 8604 overlaps PCB 9002 portions 9006, thereby promoting strong mechanical coupling of inductor 8600 to PCB 9002 and mechanical robustness of assembly 9000.

Figure 91:
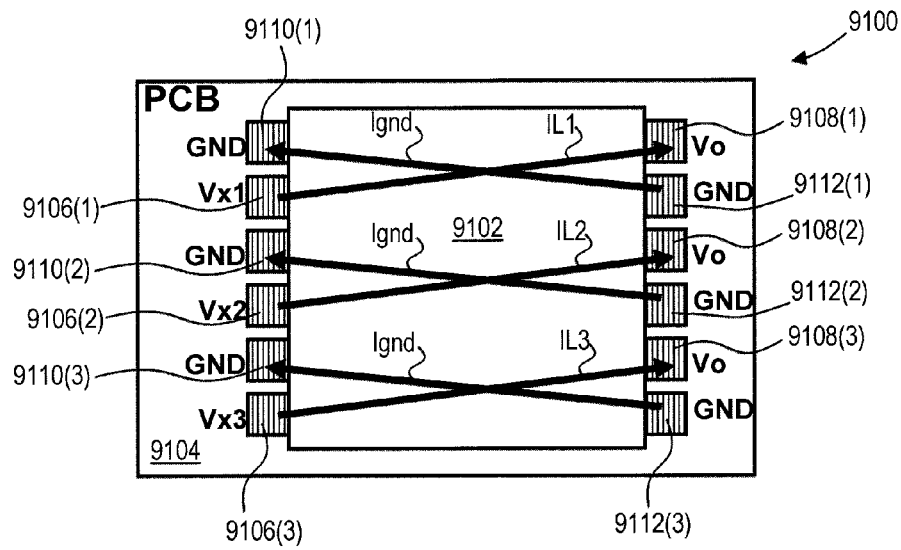
FIG. 91 shows one possible PCB footprint for use with the FIG. 86 inductor, according to an embodiment.

FIG. 91 shows a PCB footprint 9100, which is one possible footprint for use with inductor 8600 in a three-phase buck converter application, such as in a converter having a schematic similar to that of FIG. 2. Inductor 8600 installs in an aperture 9102 of a PCB 9104. First and second solder tabs 8624, 8626 respectively couple to PCB pads 9106, 9108, and first and second ground return solder tabs 8630, 8632 respectively couple to PCB pads 9110, 9112. Not shown in FIG. 91 are buck converter switching devices electrically coupled to switching nodes Vx and a load electrically coupled to output node Vo. As shown by arrows IL1-IL3, windings 8620 provide a path for current from an electrical power source, which is modulated by the buck converter switching devices, to a load. On the other hand, ground return conductor 8628 provides a path for return current from the load back to the electric power source, as shown by arrows Ignd. Footprint 9100 could be modified to accommodate a different number of phases. Inductor 8600 is not limited to use with footprint 9100 or in multi-phase buck converter applications. For example, inductor 8600 could be used in other topologies, such as boost converters and buck-boost converters.

Figure 92:
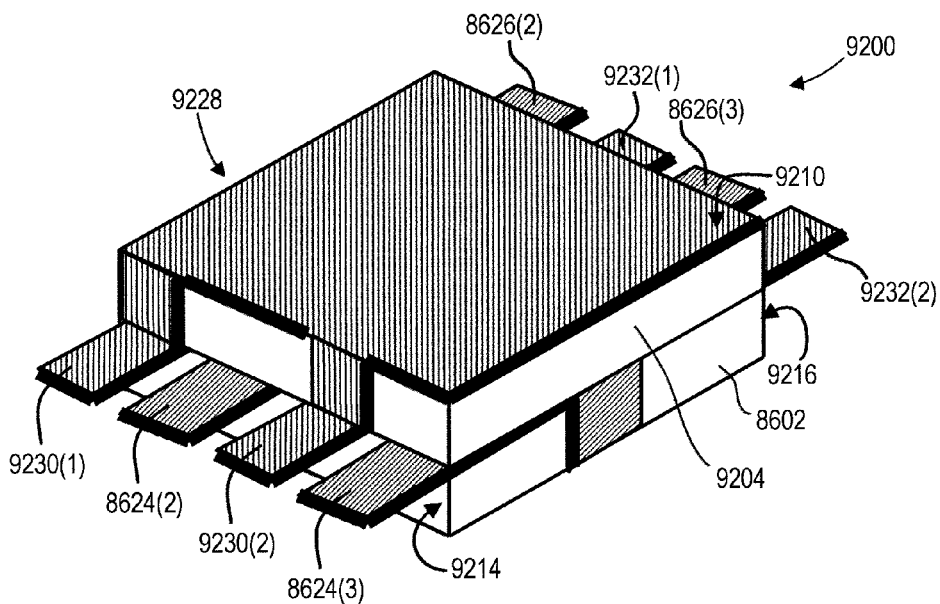
FIG. 92 shows a perspective view of a coupled inductor similar to that of FIG. 86 but with an alternative leakage plate and ground return conductor, according to an embodiment.
Figure 93:
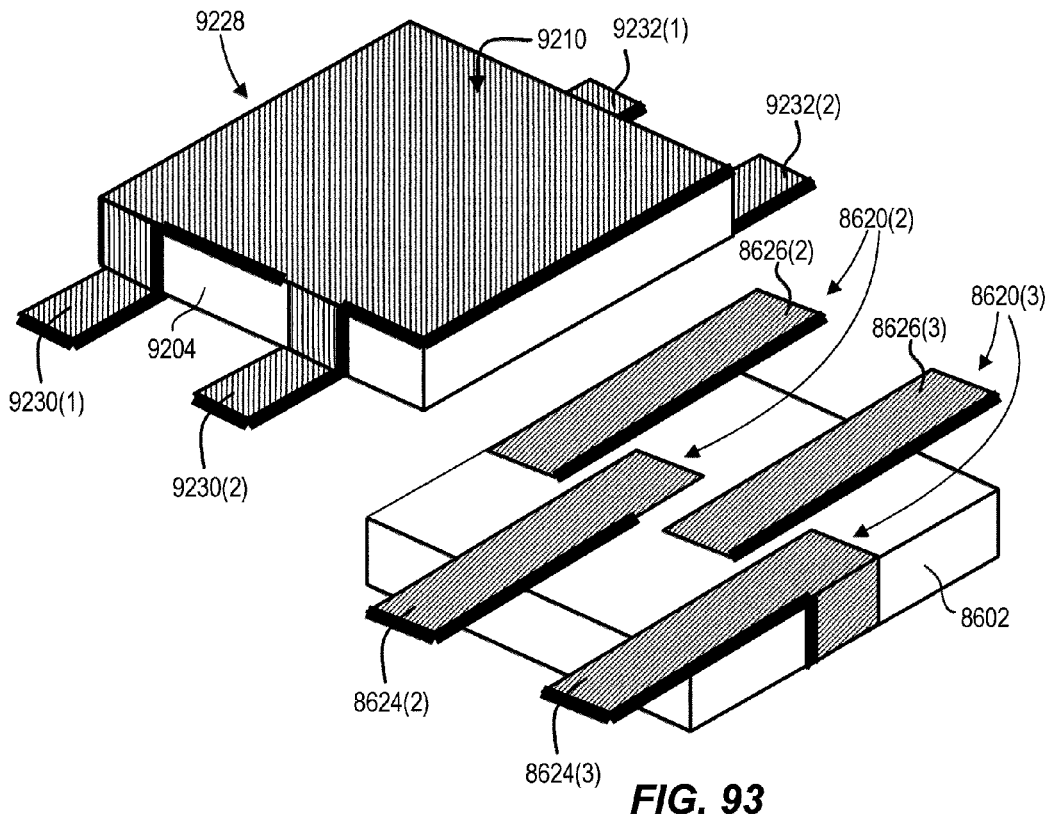
FIGS. 93 and 94 each show the FIG. 92 inductor with its leakage plate separated from its core.
Figure 94:
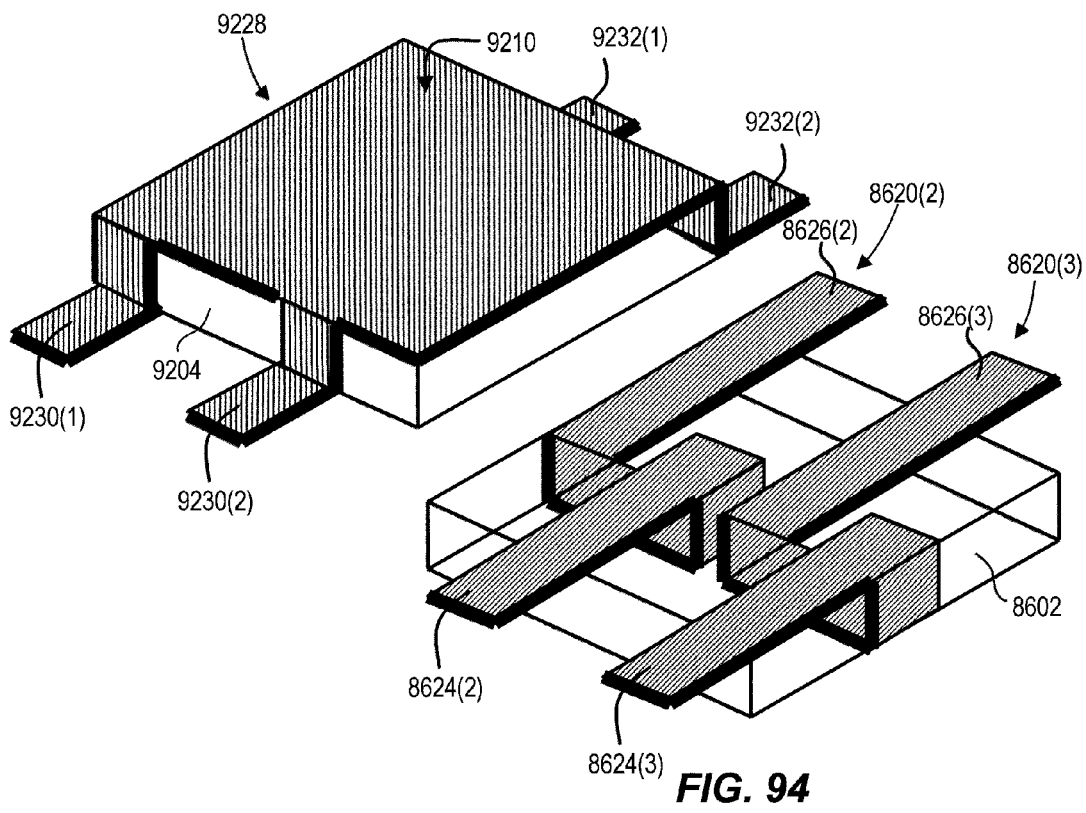

FIG. 92 shows a perspective view of a drop-in coupled inductor 9200. Coupled inductor 9200 is similar to coupled inductor 8600 (FIG. 86) but with a leakage plate 9204 that does not extend over the inductor's solder tabs. Coupled inductor 9200 includes a ground return conductor 9228 disposed on a leakage plate top surface 9210. Opposing first and second ends of ground return conductor 9228 respectively form first and second ground return solder tabs 9230, 9232. First ground return solder tabs 9230 are disposed at core first side 9214, and second ground return solder tabs 9232 are disposed at core second side 9216. FIG. 93 shows inductor 9200 with leakage plate 9204 separated from core 8602, and FIG. 94 also shows inductor 9200 with leakage plate 9204 separated from core 8602, but with both the leakage plate and core shown as transparent. Although coupled inductor 9200 is shown as having two instances of windings 8620, inductor 9200 could be modified to have additional winding 8620 instances.

The fact that leakage plate 9228 does not extend over the solder tabs enables simultaneous pressing or stamping of both winding solder tabs 8624, 8626 and ground return solder tabs 9230, 9232 while manufacturing certain embodiments of coupled inductor 9200. In some embodiments, solder tab pressing or stamping is performed while forming other parts of coupled inductor 9200, such as while curing core 8602 and/or leakage plate 9204, thereby promoting manufacturing efficiency.

Figure 95:
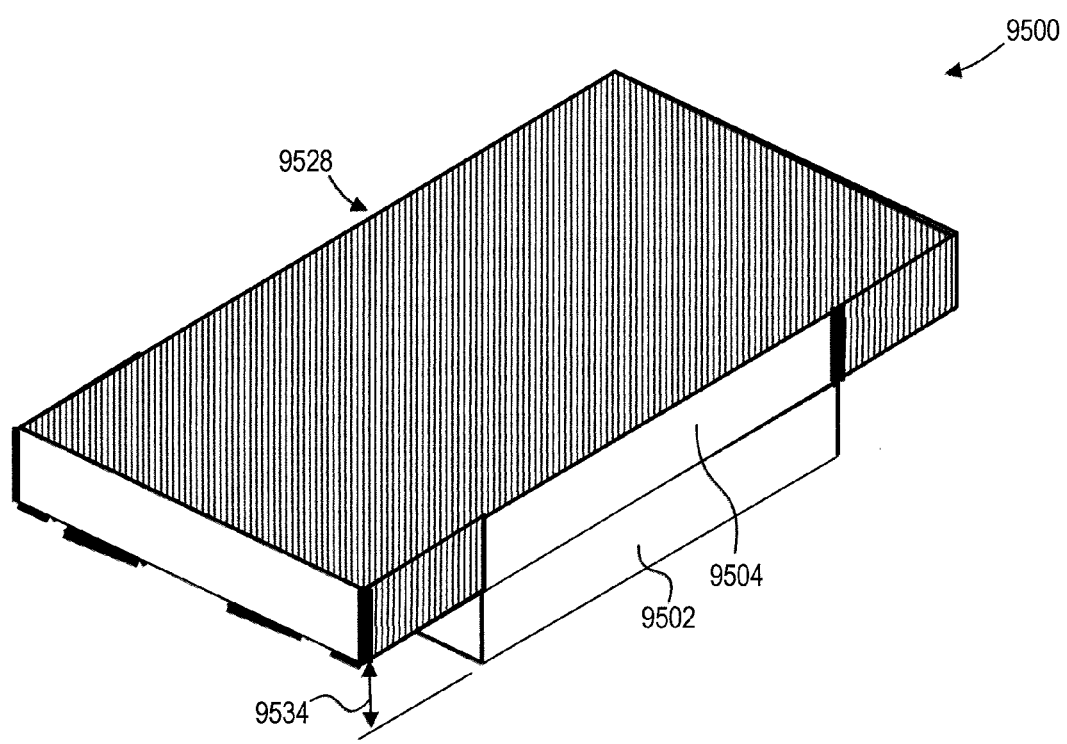
FIG. 95 shows a perspective view of another drop-in coupled inductor, according to an embodiment.
Figure 96:
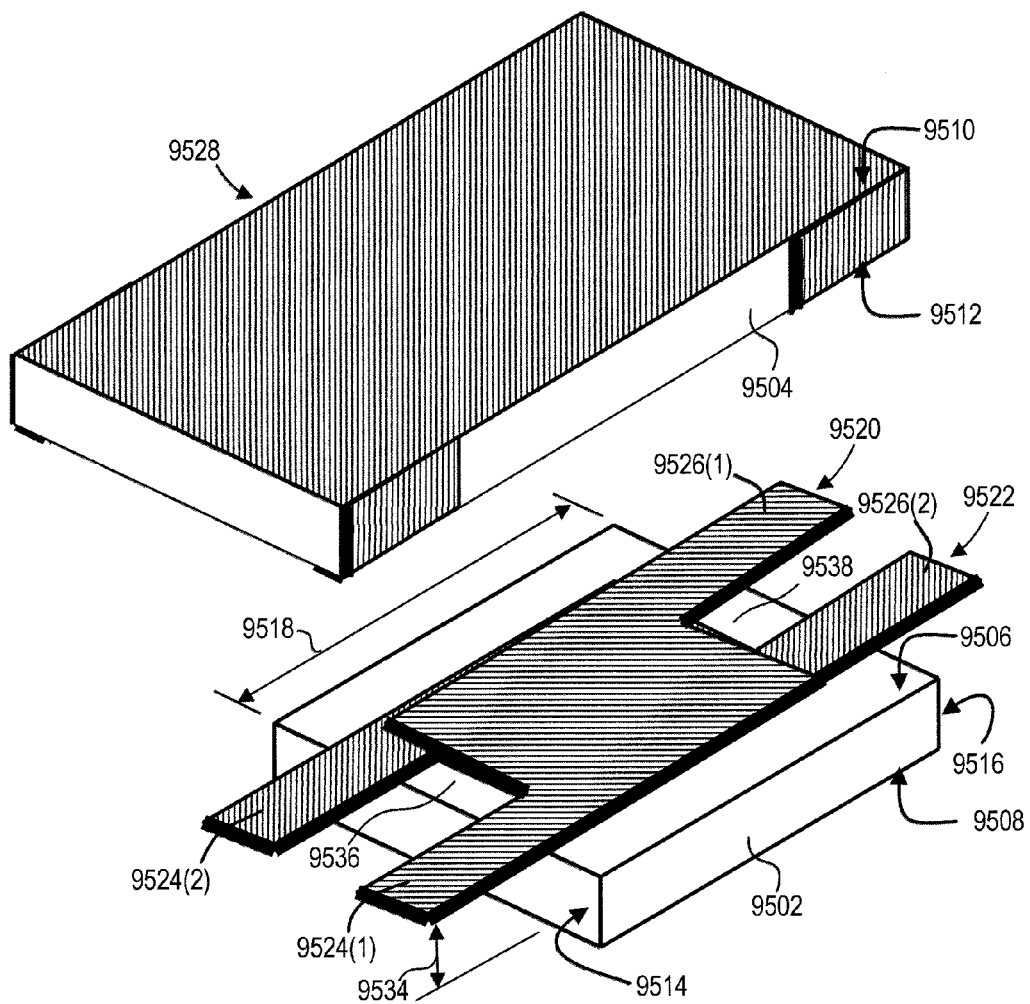
FIG. 96 shows a perspective view of the FIG. 95 inductor with its magnetic elements separated from each other.
Figure 97:
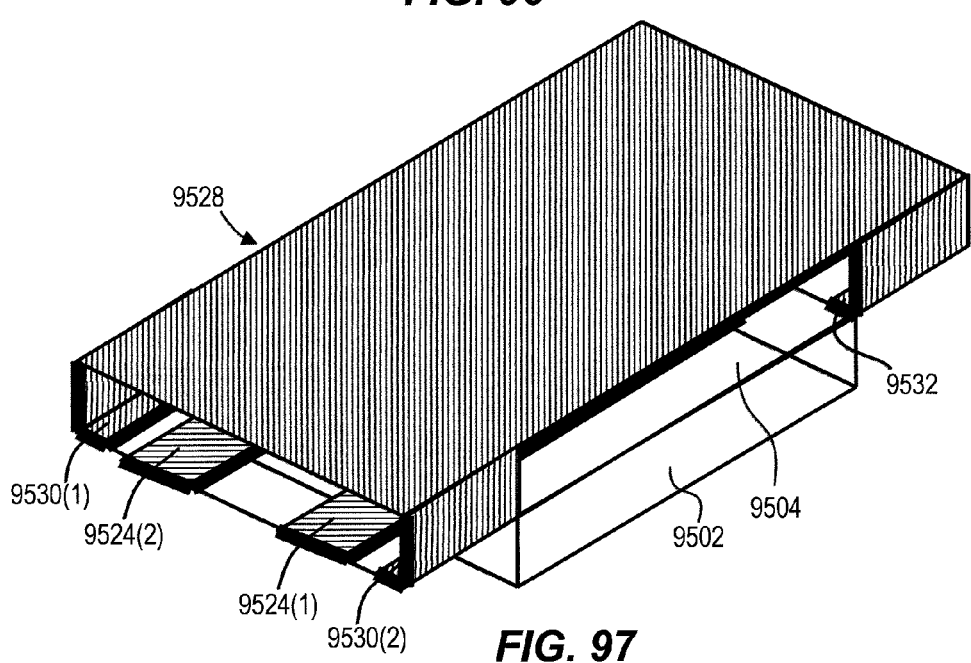
FIG. 97 shows a perspective view of the FIG. 95 inductor with its magnetic elements shown as transparent.
Figure 98:
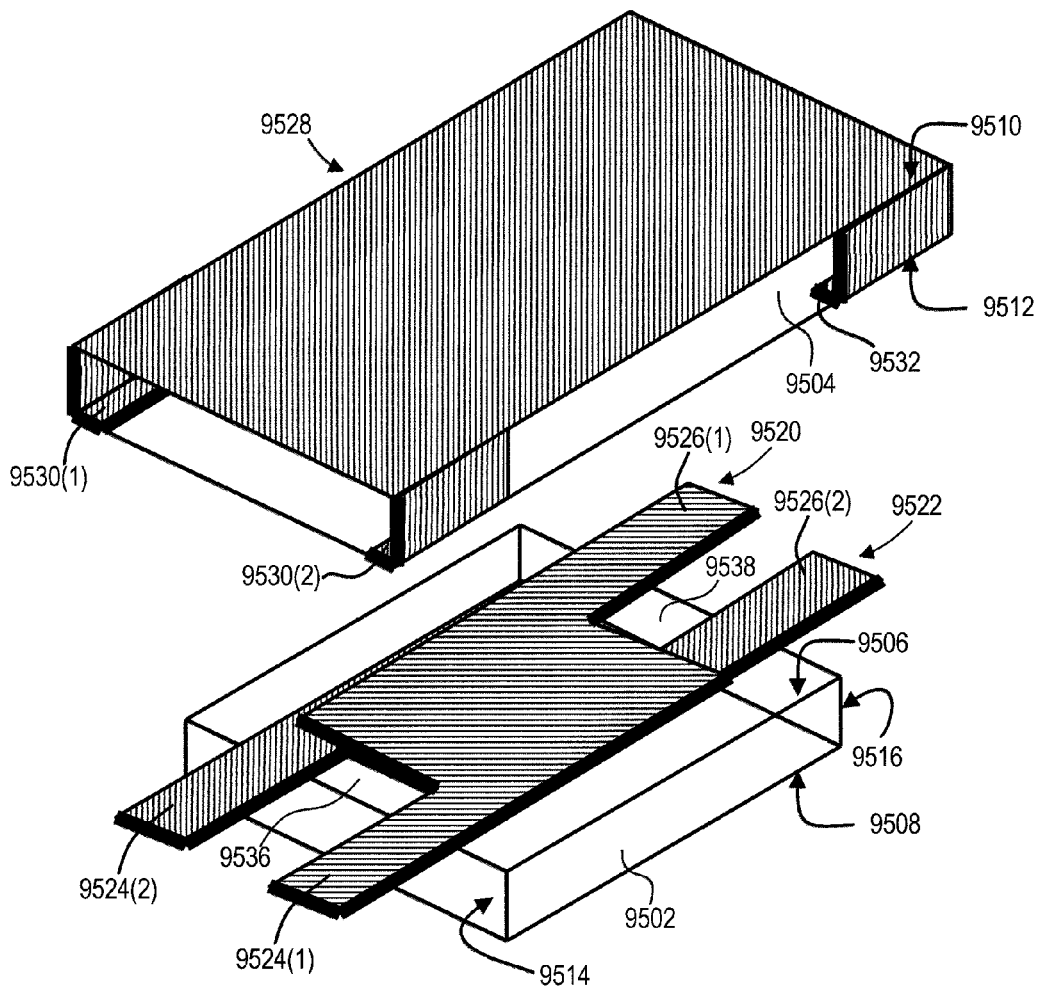
FIG. 98 shows a perspective view of the FIG. 95 inductor with its magnetic elements separated from each other and shown as transparent.

FIG. 95 shows a perspective view of a coupled inductor 9500, which is another drop-in coupled inductor including a ground return conductor. Inductor 9500 includes a magnetic core including a first magnetic element 9502 and a second magnetic element 9504. FIG. 96 shows a perspective view of inductor 9500 with second magnetic element 9504 separated from first magnetic element 9502. First magnetic element 9502 includes opposing top and bottom surfaces 9506, 9508, and second magnetic element 9504 includes opposing top and bottom surfaces 9510, 9512 (see FIG. 96). Second magnetic element 9504 is disposed on first magnetic element 9502 such that second magnetic element bottom surface 9512 faces first magnetic element top surface 9506. First magnetic element 9502 further includes opposing first and second sides 9514, 9516 separated by a linear separation distance 9518. First and second sides 9514, 9516 are each generally perpendicular to first magnetic element top and bottom surfaces 9506, 9508. FIG. 97 shows inductor 9500 with first and second magnetic elements 9502, 9504 shown as transparent, and FIG. 98 shows inductor 9500 with first and second magnetic elements 9502, 9504 separated and shown as transparent.

Figure 99:
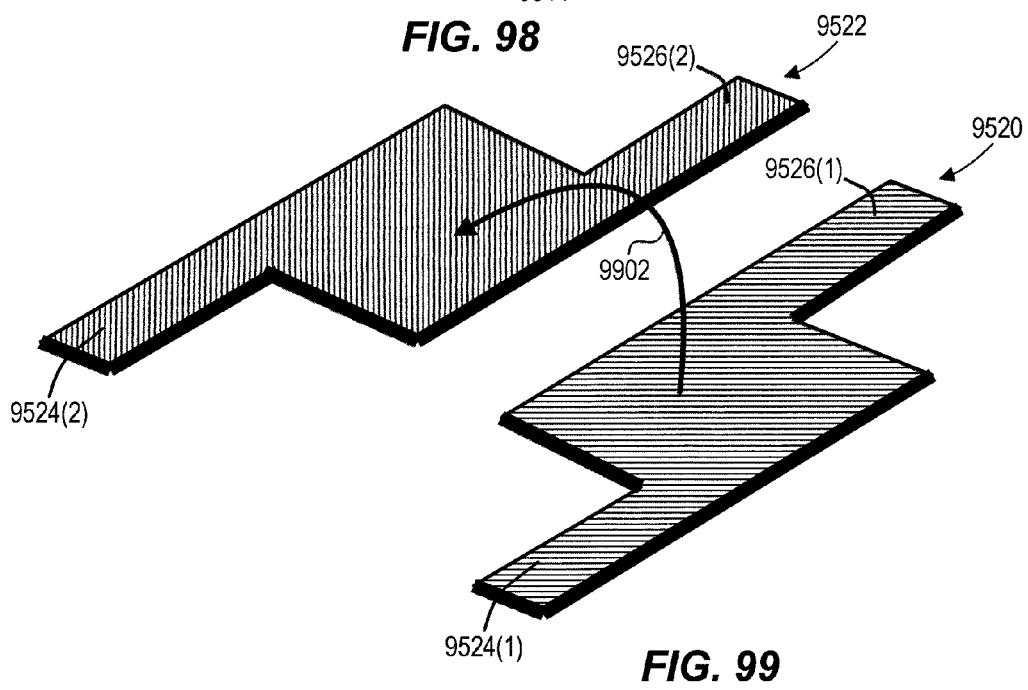
FIG. 99 shows a perspective view of the windings of the FIG. 95 inductor separated from each other.

Coupled inductor 9500 further includes first and second windings 9520, 9522 disposed on first magnetic element top surface 9506. First and second windings 9520, 9522 cross along top surface 9506, and are separated by an insulator (not shown) at least where the windings cross. In some embodiments, the insulator is an insulating film disposed on one or both of first and second windings 9520, 9522. In other embodiments, the insulator is a discrete element, such as a plastic sheet, disposed between first and second windings 9520, 9522. FIG. 99 shows windings 9520, 9522 separated from each other. Arrow 9902 represents how first winding 9520 is disposed on second winding 9522 such that the windings cross. In alternate embodiments, second winding 9522 is disposed on first winding 9520. Each winding 9520, 9522 has opposing first and second ends respectively forming a first and second solder tab 9524, 9526. Each first solder tab 9524 is disposed at first side 9514 and extends away from first magnetic element 9502 in the lengthwise 9518 direction. On the other hand, each second solder tab 9526 is disposed at second side 9516 and extends away from first magnetic element 9502 in the lengthwise 9518 direction.

Inductor 9500 additionally includes a ground return conductor 9528 disposed on second magnetic element top surface 9510. Neither first nor second magnetic element 9502 or 9504 forms a magnetic path loop around ground return conductor 9528. Accordingly, inductance of ground return conductor 9528 is not significantly increased by presence of first and second magnetic elements 9502, 9504, while inductance of windings 9520, 9522 is increased by presence of first and second magnetic elements 9502, 9504, relative to an otherwise identical inductor without the magnetic elements. Although it is anticipated that ground return conductor 9528 will typically carry return current from a load back to an electric power source, ground return conductor 9528 could be used for another purpose, such as to electrically couple a load to an auxiliary electric power source. Ground return conductor 9528 substantially covers second magnetic element top surface 9510, thereby acting as a shield and helping cool inductor 9500 and other components in its vicinity. In certain alternate embodiments, single ground return conductor 9528 is replaced with multiple ground return conductors and/or disposed on first magnetic element bottom surface 9508.

Opposing ends of ground return conductor 9528 respectively form first and second ground return solder tabs 9530, 9532. First ground return solder tabs 9530 are disposed at first side 9514, and second ground return solder tabs 9532 are disposed at second side 9516. Second magnetic element 9504 typically extends over some or all of first and second solder tabs 9524, 9526 and first and second ground return solder tabs 9530, 9532, thereby promoting solder tab planarity and mechanical robustness. First and second solder tabs 9524, 9526 and first and second ground return solder tabs 9530, 9532 are each offset by a common distance 9534 from first magnetic element bottom surface 9508 (see FIGS. 95 and 96). In other words, each solder tab 9524, 9526, 9530, 9532 is disposed in a common plane between first magnetic element bottom surface 9508 and second magnetic element top surface 9510 to facilitate use of inductor 9500 as a drop-in inductor in a PCB aperture.

Figure 100:
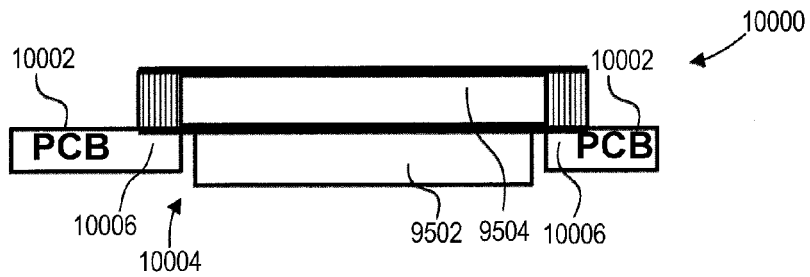
FIG. 100 shows a cross-sectional view of a printed circuit assembly including the FIG. 95 inductor, according to an embodiment.

FIG. 100 shows a cross-sectional view of a printed circuit assembly 10000 including drop-in coupled inductor 9500 installed in a PCB 10002 aperture 10004. Second magnetic element 9504 overlaps PCB 10002 portions 10006, thereby promoting strong mechanical coupling of inductor 9500 to PCB 10002 and mechanical robustness of assembly 10000.

Figure 101:
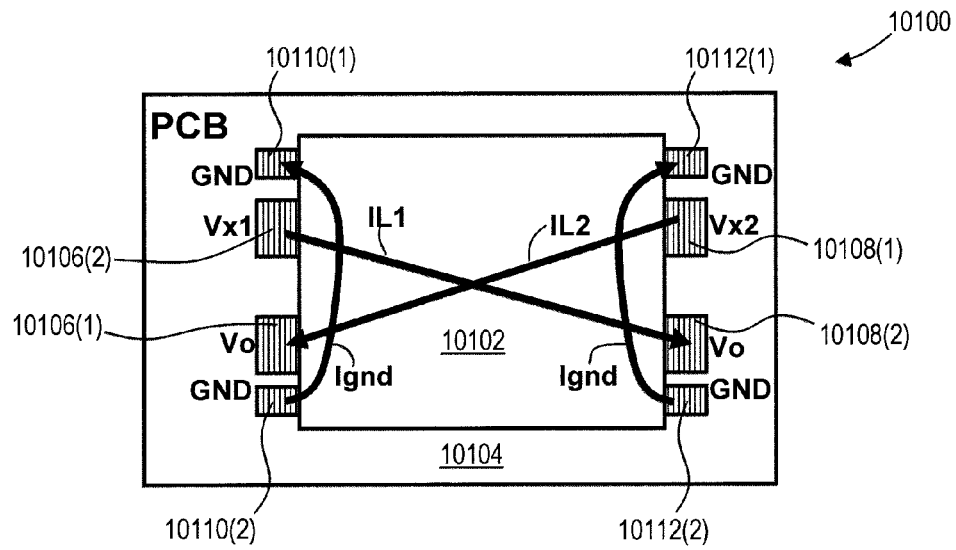
FIG. 101 shows one possible PCB footprint for use with the FIG. 95 inductor, according to an embodiment.

FIG. 101 shows a PCB footprint 10100, which is one possible footprint for use with inductor 9500 in a two-phase buck converter application, such as in a converter having a schematic similar to that of FIG. 2. Inductor 9500 installs in an aperture 10102 of a PCB 10104. First and second solder tabs 9524, 9526 respectively couple to PCB pads 10106, 10108, and first and second ground return solder tabs 9530, 9532 respectively couple to PCB pads 10110, 10112. Not shown in FIG. 101 are buck converter switching devices electrically coupled to switching nodes Vx and a load electrically coupled to output node Vo. As shown by arrows IL1 and IL2, windings 9522, 9520 provide a path for current from an electrical power source, which is modulated by the buck converter switching devices, to a load. Thus, the two switching stages will typically be disposed on opposing sides of inductor 9500 to be near their respective Vx terminals Ground return conductor 9528 provides a path for return current from the load back to the electric power source, as shown by arrows Ignd. Inductor 9500 is not limited to use with footprint 10100 or in multi-phase buck converter applications. For example, inductor 9500 could be used in other topologies such as boost converters and buck-boost converters.

Figure 102:
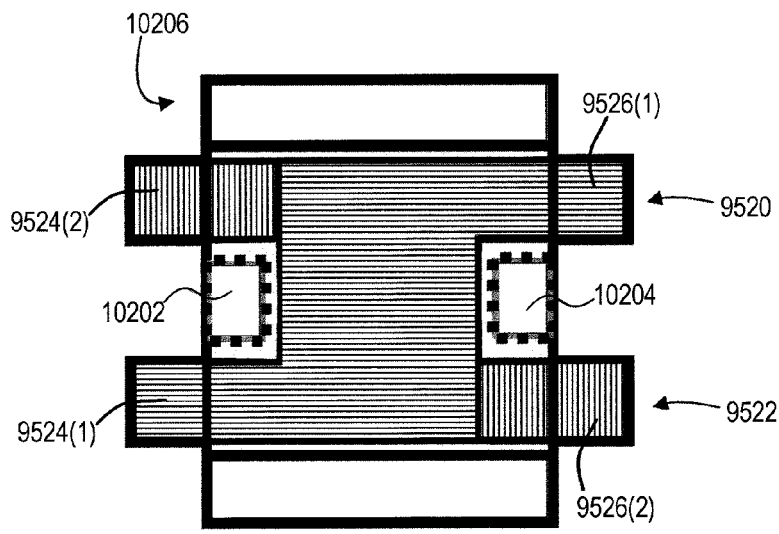
FIG. 102 shows a top plan view and FIG. 103 shows a side plan view of an alternative embodiment of a magnetic element of the FIG. 95 inductor, according to an embodiment.
Figure 103:
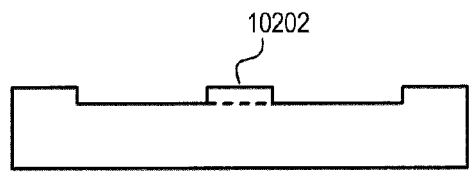

First and second magnetic elements 9502, 9504 collectively provide a path for magnetic flux linking first and second windings 9520, 9522. The magnetic elements also provide a path for leakage magnetic flux, which is magnetic flux generated by current flowing through one of windings 9520, 9522 that does not link the other of windings 9520, 9522. In particular, portions 9536, 9538 of inductor 9500 between windings 9520, 9522 provide a path for leakage magnetic flux. Leakage inductance associated with windings 9520, 9522 can be adjusted during inductor design and/or manufacture by varying the size and/or configuration of portions 9536, 9538. For example, FIG. 102 shows a top plan view of an alternative embodiment of first magnetic element 9502 including magnetic extensions 10202, 10204 in portions 9536, 9538, respectively. Extensions 10202, 10204 extend from first magnetic element 9502 to second magnetic element 9504 to decrease leakage magnetic path reluctance, thereby promoting increased leakage inductance. In some embodiments, extensions 10202, 10204 are separated from first magnetic element 9502 and/or second magnetic element 9504 by an air gap or a gap filled with non-magnetic material. Leakage inductance values can be adjusted by changing gap thickness. FIG. 103 shows a plan view of a side 10206 of the magnetic element.

Figure 104:
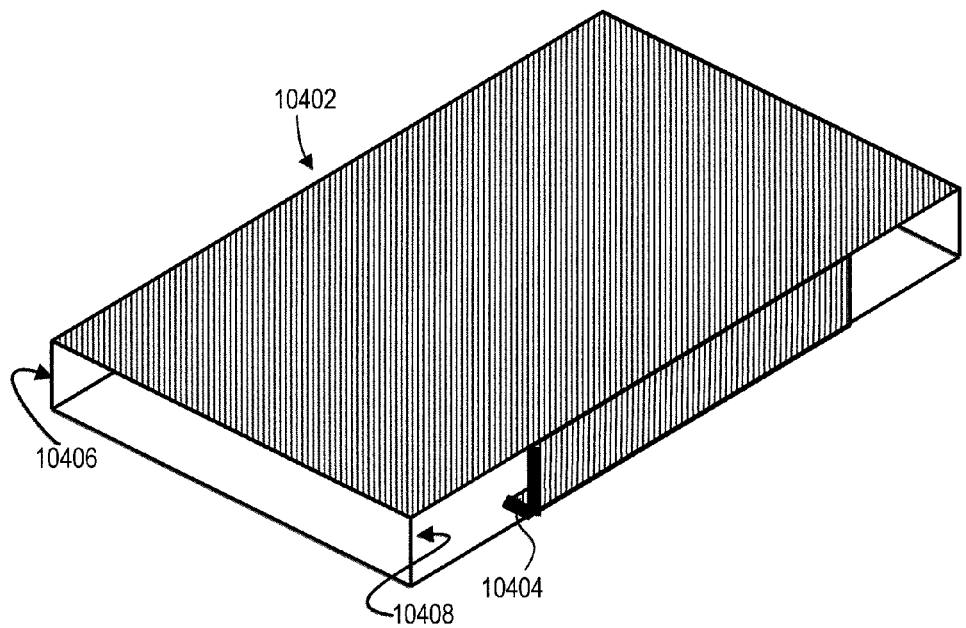
FIG. 104 shows a perspective view of a magnetic element of the FIG. 95 inductor including an alternative ground return conductor, according to an embodiment.
Figure 105:
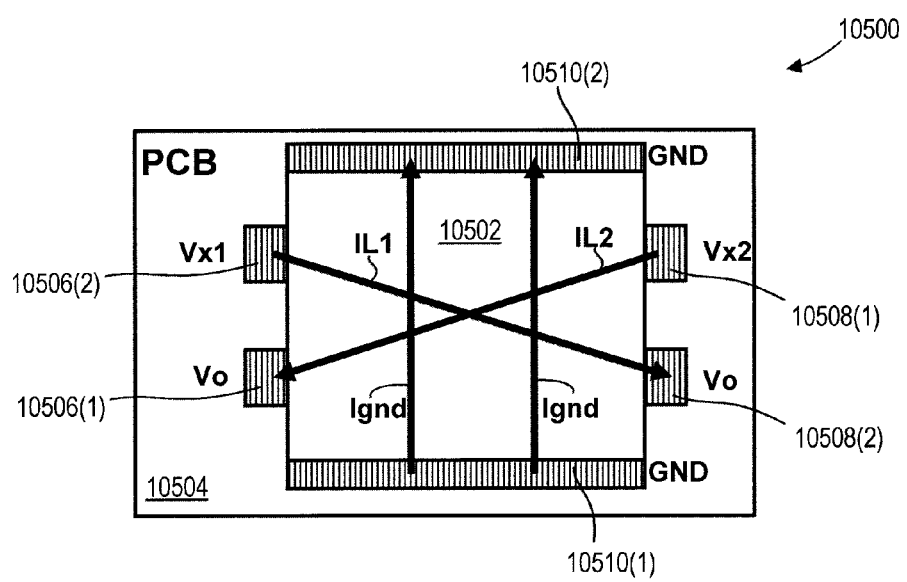
FIG. 105 shows one possible PCB footprint for use with the FIG. 95 inductor including the FIG. 104 alternative ground return conductor, according to an embodiment.

FIG. 104 shows a perspective view of second magnetic element 9504 including an alternative ground return conductor 10402. Ground return conductor 10402 covers substantially all of second magnetic element top surface 9510, but in contrast to ground return conductor 9528 (FIGS. 95-98), includes ground return solder tabs 10404 on opposing sides 10406, 10408 of second magnetic element 9504. FIG. 105 shows a PCB footprint 10500, which is one possible footprint for use with inductor 9500 including ground return conductor 10402 (FIG. 104) in a two-phase buck converter application. Inductor 9500 installs in an aperture 10502 of a PCB 10504. First and second solder tabs 9524, 9526 respectively couple to PCB pads 10506, 10508, and ground return solder tabs 10404 respectively couple to PCB pads 10510. Not shown in FIG. 105 are buck converter switching devices electrically coupled to switching nodes Vx and a load electrically coupled to output node Vo. As shown by arrows IL1 and IL2, windings 9522, 9520 provide a path for current from an electrical power source, which is modulated by the buck converter switching devices, to a load. Ground return conductor 10402 provides a path for return current from the load back to the electric power source, as shown by arrows Ignd.

Figure 106:
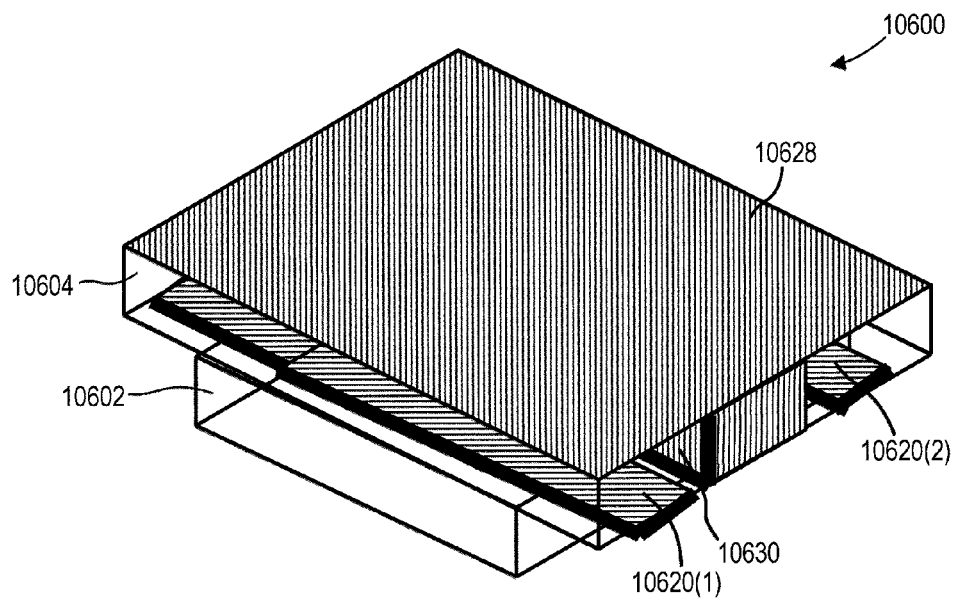
FIG. 106 shows a perspective view of another drop-in coupled inductor, according to an embodiment.
Figure 107:
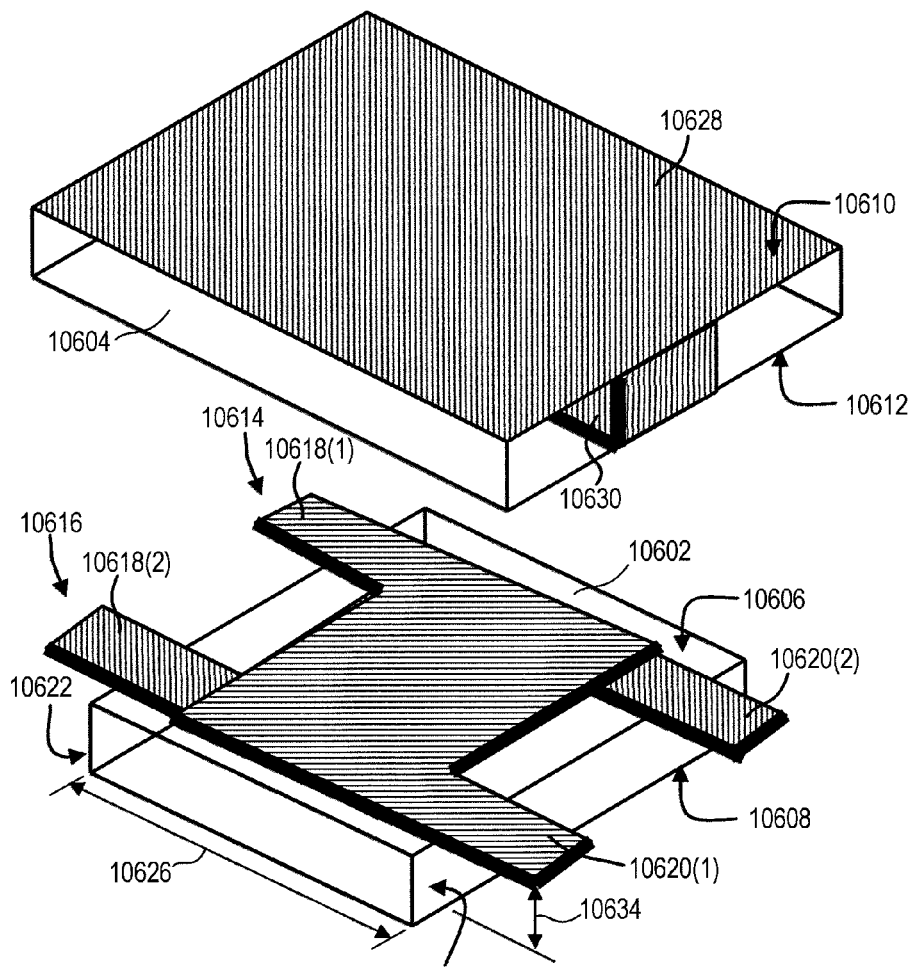
FIG. 107 shows the FIG. 106 inductor with its magnetic elements separated from each other.

FIG. 106 shows a perspective view of another drop-in coupled inductor 10600, which is similar to coupled inductor 9500 (FIG. 95), but has different magnetic flux paths. Coupled inductor 10600 includes first and second magnetic elements 10602, 10604. First magnetic element 10602 has opposing top and bottom surfaces 10606, 10608, and second magnetic element 10604 has opposing top and bottom surfaces 10610, 10612. FIG. 107 shows inductor 10600 with first and second magnetic elements 10602, 10604 separated. First and second magnetic elements 10602, 10604 are shown as transparent in FIGS. 106, 107.

Coupled inductor 10600 further includes first and second windings 10614, 10616 disposed on first magnetic element top surface 10606. First and second windings 10614, 10616 also cross along top surface 10606. Opposing ends of first and second windings 10614, 10616 form respective first and second solder tabs 10618, 10620 disposed at opposite sides 10622, 10624 of first magnetic element 10602. First and second sides 10622, 10624 of first magnetic element 10602 are substantially perpendicular to first magnetic element top and bottom surfaces 10606, 10608, and are separated by a linear separation distance 10626. Each of first and second solder tabs 10618, 10620 extend away from first magnetic element 10602 in the lengthwise 10626 direction.

Coupled inductor 10600 additionally includes a ground return conductor 10628 disposed on second magnetic element top surface 10610. Opposing ends of ground return conductor 10628 respectively form first and second ground return solder tabs 10630. Second magnetic element 10604 typically extends over some or all of first and second solder tabs 10618, 10620 and first and second ground return solder tabs 10630, thereby promoting solder tab planarity and mechanical robustness. First and second solder tabs 10618, 10620 and first and second ground return solder tabs 10630 are each offset by a common distance 10634 from first magnetic element bottom surface 10608. In other words, each solder tab 10618, 10620, 10630 is disposed in a common plane between first magnetic element bottom surface 10608 and second magnetic element top surface 10610 to facilitate use of inductor 10600 as a drop-in inductor in a PCB aperture.

Figure 108:
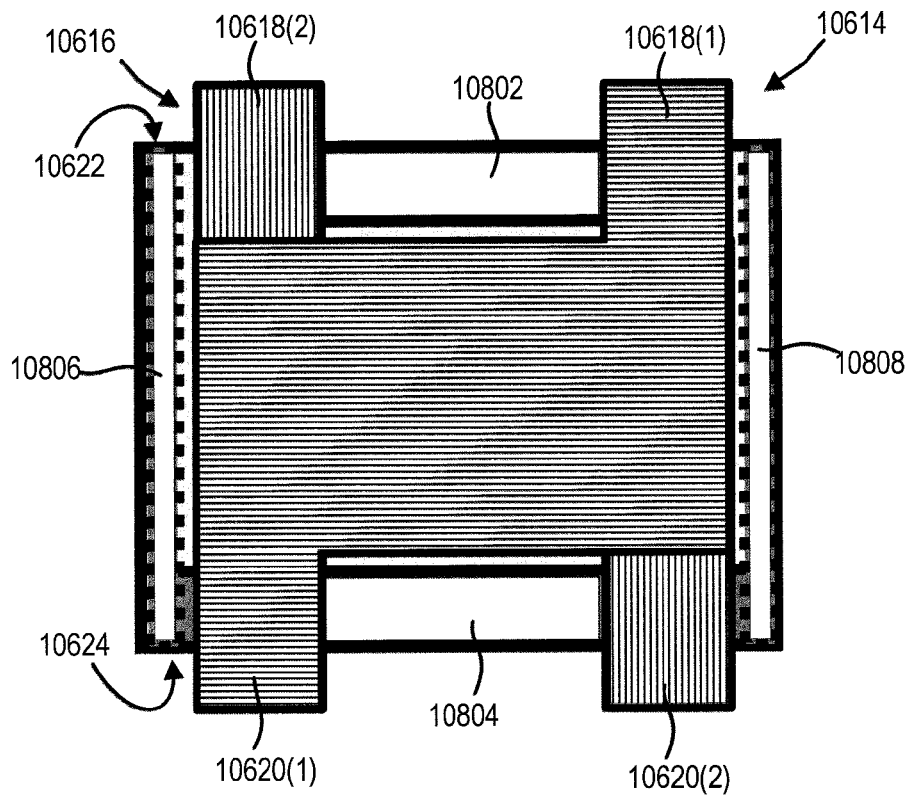
FIG. 108 shows a top plan view of a magnetic element of the FIG. 106 inductor, according to an embodiment.

FIG. 108 shows a top plan view of first magnetic element 10602. In contrast with coupled inductor 9500 of FIG. 95, portions 10802, 10804 between windings 10614, 10616 provide a path for magnetic flux linking windings 10614, 10616. Portions 10806, 10808 outside of the windings, on the other hand, provide a path for leakage magnetic flux. Accordingly, leakage inductance associated with first and second windings 10614, 10616 can be adjusted during inductor design and/or manufacture by varying the size and/or configuration of outer portions 10806, 10808. For example, leakage inductance could be adjusted by varying the cross-sectional areas of outer portions 10806, 10808. As another example, leakage inductance could be adjusted by adjusting the magnetic permeability of magnetic material forming outer portions 10806, 10808. Additionally, one or more of outer portions 10806, 10808 could include a gap filled with non-magnetic material, such as air, plastic, adhesive, or paper, and leakage inductance could be adjusted by varying gap thickness.

Figure 109:
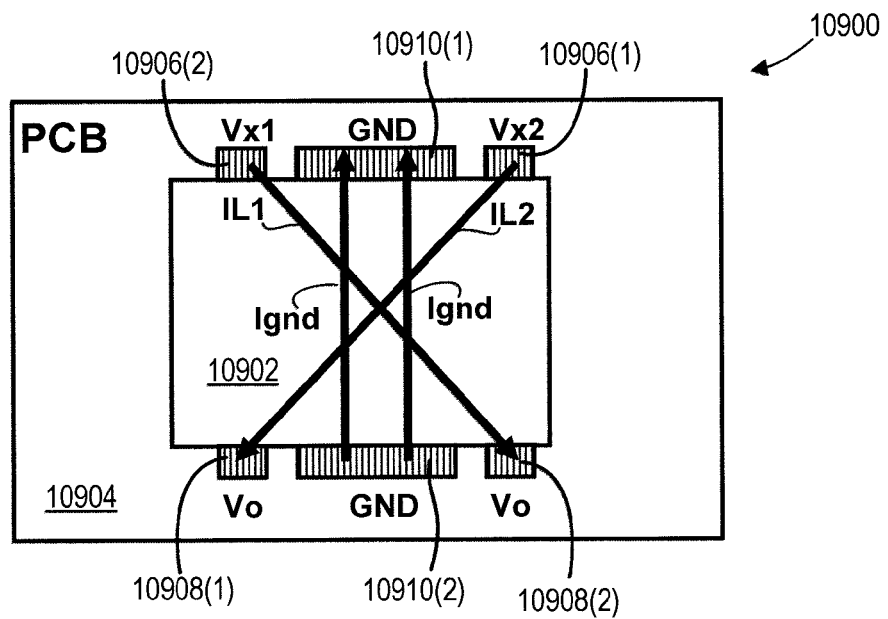
FIG. 109 shows one possible PCB footprint for use with the FIG. 106 inductor, according to an embodiment.

Inductor 10600's configuration promotes placement of switching devices on a common side of coupled inductor 10600. For example, FIG. 109 shows a PCB footprint 10900, which is one possible footprint for use with inductor 10600 in a two-phase buck converter application, such as in a converter having a schematic similar to that of FIG. 2. Inductor 10600 installs in an aperture 10902 of a PCB 10904. First and second solder tabs 10618, 10620 respectively couple to PCB pads 10906, 10908, and first and second ground return solder tabs 10630 respectively couple to PCB pads 10910. Not shown in FIG. 109 are buck converter switching devices electrically coupled to switching nodes Vx and a load electrically coupled to output node Vo. As shown by arrows IL1 and IL2, windings 10616, 10614 provide a path for current from an electrical power source, which is modulated by the buck converter switching devices, to a load. Thus, the two switching stages will typically be disposed on the same side of inductor 10600 to be near their respective Vx terminals. Ground returns conductor 10628 provides a path for return current from the load back to the electric power source, as shown by arrows Ignd. Inductor 10600 is not limited to use with footprint 10900 or in multi-phase buck converter applications. For example, inductor 10600 could be used in other topologies such as boost converters and buck-boost converters.

Figure 110:
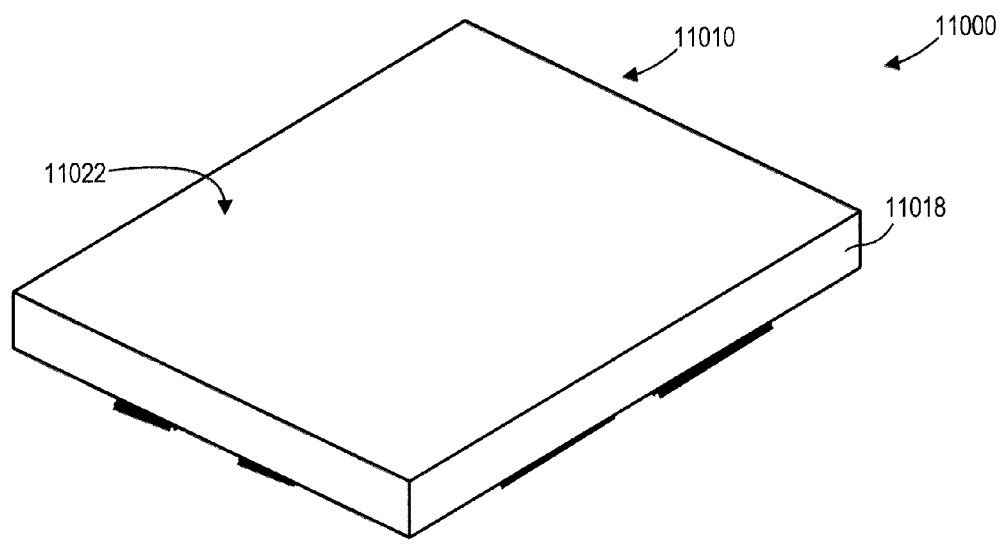
FIG. 110 shows a perspective view of another drop-in coupled inductor, according to an embodiment.
Figure 111:
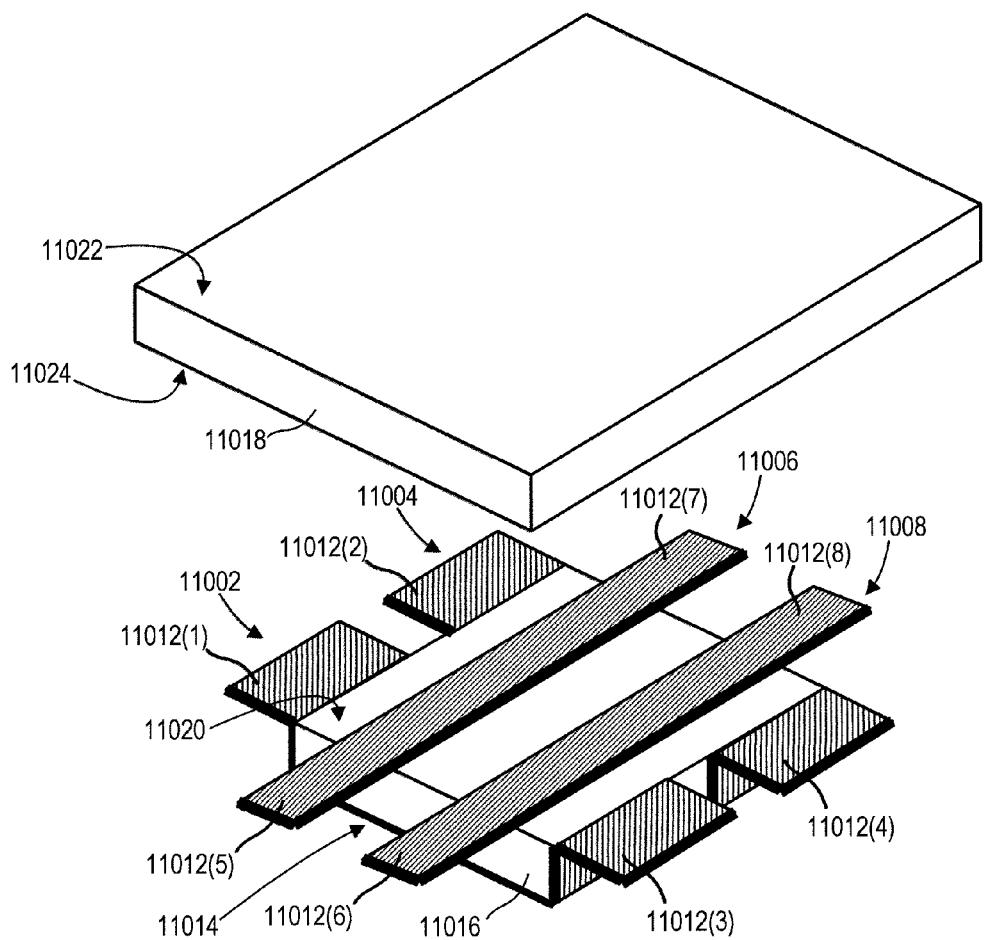
FIGS. 111 and 112 each show the coupled inductor of FIG. 110 with its magnetic elements separated from each other.
Figure 112:
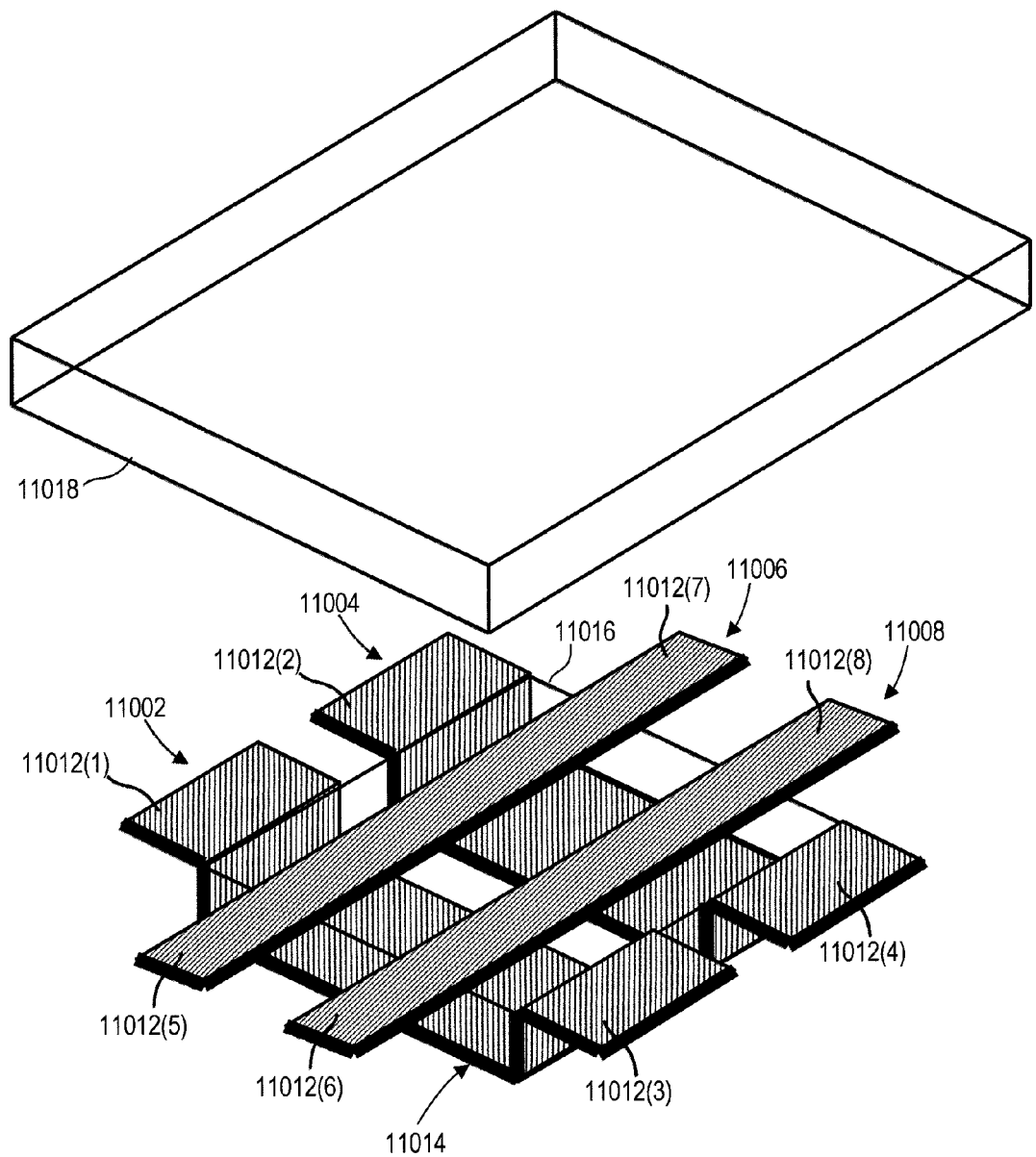

FIG. 110 shows a perspective view of another drop-in coupled inductor 11000, which is similar to coupled inductor 5000 (FIG. 50), but includes a magnetic core 11010 in place of magnetic core 5010. Magnetic core 11010 includes first and second magnetic elements 11016, 11018, where second magnetic element 11018 extends over at least some of solder tabs 11012, thereby promoting solder tab planarity and strong mechanical coupling to a PCB in drop-in applications. FIG. 111 shows a perspective view of coupled inductor 11000 with first and second magnetic elements 11016, 11018 separated from each other. FIG. 112 also shows a perspective view of the coupled inductor with first and second magnetic elements 11016, 11018 separated from each other, but with the magnetic elements shown as transparent. Second magnetic element 11018 is disposed on first magnetic element 11016 such that a bottom surface 11024 of second magnetic element 11018 faces a top surface 11020 of first magnetic element 11016.

Coupled inductor 11000 further includes ground return conductors 11002, 11004 and windings 11006, 11008. Ground return conductors 11002, 11004 are disposed on a bottom surface 11014 of first magnetic element 11016 and form respective solder tabs 11012 at their ends. Windings 11006, 11008 are disposed on top surface 11020 of first magnetic element 11016 and form respective solder tabs 11012 at their ends. In certain embodiments, all solder tabs 11012 are formed at the same height relative to first magnetic element bottom surface 11014. In other words, in such embodiments, each solder tab 11012 is disposed in a common plane between first magnetic element bottom surface 11014 and second magnetic element top surface 11022 to facilitate use of inductor 11000 as a drop-in inductor in a PCB aperture. Neither first nor second magnetic element 11016 or 11018 forms a magnetic path loop around ground return conductors 11002, 11004. Accordingly, inductance of ground return conductors 11002, 11004 is not significantly increased by presence of first and second magnetic elements 11016, 11018, while inductance of windings 11006, 11008 is increased by presence of first and second magnetic elements 11016, 11018, relative to an otherwise identical inductor without the magnetic elements.

Figure 113:
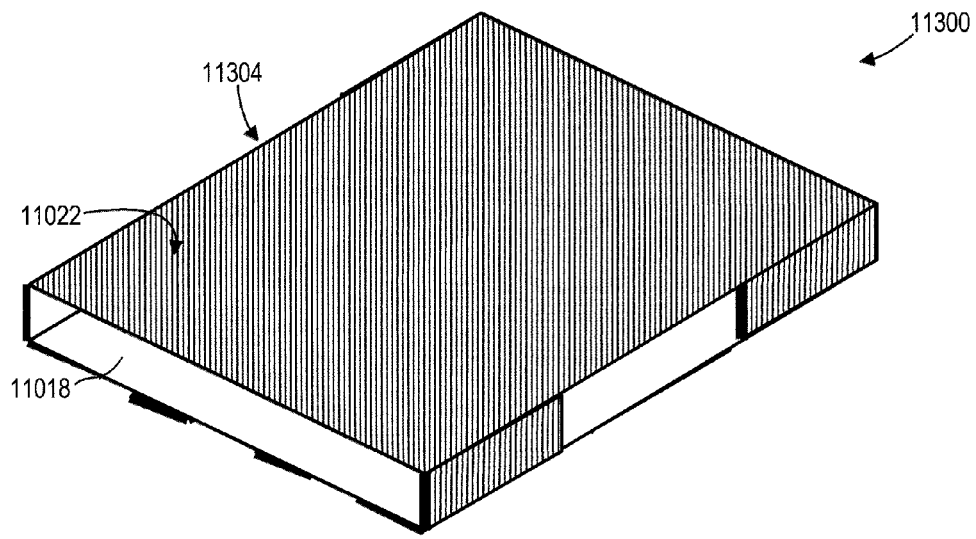
FIG. 113 shows a perspective view of another drop-in coupled inductor similar to that of FIG. 110 but with a different ground return conductor configuration, according to an embodiment.
Figure 114:
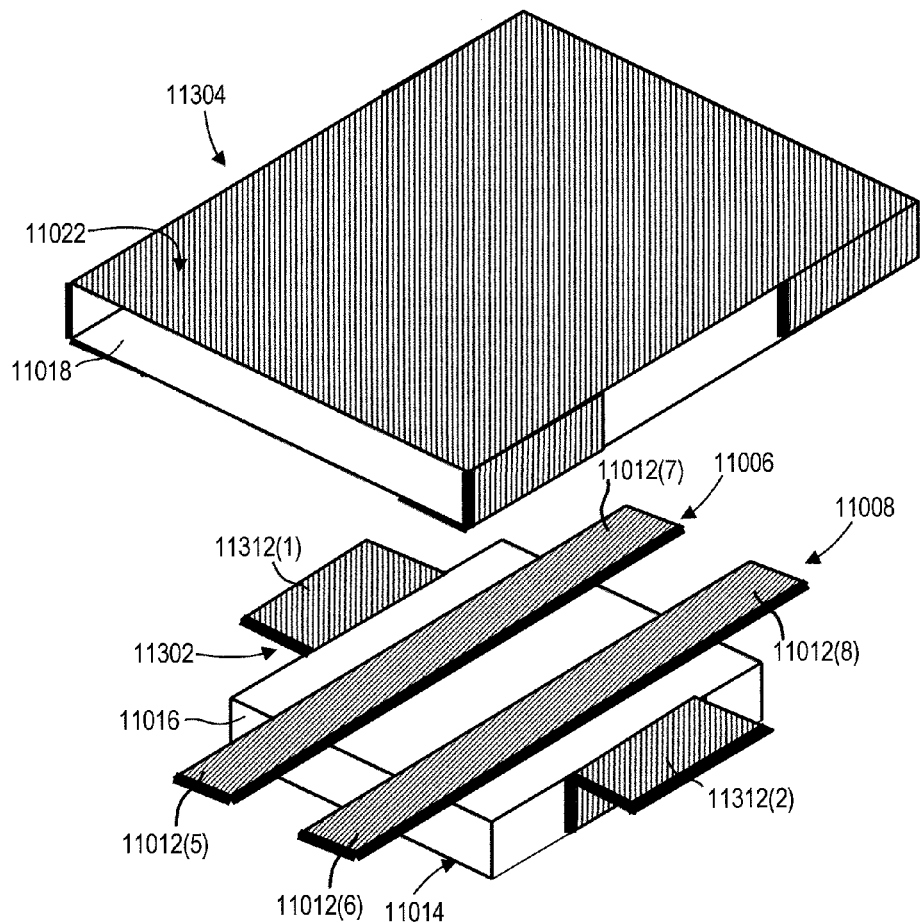
FIGS. 114 and 115 each show the coupled inductor of FIG. 113 with its magnetic elements separated from each other.
Figure 115:
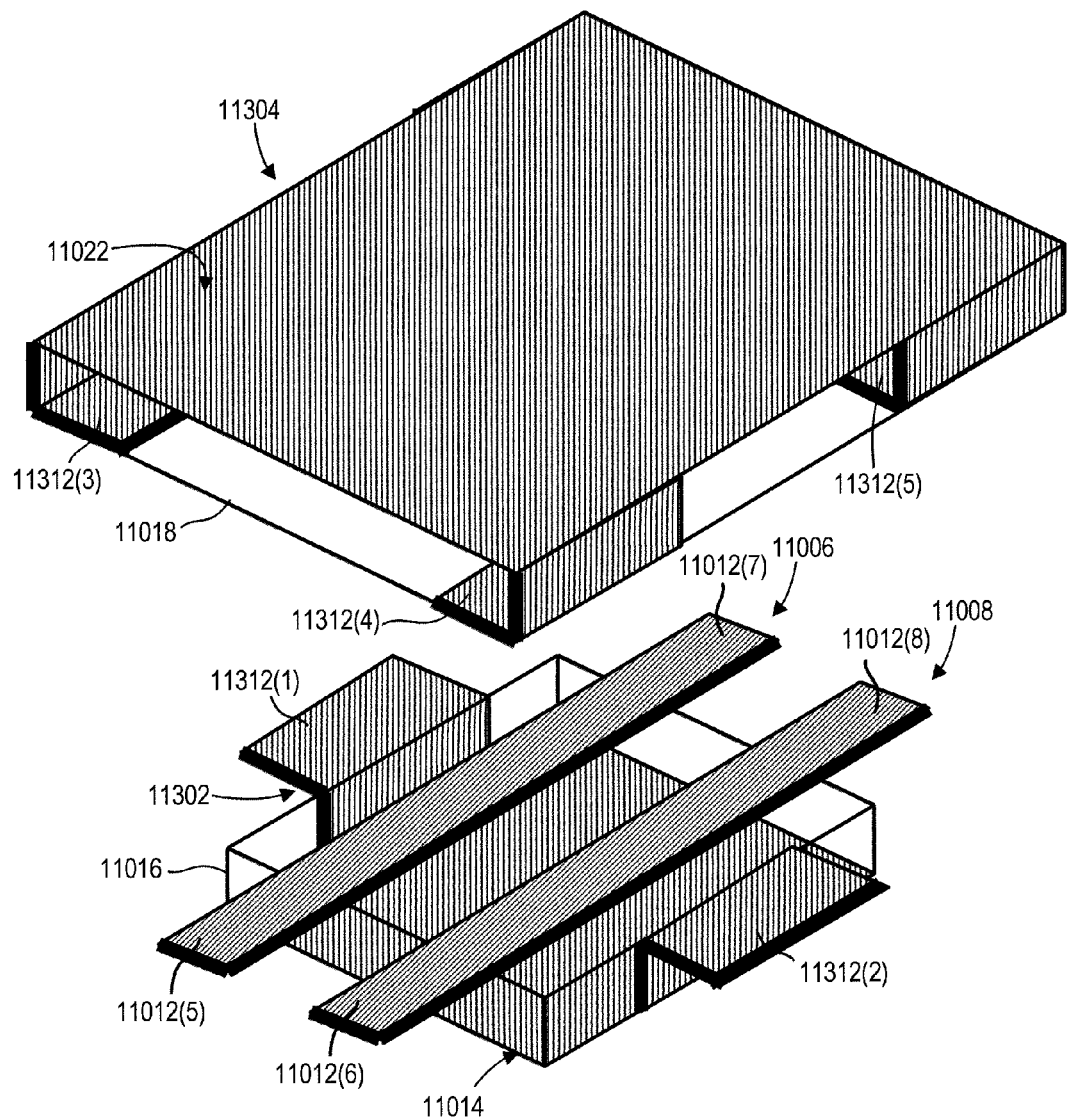

FIG. 113 shows a perspective view of a drop-in coupled inductor 11300, which is similar to inductor 11000 (FIG. 110), but with a different ground return conductor configuration. In particular, inductor 11300 includes a ground return conductor 11302 disposed on first magnetic element bottom surface 11014, as well as a ground return conductor 11304 disposed on second magnetic element top surface 11022. FIG. 114 shows a perspective view of coupled inductor 11000 with first and second magnetic elements 11016, 11018 separated from each other. FIG. 115 also shows a perspective view of the coupled inductor with first and second magnetic elements 11016, 11018 separated from each other, but with the magnetic elements shown as transparent.

Opposing first and second ends of ground return conductors 11302, 11304 form respective ground return solder tabs 11312. In certain embodiments, each solder tab 11012 and 11312 is formed at a same height relative to first magnetic element bottom surface 11014. In other words, in such embodiments, each solder tab 11012, 11312 is disposed in a common plane between first magnetic element bottom surface 11014 and second magnetic element top surface 11022 to facilitate use of inductor 11300 as a drop-in inductor in a PCB aperture.

Neither first nor second magnetic element 11016, 11018 forms a magnetic path loop around ground return conductor 11302 or 11304. Accordingly, inductance of ground return conductors 11302, 11304 is not significantly increased by presence of first and second magnetic elements 11016, 11018, while inductance of windings 11006, 11008 is increased by presence of first and second magnetic elements 11016, 11018, relative to an otherwise identical inductor without the magnetic elements. Although it is anticipated that ground return conductors 11302, 11304 will typically carry return current from a load back to an electric power source, ground return conductors 11302, 11304 could be used for another purpose, such as to electrically couple a load to an auxiliary electric power source. Ground return conductor 11304 substantially covers second magnetic element top surface 11022, and ground return conductor 11302 substantially covers first magnetic element bottom surface 11014, thereby acting as a shield and helping cool inductor 11300 and other devices in its vicinity.

Figure 116:
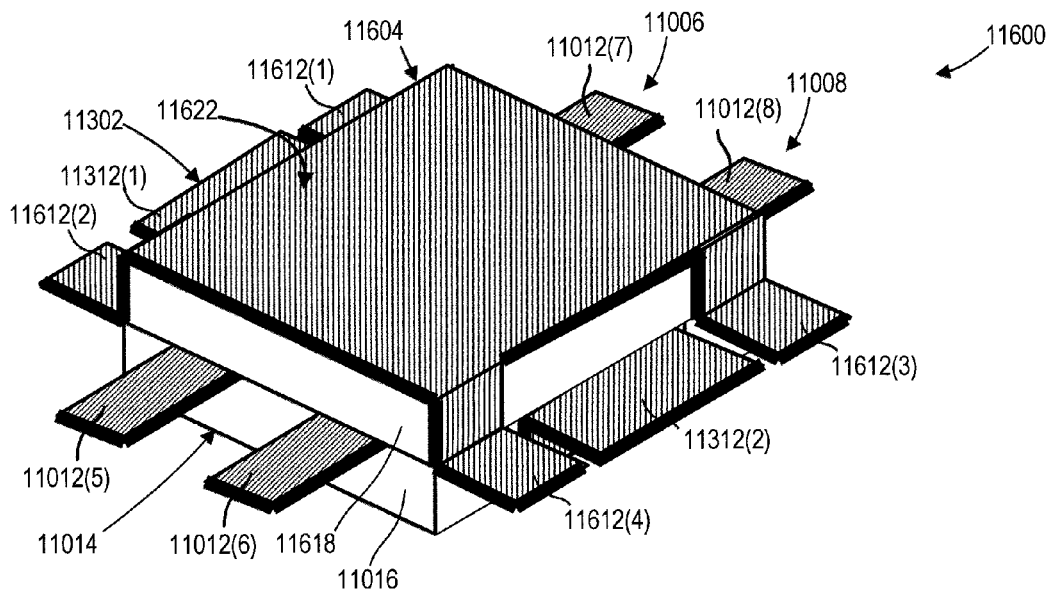
FIG. 116 shows a perspective view of another drop-in coupled inductor similar to that of FIG. 113 but with a second magnetic element that does not overlap solder tabs of the coupled inductor, according to an embodiment.

FIG. 116 shows a perspective view of a drop-in coupled inductor 11600, which is similar to coupled inductor 11300 (FIG. 113), but includes a second magnetic element 11618 that does not overlap the inductor's solder tabs. Thus, the second magnetic element of inductor 11600 will be smaller than that of inductor 11300, assuming all else is equal, thereby promoting material conservation and low cost. Second magnetic element 11618 is disposed on first magnetic element 11016 such that a bottom surface 11624 of second magnetic element 11618 faces a top surface 11020 of first magnetic element 11016. Second ground return conductor 11304 is replaced with second ground return conductor 11604, which forms ground return solder tabs 11612 at its opposing first and second ends. In certain embodiments, each solder tab 11012 and 11612 is formed at a same height relative to first magnetic element bottom surface 11014. In other words, in such embodiments, each solder tab 11012, 11612 is disposed in a common plane between first magnetic element bottom surface 11014 and second magnetic element top surface 11622 to facilitate use of inductor 11600 as a drop-in inductor in a PCB aperture.

Figure 117:
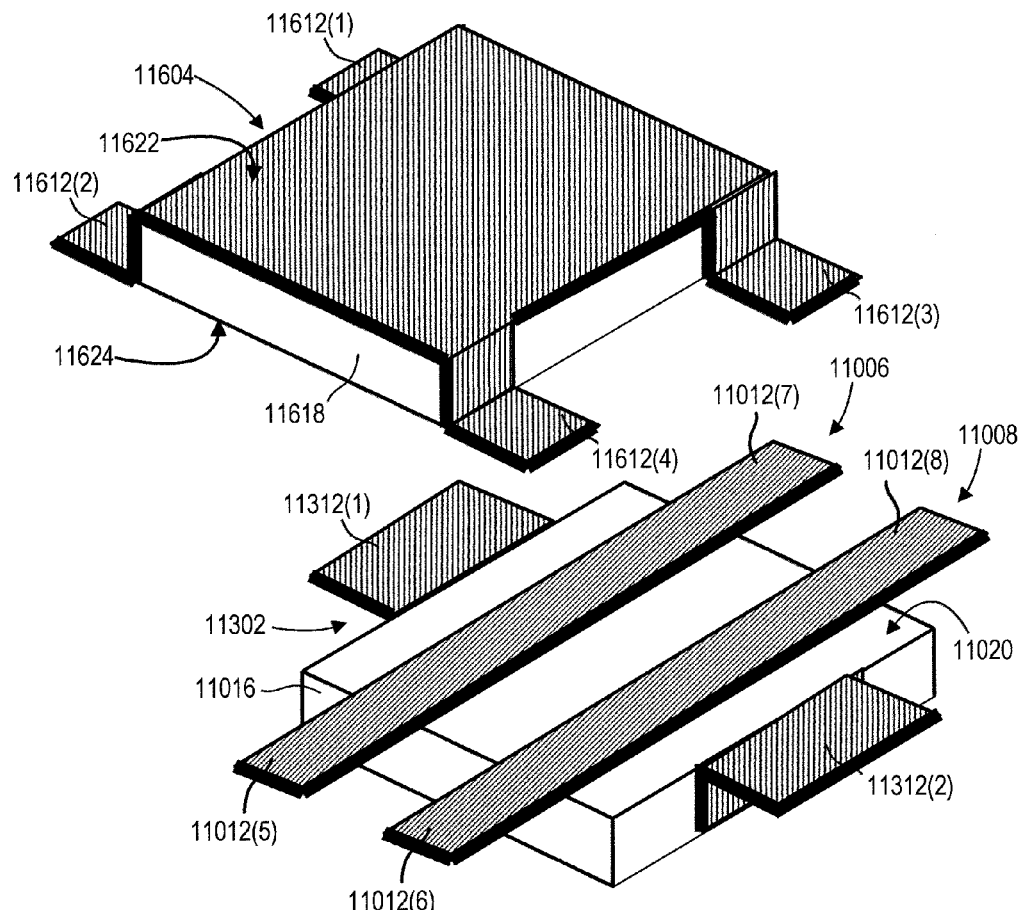
FIGS. 117 and 118 each show the coupled inductor of FIG. 116 with its magnetic elements separated from each other.
Figure 118:
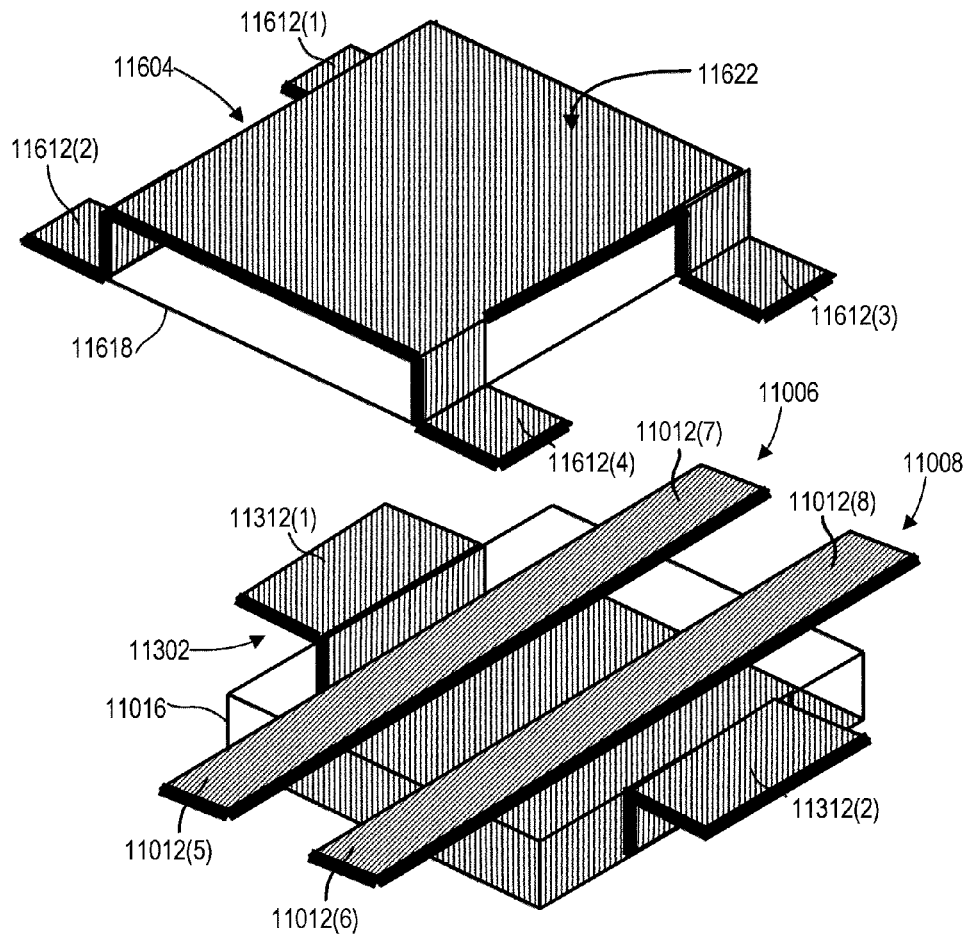

Neither first nor second magnetic element 11016, 11618 forms a magnetic path loop around ground return conductor 11302 or 11604. Accordingly, inductance of ground return conductors 11302, 11604 is not significantly increased by presence of first and second magnetic elements 11016, 11618, while inductance of windings 11006, 11008 is increased by presence of first and second magnetic elements 11016, 11618, relative to an otherwise identical inductor without the magnetic elements. Although it is anticipated that ground return conductors 11302, 11604 will typically carry return current from a load back to an electric power source, ground return conductors 11302, 11604 could be used for another purpose, such as to electrically couple a load to an auxiliary electric power source. Ground return conductor 11604 substantially covers second magnetic element top surface 11622, and ground return conductor 11302 substantially covers first magnetic element bottom surface 11014, thereby acting as a shield and helping cool inductor 11600 and other components in its vicinity. FIG. 117 shows a perspective view of coupled inductor 11600 with first and second magnetic elements 11016, 11618 separated from each other. FIG. 118 also shows a perspective view of the coupled inductor with first and second magnetic elements 11016, 11618 separated from each other, but with the magnetic elements shown as transparent.

Figure 119:
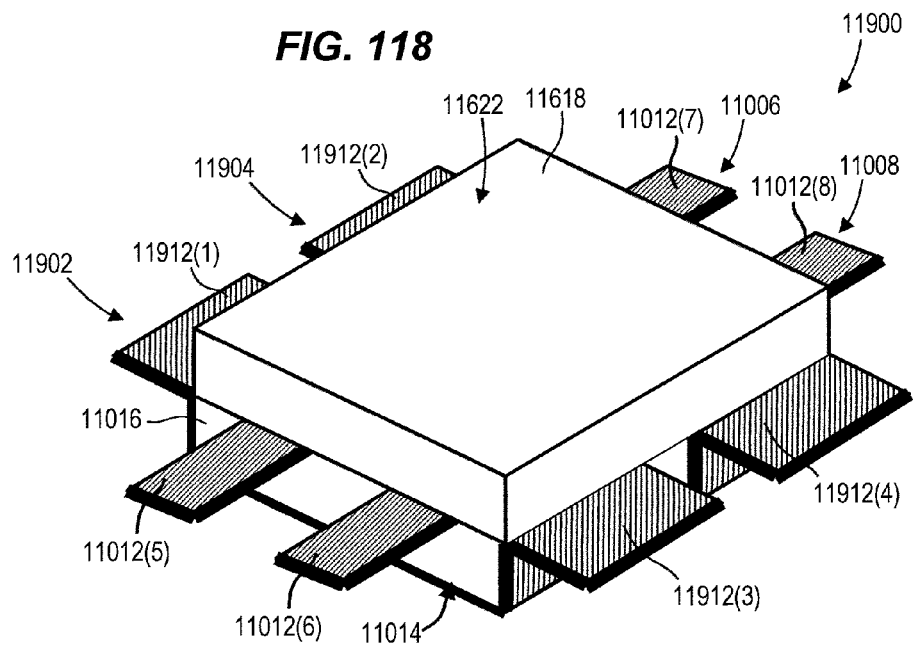
FIG. 119 shows a perspective view of another drop-in coupled inductor, according to an embodiment.

FIG. 119 shows a perspective view of a coupled inductor 11900, which is similar to coupled inductor 11600 (FIG. 16), but including two ground returns conductors 11902, 11904 each disposed on first magnetic element bottom surface 11014. Opposing ends of ground return conductors 11902, 11904 form respective solder tabs 11912. In certain embodiments, each solder tab 11012 and 11912 is formed at a same height relative to first magnetic element bottom surface 11014. In other words, in such embodiments, each solder tab 11012, 11912 is disposed in a common plane between first magnetic element bottom surface 11014 and second magnetic element top surface 11622 to facilitate use of inductor 11900 as a drop-in inductor in a PCB aperture.

Figure 120:
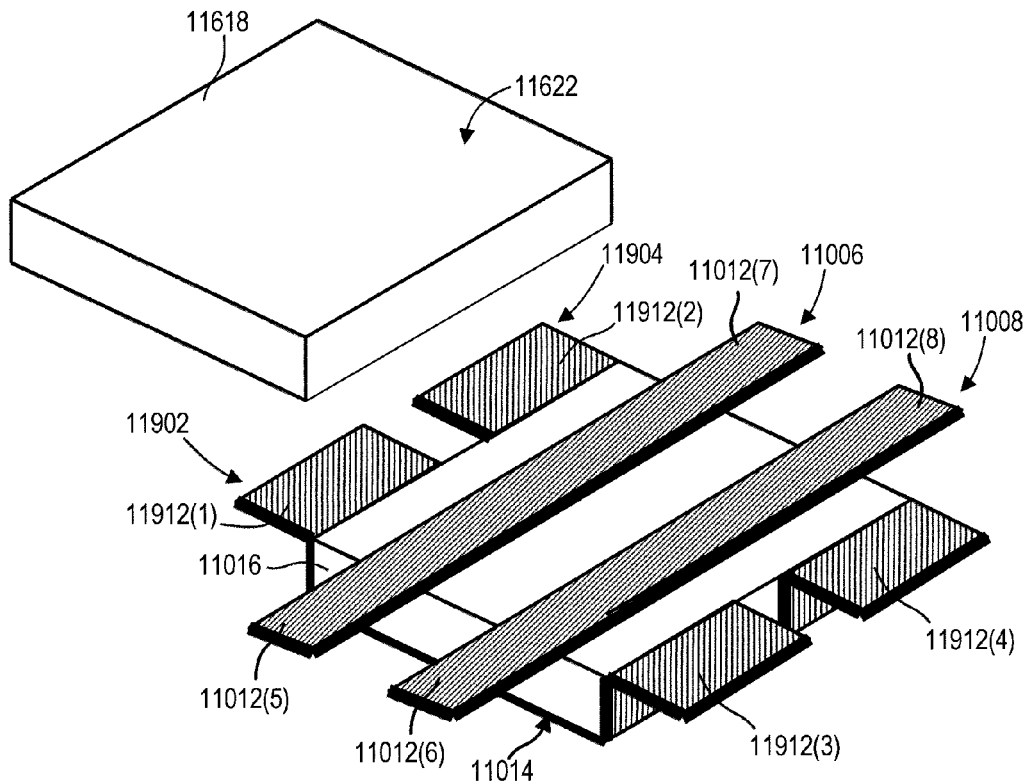
FIGS. 120 and 121 each show the coupled inductor of FIG. 119 with its magnetic elements separated from each other.
Figure 121:
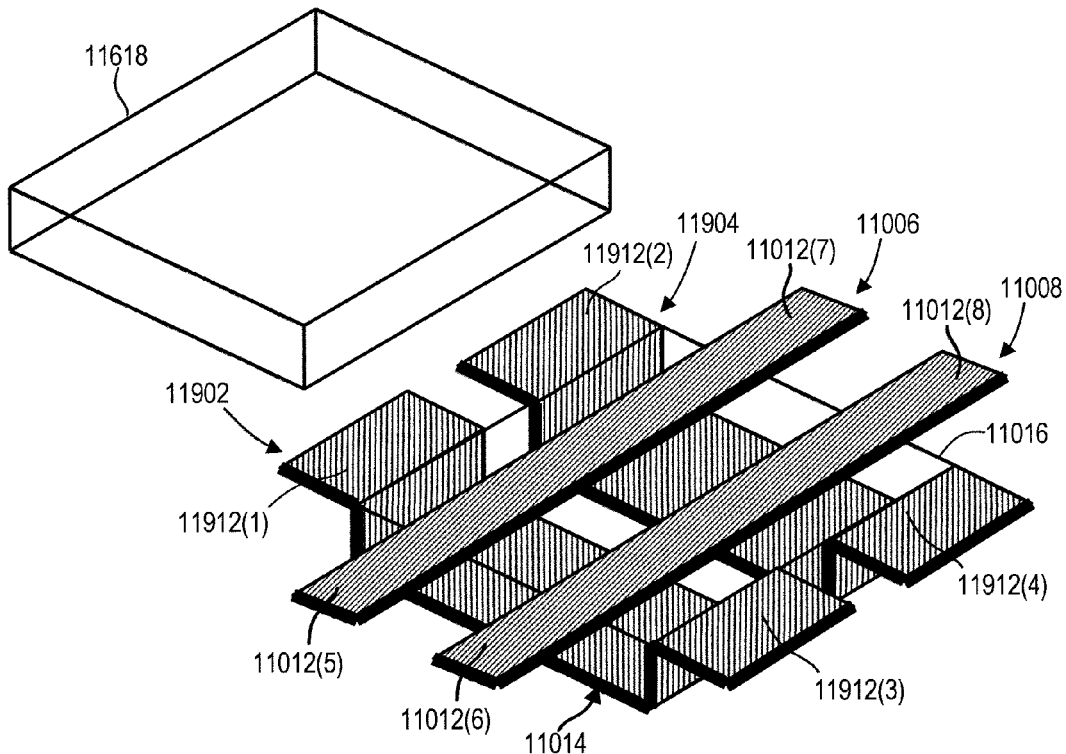

Neither first nor second magnetic element 11016, 11618 forms a magnetic path loop around ground return conductor 11902 or 11904. Accordingly, inductance of ground return conductors 11902, 11904 is not significantly increased by presence of first and second magnetic elements 11016, 11618, while inductance of windings 11006, 11008 is increased by presence of first and second magnetic elements 11016, 11618, relative to an otherwise identical inductor without the magnetic elements. Although it is anticipated that ground return conductors 11902, 11904 will typically carry return current from a load back to an electric power source, ground return conductors 11902, 11904 could be used for another purpose, such as to electrically couple a load to an auxiliary electric power source. FIG. 120 shows a perspective view of coupled inductor 11900 with first and second magnetic elements 11016, 11618 separated from each other. FIG. 121 also shows a perspective view of the coupled inductor with first and second magnetic elements 11016, 11618 separated from each other, but with the magnetic elements shown as transparent.

It is anticipated that the foil windings and ground return conductors described herein are considerably thicker, and thereby offer considerably lower sheet resistivity, than the one-ounce copper foil used on many printed circuit boards. It is further anticipated that the foil windings and ground return conductors described herein are made from a highly conductive material comprising primarily copper. In alternative embodiments, the foil windings and ground return conductors are made from a non-cuprous metal such as aluminum or steel having a solderable low resistance coating of copper, and in may in turn be plated with tin or an alloy comprising tin for enhanced solderability.

Combinations of Features

Features described above as well as those claimed below may be combined in various ways without departing from the scope hereof. The following examples illustrate some possible combinations:

(A1) A coupled inductor may include (i) a core formed of magnetic material and having opposing top and bottom surfaces, (ii) a first winding wound through the core and including portions alternately disposed on the bottom and top surfaces of the core, (iii) a second winding wound through the core and including portions alternately disposed on the bottom and top surfaces of the core in a manner opposite to that of the first winding, (iv) a leakage plate formed of magnetic material and having opposing top and bottom surfaces, the leakage plate disposed on the core such that the bottom surface of the leakage plate faces the top surface of the core, and (v) a first ground return conductor disposed on a surface selected from the group consisting of the bottom surface of the core and the top surface of the leakage plate.

(A2) In the coupled inductor denoted as (A1), opposing first and second ends of the first winding may respectively form first and second solder tabs disposed in a common plane between the bottom surface of the magnetic core and the top surface of the leakage plate, opposing first and second ends of the second winding may respectively form first and second solder tabs disposed in the common plane, and the first ground return conductor may form at least two ground return solder tabs disposed in the common plane.

(A3) In the coupled inductor denoted as (A2), the core may include opposing first and second sides each generally perpendicular to the top and bottom surfaces of the core, a linear separation distance between the first and second sides of the core may define a length of the core, each first solder tab may be disposed at the first side of the core and extend away from the core in the lengthwise direction, and each second solder tab may be disposed at the second side of the core and extend away from the core in the lengthwise direction.

(A4) In either of the coupled inductors denoted as (A2) or (A3), the first, second, and/or ground return solder tabs may extend along the bottom surface of the leakage plate.

(A5) In any of the coupled inductors denoted as (A1) through (A4), the first winding may have first and second portions disposed on the bottom and top surfaces of the core, respectively, the second winding may have third and fourth portions disposed on the bottom and top surfaces of the core, respectively, the first and fourth portions may be immediately adjacent to one another in the lengthwise direction, and the second and third portions may be immediately adjacent to one another in the lengthwise direction.

(A6) In any of the coupled inductors denoted as (A1) through (A5), portions of the first and second windings may separate the core and the leakage plate.

(A7) Any of the coupled inductors denoted as (A1) through (A6) may further include a non-magnetic spacer disposed between the core and the leakage plate.

(A8) In any of the coupled inductors denoted as (A1) through (A7), an air gap may separate the core and the leakage plate.

(A9) In any of the coupled inductors denoted as (A1) through (A8), the inductor may be configured such that inductance of the first ground return conductor is not significantly increased by presence of the core and the leakage plate, while inductance of the first and second windings is significantly increased by presence of the core and the leakage plate, relative to an otherwise identical inductor without the core and the leakage plate.

(A10) Any of the coupled inductors denoted as (A1) through (A9) may further include a second ground return conductor disposed on a surface selected from the group consisting of the bottom surface of the core and the top surface of the leakage plate.

(A11) In any of the coupled inductors denoted as (A1) through (A10), the first ground return conductor may cover substantially all of a surface selected from the group consisting of the bottom surface of the core and the top surface of the leakage plate.

(A12) In any of the coupled inductors denoted as (A1) through (A11), current of increasing magnitude flowing into the first winding from the first side of the core may induce current of increasing magnitude flowing into the second winding from the first side of the core.

(B1) A coupled inductor may include (i) a magnetic core including first and second magnetic elements each having opposing top and bottom surfaces, the second magnetic element disposed on the first magnetic element such that the bottom surface of the second magnetic element faces the top surface of the first magnetic element, (ii) a first winding disposed on the top surface of the first magnetic element, (iii) a second winding disposed on the top surface of the first magnetic element, and (iv) a first ground return conductor disposed on a surface selected from the group consisting of the bottom surface of the first magnetic element and the top surface of the second magnetic element.

(B2) In the coupled inductor denoted as (B1), the second winding may cross the first winding along the top surface of the first magnetic element.

(B3) The coupled inductor denoted as (B2) may further include electrically insulating material disposed between the first and second windings where the windings cross along the top surface of the first magnetic element.

(B4) In any of the coupled inductors denoted as (B1) through (B3), opposing first and second ends of the first winding may respectively form first and second solder tabs disposed in a common plane between the bottom surface of the first magnetic element and the top surface of the second magnetic element, opposing first and second ends of the second winding may respectively form first and second solder tabs disposed in the common plane, and the first ground return conductor may form at least two ground return solder tabs disposed in the common plane.

(B5) In the coupled inductor denoted as (B4), the core may include opposing first and second sides each generally perpendicular to the top and bottom surfaces of the core, a linear separation distance between the first and second sides of the core may define a length of the core, each first solder tab may be disposed at the first side of the core and extend away from the core in the lengthwise direction, and each second solder tab may be disposed at the second side of the core and extend away from the core in the lengthwise direction.

(B6) In either of the coupled inductors denoted as (B4) or (B5), the first, second, and/or ground return solder tabs may extend along the bottom surface of the second magnetic element.

(B7) In any of the coupled inductors denoted as (B1) through (B6), the first ground return conductor may cover substantially all of the top surface of the second magnetic element.

(B8) In any of the coupled inductors denoted as (B1) through (B7), the inductor may be configured such that inductance of the first ground return conductor is not significantly increased by presence of the magnetic core, while inductance of the first and second windings is significantly increased by presence of the magnetic core, relative to an otherwise identical inductor without the magnetic core.

(B9) Any of the coupled inductors denoted as (B1) through (B8) may further include a second ground return conductor disposed on a surface selected from the group consisting of the bottom surface of the first magnetic element and the top surface of the second magnetic element.

(B10) In the coupled inductor denoted as (B9), the first ground return conductor may be disposed on the bottom surface of the first magnetic element, and the second ground return conductor may be disposed on the top surface of the second magnetic element.

(C1) A coupled inductor may include (i) a core formed of magnetic material and including opposing top and bottom surfaces, (ii) a leakage plate formed of magnetic material and having opposing top and bottom surfaces, the leakage plate disposed on the core such that the bottom surface of the leakage plate faces the top surface of the core, (iii) N windings, N being an integer greater than one, each of the N windings wound through the core and having opposing first and second ends respectively forming first and second solder tabs, each first and second solder tab disposed in a common plane between the bottom surface of the core and the top surface of the leakage plate, and (iv) a first ground return conductor disposed on a surface selected from the group consisting of the bottom surface of the core and the top surface of the leakage plate, the first ground return conductor forming at least two ground return solder tabs disposed in the common plane.

(C2) In the coupled inductor denoted as (C1), the core may include opposing first and second sides each generally perpendicular to the top and bottom surfaces of the core, a linear separation distance between the first and second sides of the core may define a length of the core, each first solder tab may be disposed at the first side of the core and extend away from the core in the lengthwise direction, and each second solder tab may be disposed at the second side of the core and extend away from the core in the lengthwise direction.

(C3) In either of the coupled inductors denoted as (C1) or (C2), each of the N windings may be wound around a respective winding axis, and each winding axis may (i) extend through the core, (ii) be offset from each other winding axis, and (iii) be substantially parallel to each other winding axis.

(C4) In any of the coupled inductors denoted as (C1) through (C3), each of the first, second, and/or ground return solder tabs may extend along the bottom surface of the leakage plate.

(C5) In any of the coupled inductors denoted as (C1) through (C4), the ground return conductor may cover substantially all of the top surface of the leakage plate.

(C6) In any of the coupled inductors denoted as (C1) through (C5), the inductor may be configured such that inductance of the first ground return conductor is not significantly increased by presence of the core and the leakage plate, while inductance of the first and second windings is significantly increased by presence of the core and the leakage plate, relative to an otherwise identical inductor without the magnetic core.

(D1) A printed circuit assembly may include a printed circuit board and any one of the inductors denoted as (A1) through (A12), (B1) through (B10), or (C1) through (C6) disposed in an aperture in the printed circuit board.

(E1) A printed circuit assembly may include a printed circuit board and a coupled inductor disposed in an aperture in the printed circuit board. The coupled inductor may include (i) a core formed of magnetic material and including opposing top and bottom surfaces, (ii) a leakage plate formed of magnetic material and having opposing top and bottom surfaces, the leakage plate disposed on the core such that the bottom surface of the leakage plate faces the top surface of the core, (iii) N windings, N being an integer greater than one, each of the N windings wound through the core and having opposing first and second ends respectively forming first and second solder tabs, each first and second solder tab disposed in a common plane between the bottom surface of the magnetic core and the top surface of the leakage plate, and each of the first and second solder tabs soldered to a respective pad of the printed circuit board, and (iv) a first ground return conductor disposed on a surface selected from the group consisting of the bottom surface of the core and the top surface of the leakage plate, the first ground return conductor forming at least two ground return solder tabs disposed in the common plane and soldered to respective pads of the printed circuit board.

(E2) The printed circuit assembly denoted as (E1) may further include N switching devices disposed on the printed circuit board, each of the N switching devices electrically coupled to a first end of a respective one of the N windings.

(E3) In either of the printed circuit assemblies denoted as (E1) or (E2), the N windings and the first ground return conductor may collectively form part of a circuit delivering electric power from an electric power source to a load, the N windings may carry current from the electric power source to the load, and the first ground return conductor may carry return current from the load to the electric power source.

(E4) In any of the printed circuit assemblies denoted as (E1) through (E3), the leakage plate may extend over the printed circuit board.

(E5) In any of the printed circuit assemblies denoted as (E1) through (E4), the core may include opposing first and second sides each generally perpendicular to the top and bottom surfaces of the core, a linear separation distance between the first and second sides of the core may define a length of the core, each first solder tab may be disposed at the first side of the core and extend away from the core in the lengthwise direction, and each second solder tab may be disposed at the second side of the core and extend away from the core in the lengthwise direction.

(E6) In any of the printed circuit assemblies denoted as (E1) through (E5), each of the N windings may be wound around a respective winding axis, and each winding axis may (i) extend through the core, (ii) be offset from each other winding axis, and (iii) be substantially parallel to each other winding axis.

(E7) In any of the any of the printed circuit assemblies denoted as (E1) through (E6), each of the first, second, and/or ground return solder tabs may extend along the bottom surface of the leakage plate.

(E8) In any of the any of the printed circuit assemblies denoted as (E1) through (E7), the ground return conductor may cover substantially all of the top surface of the leakage plate.

(E9) In any of the printed circuit assemblies denoted as (E1) through (E8), the inductor may be configured such that inductance of the first ground return conductor is not significantly increased by presence of the core and the leakage plate, while inductance of the first and second windings is significantly increased by presence of the core and the leakage plate, relative to an otherwise identical inductor without the magnetic core.

(F1) A printed circuit assembly may include a printed circuit board and a coupled inductor disposed in an aperture in the printed circuit board. The coupled inductor may include (i) a first magnetic element having opposing top and bottom surfaces, (ii) a second magnetic element having opposing top and bottom surfaces, the second magnetic element disposed on the first magnetic element such that the bottom surface of the second magnetic element faces the top surface of the first magnetic element, (iii) a first winding disposed on the top surface of the first magnetic element, opposing first and second ends of the first winding forming respective first and second solder tabs soldered to the printed circuit board and disposed in a common plane between the bottom surface of the first magnetic element and the top surface of the second magnetic element, (iv) a second winding disposed on the top surface of the first magnetic element, opposing first and second ends of the second winding forming respective first and second solder tabs disposed in the common plane and soldered to the printed circuit board, and (v) a first ground return conductor disposed on a surface selected from the group consisting of the bottom surface of the first magnetic element and the top surface of the second magnetic element, the first ground return conductor forming at least two ground return solder tabs disposed in the common plane and soldered to the printed circuit board.

(F2) The printed circuit assembly denoted as (F1) may further include first and second switching devices disposed on the printed circuit board, where the first and second switching devices are electrically coupled to the first and second windings, respectively.

(F3) In either of the printed circuit assemblies denoted as (F1) or (F2), the first and second windings and the first ground return conductor may collectively form part of a circuit delivering electric power from an electric power source to a load, the first and second windings may carry current from the electric power source to the load, and the first ground return conductor may carry return current from the load to the electric power source.

(F4) In any of the printed circuit assemblies denoted as (F1) through (F3), the second magnetic element may extend over the printed circuit board.

(F5) In any of the printed circuit assemblies denoted as (F1) through (F4), the core may include opposing first and second sides each generally perpendicular to the top and bottom surfaces of the core, a linear separation distance between the first and second sides of the core may define a length of the core, each first solder tab may be disposed at the first side of the core and extend away from the core in the lengthwise direction, and each second solder tab may be disposed at the second side of the core and extend away from the core in the lengthwise direction.

(F6) In any of the printed circuit assemblies denoted as (F1) through (F5), the first, second, and/or ground return solder tabs may extend along the bottom surface of the second magnetic element.

(F7) In any of the any of the printed circuit assemblies denoted as (F1) through (F6), the ground return conductor may cover substantially all of the top surface of the second magnetic element.

(F8) In any of the any of the printed circuit assemblies denoted as (F1) through (F7), the inductor may be configured such that inductance of the ground return conductor is not significantly increased by presence of the magnetic core, while inductance of the first and second windings is significantly increased by presence of the magnetic core, relative to an otherwise identical inductor without the magnetic core.

(F9) In any of the printed circuit assemblies denoted as (F1) through (F8), the second winding may cross the first winding along the top surface of the first magnetic element.

(F10) The printed circuit assemblies denoted as (F9) may further include electrically insulating material disposed between the first and second windings where the windings cross along the top surface of the first magnetic element.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A coupled inductor, comprising:
   a core formed of magnetic material and having opposing top and bottom surfaces;
   a first winding wound through the core and including portions alternately disposed on the bottom and top surfaces of the core;
   a second winding wound through the core and including portions alternately disposed on the bottom and top surfaces of the core in a manner opposite to that of the first winding;
   a leakage plate formed of magnetic material and having opposing top and bottom surfaces, the leakage plate disposed on the core such that the bottom surface of the leakage plate faces the top surface of the core; and
   a first ground return conductor disposed on a surface selected from the group consisting of the bottom surface of the core and the top surface of the leakage plate.

2. The coupled inductor of claim 1, wherein:
   opposing first and second ends of the first winding respectively form first and second solder tabs disposed in a common plane between the bottom surface of the magnetic core and the top surface of the leakage plate;
   opposing first and second ends of the second winding respectively form first and second solder tabs disposed in the common plane; and
   the first ground return conductor forms at least two ground return solder tabs disposed in the common plane.

3. The coupled inductor of claim 2, wherein:
   the core includes opposing first and second sides each generally perpendicular to the top and bottom surfaces of the core;
   a linear separation distance between the first and second sides of the core defines a length of the core;
   each first solder tab is disposed at the first side of the core and extends away from the core in the lengthwise direction; and
   each second solder tab is disposed at the second side of the core and extends away from the core in the lengthwise direction.

4. The coupled inductor of claim 3, wherein:
the first winding has first and second portions disposed on the bottom and top surfaces of the core, respectively;
the second winding has third and fourth portions disposed on the bottom and top surfaces of the core, respectively;
the first and fourth portions are immediately adjacent to one another in the lengthwise direction; and
the second and third portions are immediately adjacent to one another in the lengthwise direction.

5. The coupled inductor of claim 3, wherein the first solder tabs extend along the bottom surface of the leakage plate.

6. The coupled inductor of claim 3, wherein the first, second, and ground return solder tabs extend along the bottom surface of the leakage plate.

7. The coupled inductor of claim 3, wherein portions of the first and second windings separate the core and the leakage plate.

8. The coupled inductor of claim 7, further comprising a non-magnetic spacer disposed between the core and the leakage plate.

9. The coupled inductor of claim 7, wherein an air gap separates the core and the leakage plate.

10. The coupled inductor of claim 3, wherein the inductor is configured such that inductance of the first ground return conductor is not significantly increased by presence of the core and the leakage plate, while inductance of the first and second windings is significantly increased by presence of the core and the leakage plate, relative to an otherwise identical inductor without the core and the leakage plate.

11. The coupled inductor of claim 3, further comprising a second ground return conductor disposed on a surface selected from the group consisting of the bottom surface of the core and the top surface of the leakage plate.

12. The coupled inductor of claim 3, the first ground return conductor covering substantially all of a surface selected from the group consisting of the bottom surface of the core and the top surface of the leakage plate.

13. The coupled inductor of claim 3, wherein current of increasing magnitude flowing into the first winding from the first side of the core induces current of increasing magnitude flowing into the second winding from the first side of the core.

14. A coupled inductor, comprising:
a magnetic core including:
a first magnetic element having opposing top and bottom surfaces, and
a second magnetic element having opposing top and bottom surfaces, the second magnetic element disposed on the first magnetic element such that the bottom surface of the second magnetic element faces the top surface of the first magnetic element;
a first winding disposed on the top surface of the first magnetic element;
a second winding disposed on the top surface of the first magnetic element; and
a first ground return conductor disposed on a surface selected from the group consisting of the bottom surface of the first magnetic element and the top surface of the second magnetic element.

15. The coupled inductor of claim 14, the second winding crossing the first winding along the top surface of the first magnetic element.

16. The coupled inductor of claim 15, further comprising electrically insulating material disposed between the first and second windings where the windings cross along the top surface of the first magnetic element.

17. The coupled inductor of claim 14, wherein:
opposing first and second ends of the first winding respectively form first and second solder tabs disposed in a common plane between the bottom surface of the first magnetic element and the top surface of the second magnetic element;
opposing first and second ends of the second winding respectively form first and second solder tabs disposed in the common plane; and
the first ground return conductor forms at least two ground return solder tabs disposed in the common plane.

18. The coupled inductor of claim 17, wherein:
the core includes opposing first and second sides each generally perpendicular to the top and bottom surfaces of the core;
a linear separation distance between the first and second sides of the core defines a length of the core;
each first solder tab is disposed at the first side of the core and extends away from the core in the lengthwise direction; and
each second solder tab is disposed at the second side of the core and extends away from the core in the lengthwise direction.

19. The coupled inductor of claim 18, wherein the first solder tabs extend along the bottom surface of the second magnetic element.

20. The coupled inductor of claim 18, wherein the first, second, and ground return solder tabs extend along the bottom surface of the second magnetic element.

21. The coupled inductor of claim 17, the first ground return conductor covering substantially all of the top surface of the second magnetic element.

22. The coupled inductor of claim 17, wherein the inductor is configured such that inductance of the first ground return conductor is not significantly increased by presence of the magnetic core, while inductance of the first and second windings is significantly increased by presence of the magnetic core, relative to an otherwise identical inductor without the magnetic core.

23. The coupled inductor of claim 14, further comprising a second ground return conductor disposed on a surface selected from the group consisting of the bottom surface of the first magnetic element and the top surface of the second magnetic element.

24. The coupled inductor of claim 23, the first ground return conductor being disposed on the bottom surface of the first magnetic element, and the second ground return conductor being disposed on the top surface of the second magnetic element.

25. A coupled inductor, comprising:
a core formed of magnetic material and including opposing top and bottom surfaces;
a leakage plate formed of magnetic material and having opposing top and bottom surfaces, the leakage plate disposed on the core such that the bottom surface of the leakage plate faces the top surface of the core;
N windings, N being an integer greater than one, each of the N windings wound through the core and having opposing first and second ends respectively forming first and second solder tabs, each first and second solder tab disposed in a common plane between the bottom surface of the core and the top surface of the leakage plate; and
a first ground return conductor disposed on a surface selected from the group consisting of the bottom surface of the core and the top surface of the leakage plate, the first ground return conductor forming at least two ground return solder tabs disposed in the common plane.

26. The coupled inductor of claim 25, wherein:
the core includes opposing first and second sides each generally perpendicular to the top and bottom surfaces of the core;
a linear separation distance between the first and second sides of the core defines a length of the core;
each first solder tab is disposed at the first side of the core and extends away from the core in the lengthwise direction; and
each second solder tab is disposed at the second side of the core and extends away from the core in the lengthwise direction.

27. The coupled inductor of claim 26, each of the N windings being wound around a respective winding axis, wherein each winding axis:
extends through the core;
is offset from each other winding axis; and
is substantially parallel to each other winding axis.

28. The coupled inductor of claim 26, wherein each first solder tab extends along the bottom surface of the leakage plate.

29. The coupled inductor of claim 26, wherein each of the first, second, and ground return solder tabs extends along the bottom surface of the leakage plate.

30. The coupled inductor of claim 26, the ground return conductor covering substantially all of the top surface of the leakage plate.

31. The coupled inductor of claim 26, wherein the inductor is configured such that inductance of the first ground return conductor is not significantly increased by presence of the core and the leakage plate, while inductance of the first and second windings is significantly increased by presence of the core and the leakage plate, relative to an otherwise identical inductor without the magnetic core.

* * * * *